(12) United States Patent
Chakihara et al.

(10) Patent No.: US 7,402,475 B2
(45) Date of Patent: Jul. 22, 2008

(54) METHOD OF MANUFACTURING A SEMICONDUCTOR INTEGRATED CIRCUIT DEVICE

(75) Inventors: Hiraku Chakihara, Hitachinaka (JP); Mitsuhiro Noguchi, Sagamihara (JP); Masahiro Tadokoro, Mita (JP); Naonori Wada, Hitachinaka (JP); Akio Nishida, Takarazuka (JP)

(73) Assignee: Renesas Technology Corp., Tokyo (JP)

( * ) Notice: Subject to any disclaimer, the term of this patent is extended or adjusted under 35 U.S.C. 154(b) by 81 days.

(21) Appl. No.: 11/265,292

(22) Filed: Nov. 3, 2005

(65) Prior Publication Data

US 2006/0057795 A1 Mar. 16, 2006

Related U.S. Application Data

(63) Continuation of application No. 10/855,598, filed on May 28, 2004, now Pat. No. 7,109,126.

(30) Foreign Application Priority Data

May 30, 2003 (JP) .............................. 2003-153882

(51) Int. Cl.
  *H01L 21/336* (2006.01)
  *H01L 21/8234* (2006.01)
(52) U.S. Cl. ..................... 438/197; 438/151; 257/330
(58) Field of Classification Search ................ 438/151, 438/197, 585, 689, 737; 257/330, 635, 752, 257/758
See application file for complete search history.

(56) References Cited

U.S. PATENT DOCUMENTS

| 5,032,530 | A | | 7/1991 | Lowrey et al. |
|---|---|---|---|---|
| 5,512,514 | A | * | 4/1996 | Lee .............................. 438/626 |
| 5,532,114 | A | | 7/1996 | Bae |
| 5,925,917 | A | | 7/1999 | Maari |
| 5,935,875 | A | * | 8/1999 | Lee .............................. 438/737 |
| 6,072,213 | A | * | 6/2000 | Gardner et al. .............. 257/330 |
| 6,461,959 | B1 | | 10/2002 | Chien et al. |
| 6,919,168 | B2 | * | 7/2005 | Hwang et al. ............... 430/318 |
| 7,078,351 | B2 | * | 7/2006 | Chiu et al. ................... 438/736 |
| 2002/0182874 | A1 | * | 12/2002 | Wang .......................... 438/706 |
| 2003/0049926 | A1 | * | 3/2003 | Kim et al. .................... 438/618 |
| 2004/0005755 | A1 | | 1/2004 | Moniwa et al. |
| 2004/0043550 | A1 | | 3/2004 | Chakihara et al. |

FOREIGN PATENT DOCUMENTS

| JP | 8-45834 | 2/1996 |
|---|---|---|
| JP | 2002-134394 | 5/2002 |
| JP | 2002-258462 | 9/2002 |

* cited by examiner

*Primary Examiner*—Phuc T Dang
(74) *Attorney, Agent, or Firm*—Antonelli, Terry, Stout & Kraus, LLP.

(57) ABSTRACT

In forming five trenches buried with an intermediate conductive layer for connecting transfer MISFETs and driving MISFETs with vertical MISFETs formed thereover, in which the second and third trenches, and the first, fourth, and fifth trenches are formed separately by twice etching using first and second photoresist films as a mask. Since all the trenches can be formed at a good accuracy even in a case where the shortest distance between the first trench and the second or third trench, and the shortest distance between the second or third trench and the fourth trench is smaller than the resolution limit for the exposure light, the distance between each of the five trenches arranged in one identical memory cell can be reduced to be smaller than resolution limit for the exposure light.

19 Claims, 57 Drawing Sheets

METHOD OF MANUFACTURING A SEMICONDUCTOR INTEGRATED CIRCUIT DEVICE

CROSS-REFERENCE TO RELATED APPLICATIONS

This application is a continuation application of U.S. application Ser. No. 10/855,598, filed May 28, 2004, now U.S. Pat. No. 7,109,126 which claims priority from Japanese Patent Application No. JP 2003-153882 filed on May 30, 2003, the content of which is hereby incorporated by reference into this application.

BACKGROUND OF THE INVENTION

The present invention concerns a technique for use in the manufacture of a semiconductor integrated circuit device; and, more in particular, it relates to a technique that is effective when applied to a step of forming, in an identical interconnection layer on a semiconductor substrate, plural interconnections at a narrow distance, which distance is smaller than the resolution limit for the exposure light used in a photolithography step employed in semiconductor manufacture.

Along with refinement of semiconductor integrated circuits, since the pattern size, for example, of electrode interconnections formed over semiconductor substrates have already reached the resolution limit of the exposure light used in the photolithographic step employed in semiconductor manufacture, a phase shift technique or a multiple exposure technique, which is capable of forming such interconnections at a pattern size smaller than the resolution limit of the exposure light, have been adopted.

The multiple exposure technique is a technique in which exposure is repeated plural times using plural sheets of photomasks, thereby transferring a pattern With a size smaller than the resolution limit of the exposure light to a photoresist film on a semiconductor substrate, as disclosed, for example, in the below-listed Patent Documents 1 to 3.

For example, Patent Document 1 discloses a quadplex exposure technique of conducting duplicate exposure to a photoresist film by using first and second photomasks, with the positions for a shield pattern and a phase shift pattern being replaced with each other, and then conducting exposure to the photoresist film by using third and fourth photomasks, with the positions for the patterns being different from those of the first and second photomasks and the positions for the shield pattern and the phase shift pattern being replaced with each other, thereby transferring a pattern at a size smaller than the resolution limit of the exposure light.

[Patent Document 1]
Japanese Patent Application laid-open No. Hei 8 (1996)-45834
[Patent Document 2]
Japanese Patent Application laid-open No. 2002-134394
[Patent Document 3]
Japanese Patent Application laid-open No. 2002-258462

SUMMARY OF THE INVENTION

The multiple exposure technique of conducting exposure plural times with regard to an identical photoresist film using plural sheets of photomasks involves a problem in that the transfer accuracy of the pattern is lowered as the distance between each of the patterns transferred to the photoresist film becomes finer due to the effect of interference between lights with each other in the plural exposures. That is, the existent multiple exposure technique can refine the individual patterns so that they are smaller than the resolution limit of the exposure light, but it can not refine the distance between each of the patterns to a value smaller than the resolution limit of the exposure light.

For example, in a SRAM (Static Random Access Memory) that is under development by the present inventors, among six MISFETs (Metal Insulator Semiconductor Field Effect Transistor) constituting a memory cell, two MISFETs are constituted as a vertical structure, and the two vertical MISFETs are arranged over the remaining four MISFETs, thereby decreasing the memory cell size.

In the SRAM described above, eight local interconnections, referred to as an intermediate conductive layer by the present inventors, are formed to one identical interconnection layer in the memory cell, and a MISFET in the lower layer and a MISFET in the upper layer are connected by way of a portion of the intermediate conductive layer.

For an SRAM having the structure described above, it is required to decrease the distance between each of the eight local interconnections formed over one identical layer to a value smaller than the resolution limit of the exposure light if the size of the memory cell is to be decreased. However, the distance between each of the local interconnections can not be decreased to a value smaller than the resolution limit of the exposure light by using the existent multiple exposure technique.

It is an object of present invention to provide a technique tat is capable of reducing the memory size of an SRAM, thereby promoting an increase in the integration degree.

It is a further object of the present invention to provide a technique that is capable of promoting refinement and achieving an increase in the integration degree of an LSI by reducing the distance between each of plural interconnections formed over one identical interconnection layer on a semiconductor substrate and of reducing the distance between each of plural through holes formed in one identical insulating film.

The foregoing and other objects and novel features of the present invention will become more apparent with reference to the descriptions provided in the present specification and the appended drawings.

Typical examples disclosed in the present application are described generally below.

A method of manufacturing a semiconductor integrated circuit device for forming plural interconnections in one identical interconnection layer on a semiconductor substrate according to the present invention comprises the steps of:
(a) dividing the plural interconnections into plural groups, and providing plural sheets of photomasks formed with an interconnection pattern contained in each of the plural groups; and
(b) forming the plural interconnections by photolithographic steps plural times by using the plural sheets of photomasks.

PREFERRED EMBODIMENTS OF THE INVENTION

Figure 1:
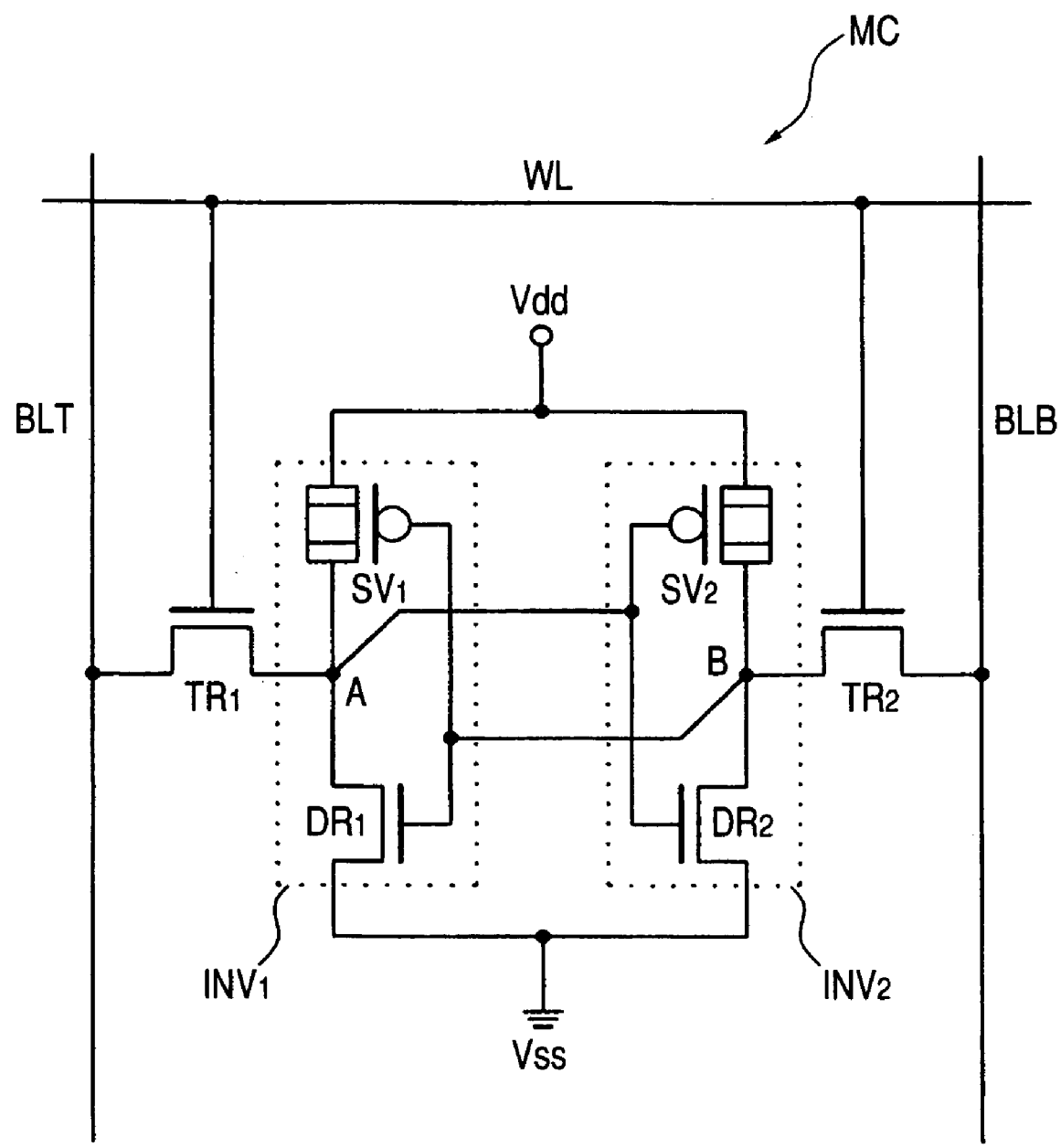
FIG. 1 is an equivalent circuit diagram of a memory cell of SRAM which represents a preferred embodiment of the invention.

The present invention will be described more specifically by way of preferred embodiments with reference to the drawings. Throughout the drawings, those components having identical functions carry will be identified by the same reference numerals, and duplicate descriptions thereof will be omitted.

Preferred Embodiment 1

FIG. 1 is an equivalent circuit diagram of a memory cell of an SRAM representing a preferred embodiment according to the present invention. The memory cell (MC) of the SRAM comprises two transfer MISFETs ($TR_1$, $TR_2$), two driving MISFETs ($DR_1$, $DR_2$), and two vertical MISFETs ($SV_1$, $SV_2$) each arranged at the intersection between a pair of complementary data lines (BLT, BLB) and a word line (WL).

Among the six MISFETs constituting the memory cell (MC), the two transfer MISFETs ($TR_1$, $TR_2$) and two driving MISFETs ($DR_1$, $DR_2$) are constituted each as an n-channel type MISFET. Further, the two vertical MISFETs ($SV_1$, $SV_2$) are constituted as with a p-channel type MISFET. The vertical MISFETs ($SV_1$, $SV_2$) correspond to a load MISFET in the well known complete CMOS type SRAM, but, as opposed to the usual load MISFET, it is constituted to have a vertical structure, as will be described below, and is formed over regions forming the MISFETs ($DR_1$, $DR_2$) and the transfer MISFETs ($TR_1$, $TR_2$).

In the memory cell (MC), the driving MISFET ($DR_1$) and the vertical MISFET ($SV_1$) constitute a first inverter $INV_1$, and the driving MISFET ($DR_2$) and the vertical MISFET ($SV_2$) constitute a second inverter $INV_2$. The pair of inverters $INV_1$ and $INV_2$ are cross coupled in the memory cell (MC) to constitute a flip-flop circuit, which serves as a memory accumulating portion for storing one bit of information.

That is, the drain of the driving MISFET ($DR_1$), the drain of the vertical MISFET ($SV_1$), the gate of the driving MISFET ($DR_2$) and the gate of the vertical MISFET ($SV_2$) are electrically connected to each other, to constitute one accumulation node (A) of the memory cell. The drain of the driving MISFET ($DR_2$), the drain of the vertical MISFET ($SV_2$), the gate of the driving MISFET ($DR_1$), and the gate of the vertical MISFET ($SV_1$) are electrically connected to each other, to constitute the other accumulation node (B) of the memory cell.

One input/output terminal of the flip-flop circuit is electrically connected to one of the source and the drain of the transfer MISFET ($TR_1$) and the other input/output terminal thereof is connected electrically to one of the source and the drain of the transfer MISFET ($TR_2$). The other of the source and the drain of the MISFET ($TR_1$) is electrically connected to one data line (BLT) in the pair of complementary data lines, while the other of the source and the drain of the transfer MISFET ($TR_2$) is electrically connected to the other data line (BLB) in the pair of complementary data lines. Further, one end of the flip-flop circuit, that is, the source of the two vertical MISFETs ($SV_1$, $SV_2$) is electrically connected to a power supply voltage line (Vdd) for supplying a power supply voltage (Vdd) at a higher potential than the reference voltage (Vss), for example, 3 V, and the other end thereof, that is, the sources of the two driving MISFETs ($DR_1$, $DR_2$) are electrically connected to a reference voltage line (Vss) for supplying a reference voltage (Vss), for example, 0 V. The gate electrodes of the transfer MISFETs ($TR_1$, $TR_2$) are electrically connected to the word line (WL). The memory cell (MC) stores information by putting one of the pair of accumulation nodes (A, B) to a High level and the other to a Low level.

The information storing, reading and writing operations in the memory cell (MC) are basically identical with those of the known complete CMOS type SRAM. That is, upon reading the information, for example, the power supply voltage (Vdd) is applied to a selected word line (WL) to turn the transfer MISFETs ($TR_1$, $TR_2$) ON and the potential difference between the pair of accumulation nodes (A, B) is read on the complementary data lines (BLT, BLB). Further, upon writing information, for example, the power supply voltage (Vdd) is applied to a selected word line (WL) to turn the transfer MISFETs ($TR_1$, $TR_2$) ON and one of the complementary data lines (BLT, BLB) is connected with the power supply voltage (Vdd) and the other of them is connected with the reference voltage (Vss) thereby turning the driving MISFETs ($DR_1$, $DR_2$) ON and OFF.

The SRAM of this embodiment is constituted with a memory array in which the plural memory cells are formed and a periphery circuit formed at the peripheral of the memory array. The peripheral circuit for the SRAM includes, for example, an X decoder circuit, a Y decoder circuit, a sense amplifier circuit, an input/output circuit and a logic circuit each constituted with an n-channel type MISFET and a p-channel type MISFET.

A method of manufacturing the SRAM described above will be described with reference to FIG. 2 to FIG. 27. Those portions carrying references A, A' are cross sectional views taken along line A-A' in FIG. 2 (plan view for memory array), those portions carrying references B, B' are cross sectional views taken along line B-B' in FIG. 2, those portions carrying references C, C' are cross sectional views taken along line C-C' in FIG. 2, and other portions are cross sectional views showing portions of the peripheral circuit (P-channel type MISFET forming region). Further, each of the plan views which illustrate the method of manufacturing the SRAM (plan view for memory array) shows only the main conductive layers and their connection regions constituting the memory cell, but does not show an insulating film and the like formed between the conductive layers. Further, in each of the plan views, a square region surrounded by four symbols (+) shows an occupation region of an memory cell.

Figure 2:
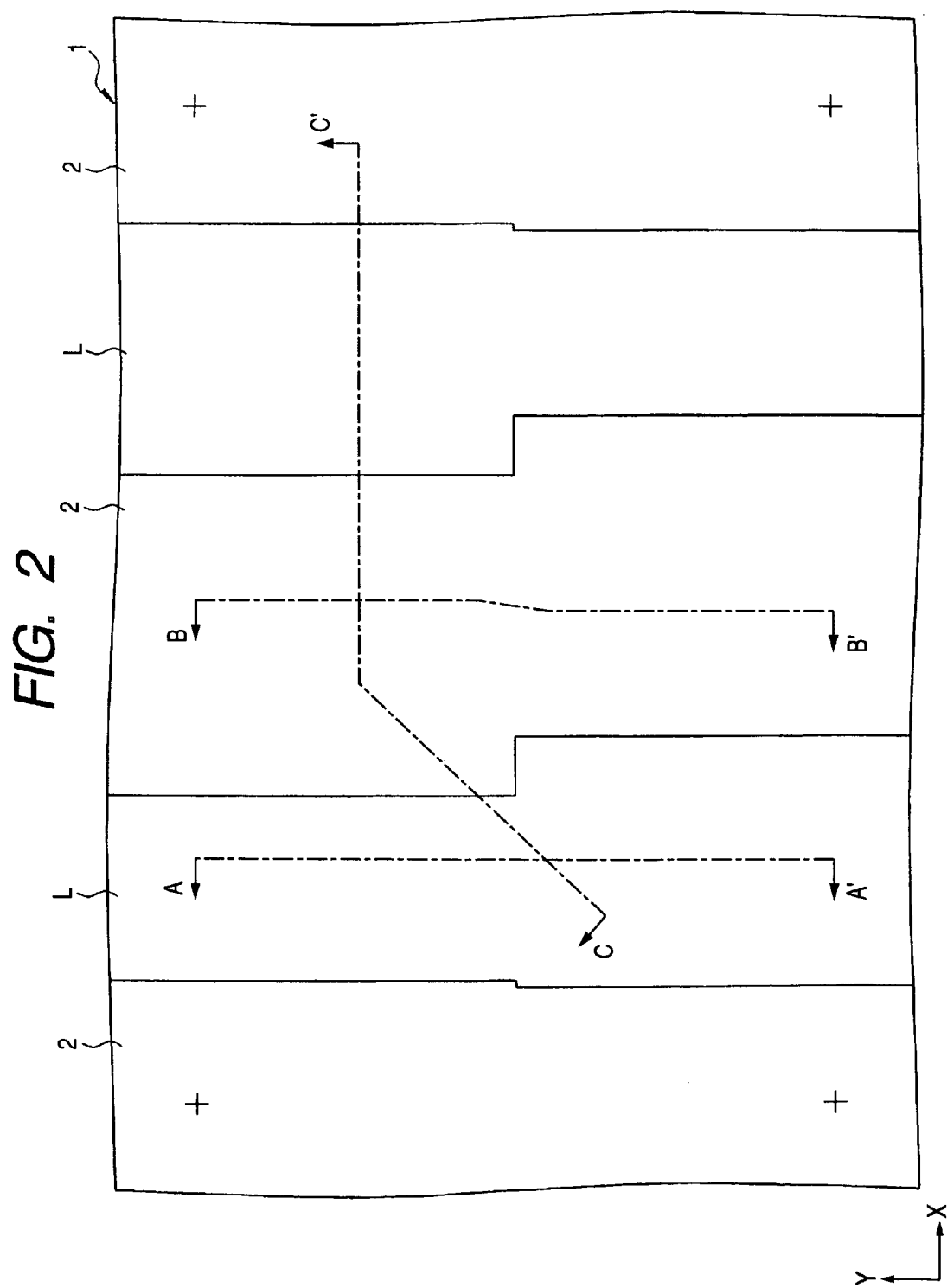
FIG. 2 is a plan view of a main portion showing a method of manufacturing an SRAM representing the preferred embodiment according to the invention.
Figure 3:
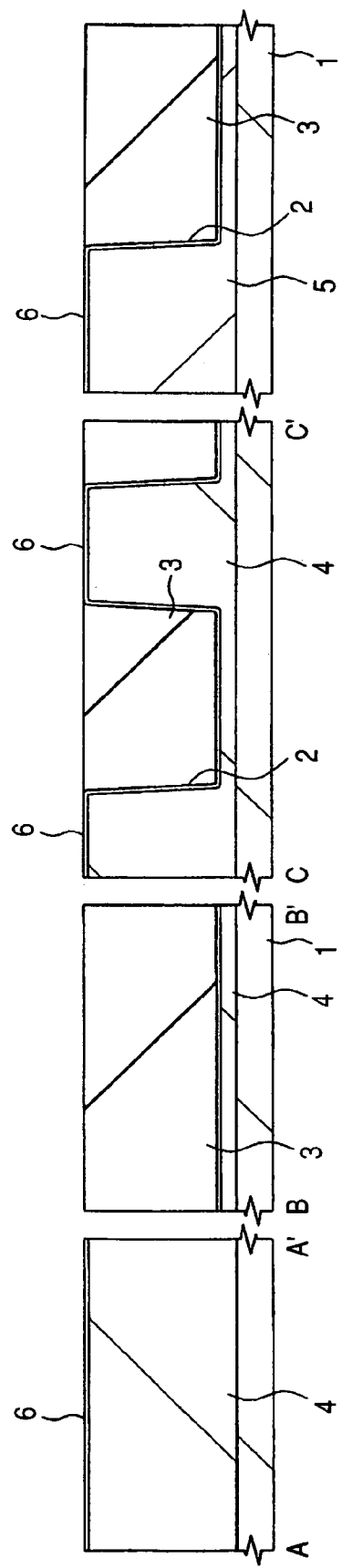
FIG. 3 is a cross sectional view of a main portion showing a method of manufacturing an SRAM representing the preferred according to the invention.

At first, as shown in FIG. 2 and FIG. 3, a device isolation trench 2 is formed to a device isolation region on the main surface of a substrate 1 comprising, for example, p-single crystal silicon. The device isolation trench 2 is formed, for example, by forming a trench by dry etching the main surface of the substrate 1, successively depositing an insulating film such as a silicon oxide film 3 on the substrate 1 including the inside of the trench by a CVD process and then polishing and removing an unnecessary silicon oxide film 3 outside the trench by a chemical mechanical polishing (CMP) method thereby leaving the silicon oxide film 3 inside the trench. By forming the device isolation trench 2, an island active region (L) defined at the periphery with the device isolation trench 2 is formed to the main surface of the substrate 1 for the memory array.

Then, after ion implanting phosphorus (P) to a portion and ion implanting boron (B) to the other portion of the substrate 1, for example, the substrate 1 is subjected to a heat treatment to diffuse the impurities into the substrate 1 thereby forming a p-well 4 and a n-well 5 on the main surface of the substrate 1. As shown in the drawings, only the p-well 4 is formed but the n-well 5 is not formed to the substrate 1 for the memory array. On the other hand, the n-well 5 and a not illustrated p-well are formed to the substrate 1 for the peripheral circuit region.

Then, the substrate 1 is thermally oxidized to form a gate insulating film 6 comprising, for example, silicon oxide to the respective surfaces of the p-well 4 and the n-well 5.

Figure 4:
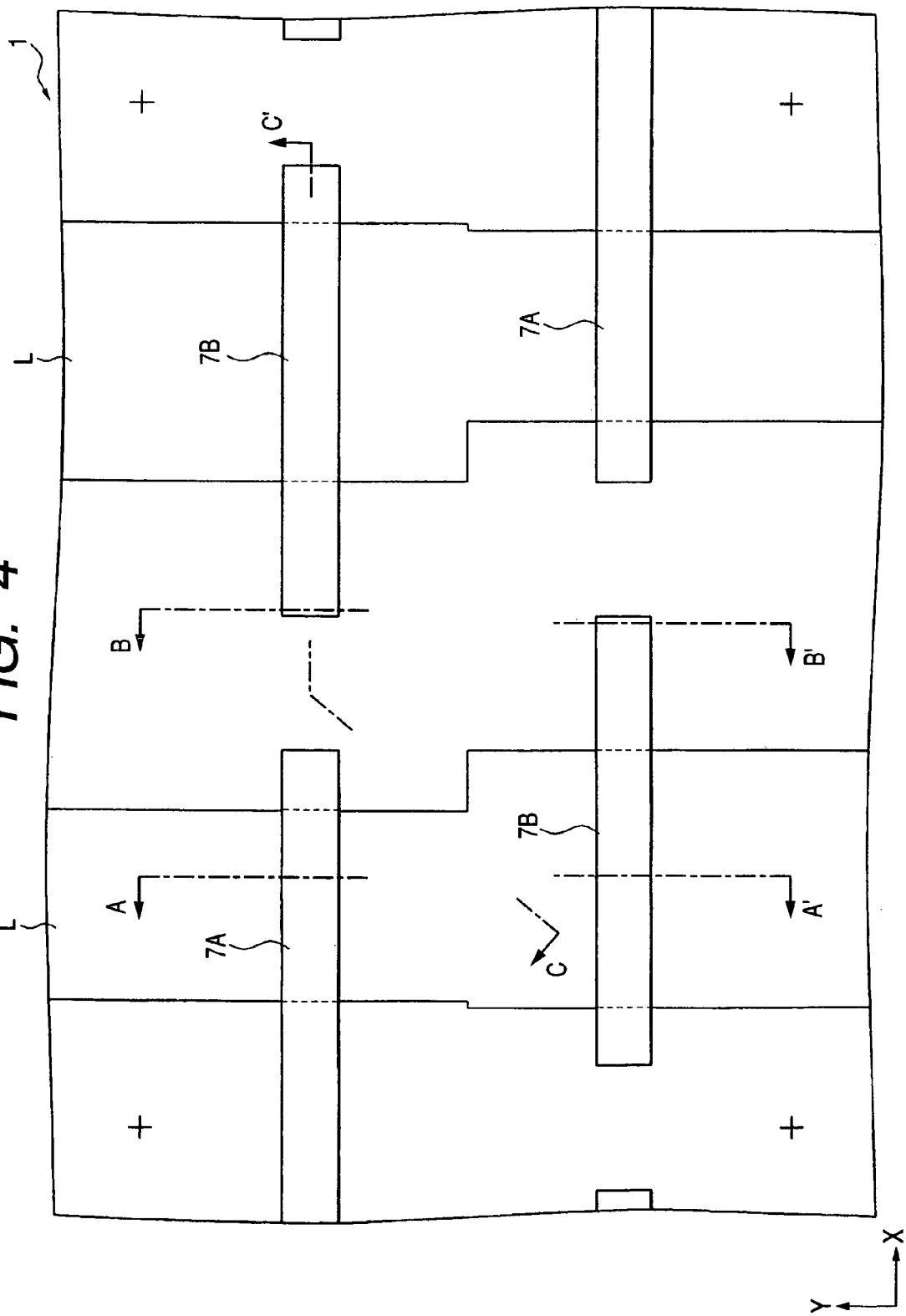
FIG. 4 is a plan view of a main portion showing a method of manufacturing an SRAM representing the preferred embodiment according to the invention.
Figure 5:
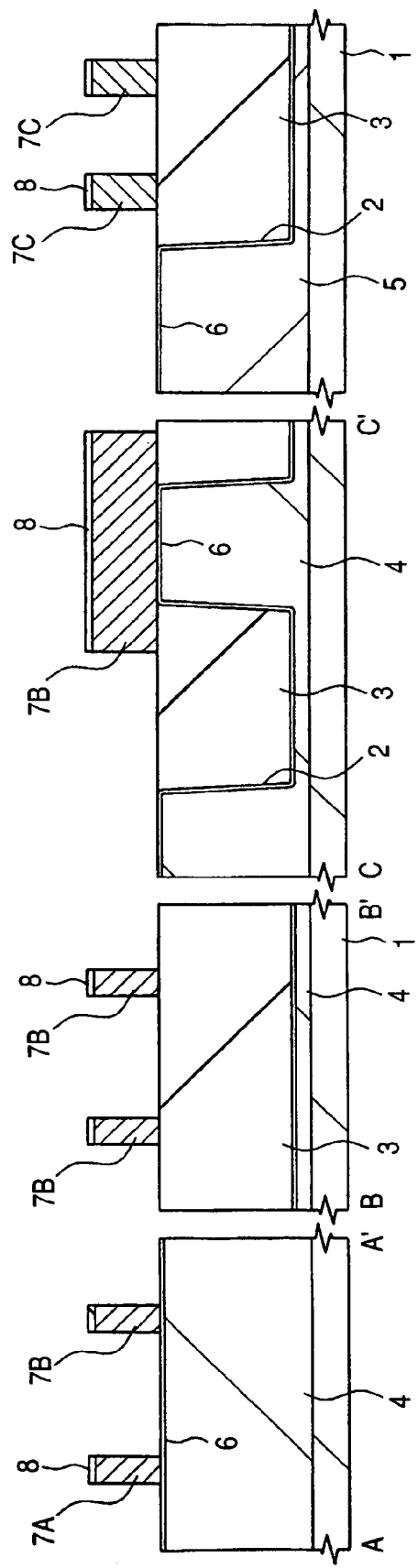
FIG. 5 is a cross sectional view of a main portion showing a method of manufacturing an SRAM representing the preferred embodiment according to the invention.

Then, as shown in FIG. 4 and FIG. 5, gate electrodes 7A and 7B comprising, for example, an n-polycrystal silicon film are formed as conductive films on the p-well 4 of the memory array, and a gate electrode 7C comprising, for example, a p-polycrystal silicon film is formed as a conductive film on the n-well 5 in the peripheral circuit region. Although not illustrated, a gate electrode comprising, for example, an n-polycrystal silicon film is formed as a conductive film on the p-well in the peripheral circuit region.

The gate electrode 7A formed to the memory array constitutes a gate electrode for the transfer MISFETs ($TR_1$, $TR_2$), and the gate electrode 7B constitutes the gate electrode for the driving MISFETs ($DR_1$, $DR_2$). Further, the gate electrode 7C formed in the peripheral circuit region constitutes the gate electrode for the p-channel type MISFET in the peripheral circuit. As shown in FIG. 4, each of the gate electrodes 7A and 7B formed to the memory array has a rectangular planar pattern extending in the direction X of the drawing.

The gate electrodes 7A, 7B and 7C are formed, for example, by forming an n-polycrystal silicon film on the gate insulating film 6 of the p-well 4, forming a p-polycrystal silicon film on the gate insulating film 6 of the n-well 5, and then depositing a silicon oxide film 8 as a cap insulating film over each of the n-polycrystal silicon film and the p-polycrystal silicon film, for example, by a CVD process. The n-polycrystal silicon film and the p-polycrystal silicon film are formed, for example, by depositing a non-doped polycrystal silicon film (or amorphous silicon film) over the gate insulating film 6 by a CVD process and then ion implanting phosphorus (or arsenic) to the polycrystal silicon film (or amorphous silicon film) over the p-well 4 and ion implanting boron into the non-doped polycrystal silicon film (or amorphous silicon film) over the n-well 5.

Then, the silicon oxide film 8 is patterned so as to be in a planar shape identical with the gate electrodes 7A, 7B and 7C by dry etching using a photoresist film as a mask and, successively, the n-polycrystal silicon film and the p-polycrystal silicon film are dry etched by using the patterned silicon oxide film 8 as a mask.

Figure 6:
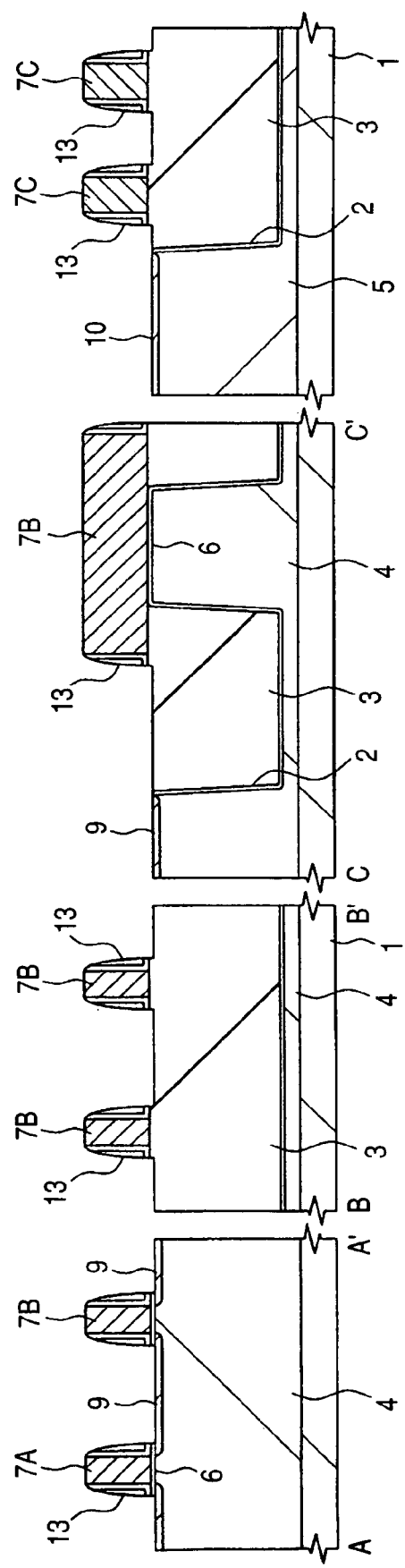
FIG. 6 is a cross sectional view of a main portion showing a method of manufacturing an SRAM representing the preferred embodiment according to the invention.

Then, as shown in FIG. 6, n-impurities (phosphorus or arsenic) are ion implanted, for example, to the p-well 4, thereby forming an $n^-$-semiconductor region 9 at a relatively low concentration and p-impurities (boron) are ion implanted into the n-well 5 thereby forming a $p^-$-semiconductor region 10 at a relatively low concentration. The $n^-$-semiconductor region 9 is formed for providing an LDD (Lightly Doped Structure) for the source and the drain of each of the transfer MISFETs ($TR_1$, $TR_2$), the driving MISFETs ($DR_1$, $DR_2$), and the N-channel type MISFET in the peripheral circuit, and the $p^-$-semiconductor region 10 is formed for providing the LDD structure for the source and the drain of the p-channel MISFET in the peripheral circuit.

Then, a side wall spacer 13 comprising an insulating film is formed to the side wall for each of the gate electrodes 7A, 7B, 7C. The side wall spacer 13 is formed, for example, by depositing a silicon oxide film and a silicon nitride film over the substrate 1 by a CVD process and then anisotropically etching the silicon nitride film and the silicon oxide film. In this step, the silicon oxide film 8 covering the upper surface for each of the gate electrodes 7A, 7B and 7C, and the silicon oxide film (gate insulating film 6) over the surface of the substrate 1 are etched, thereby exposing the surface of each of the gate electrodes 7A, 7B, and 7C and the surface for each of the $n^-$-semiconductor region 9 and the $p^-$-semiconductor region 10.

Figure 7:
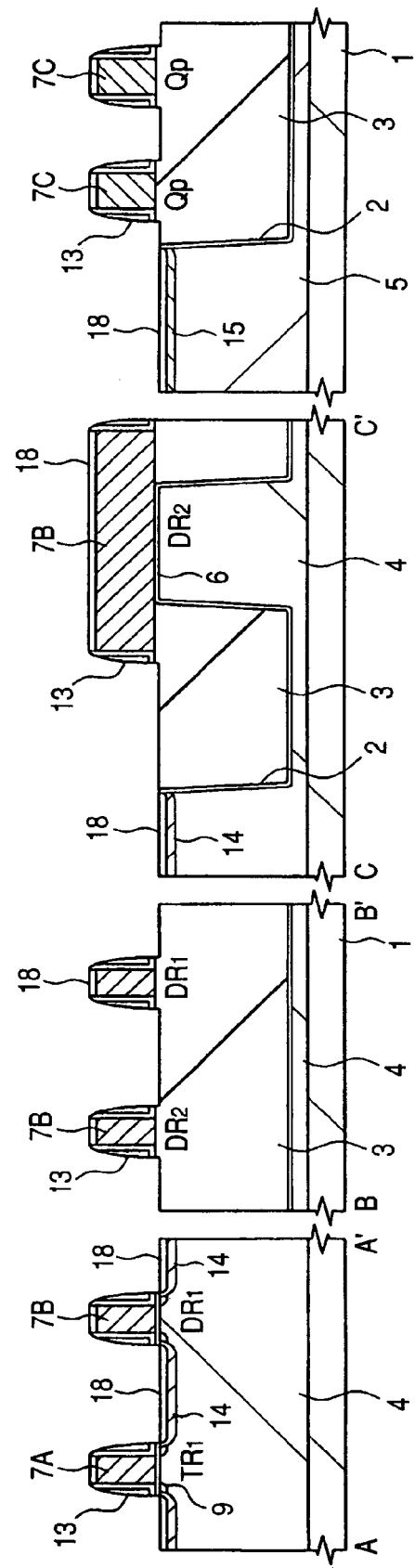
FIG. 7 is a cross sectional view of a main portion showing a method of manufacturing an SRAM representing the preferred embodiment according to the invention.

Then, as shown in FIG. 7, n-impurities (phosphorus or arsenic) are ion implanted into the p-well 4 to form an $n^+$-semiconductor region 14 at a relatively high concentration, and p-impurities (boron) are ion implanted into the n-well 5 to form a $p^+$-semiconductor region 15 at a relatively high concentration. The $n^+$-semiconductor region 14 formed in the p-well 4 of the memory array constitutes the source and the drain for each of the transfer MISFETs ($TR_1$, $TR_2$) and the driving MISFETs ($DR_1$, $DR_2$), and the $p^+$-semiconductor region 15 formed in the n-well 5 of the peripheral circuit region constitutes the source and the drain of the p-channel MISFET. Phosphorus or arsenic are ion implanted as n-impurities into the not-illustrated p-well in the peripheral circuit region, to form an n+-semiconductor region at a relatively high concentration constituting the source and the drain of the n-channel type MISFET.

Then, a Co silicide layer 18 is formed to the surface of the gate electrodes 7A, 7B, and 7C, and the surface of the source and the drain (n+-semiconductor region 14, p+-semiconductor region 15) respectively. The Co silicide layer 18 is formed, for example, by depositing a cobalt (Co) film over the substrate 1 by a sputtering method, successively applying a heat treatment to the substrate 1 to cause silicide reaction at the boundary between the Co film and the gate electrodes 7A, 7B, and 7C and at the boundary between the Co film and the substrate 1 and then etching to remove an unreacted Co film. By the steps described so far, the n-channel type transfer MISFETs (TR$_1$, TR$_2$) and the driving MISFETs (DR$_1$, DR$_2$) are formed in the memory array and p-channel type MISFETs (Qp) and the not illustrated n-channel type MISFET are formed in the peripheral circuit region.

Figure 8:
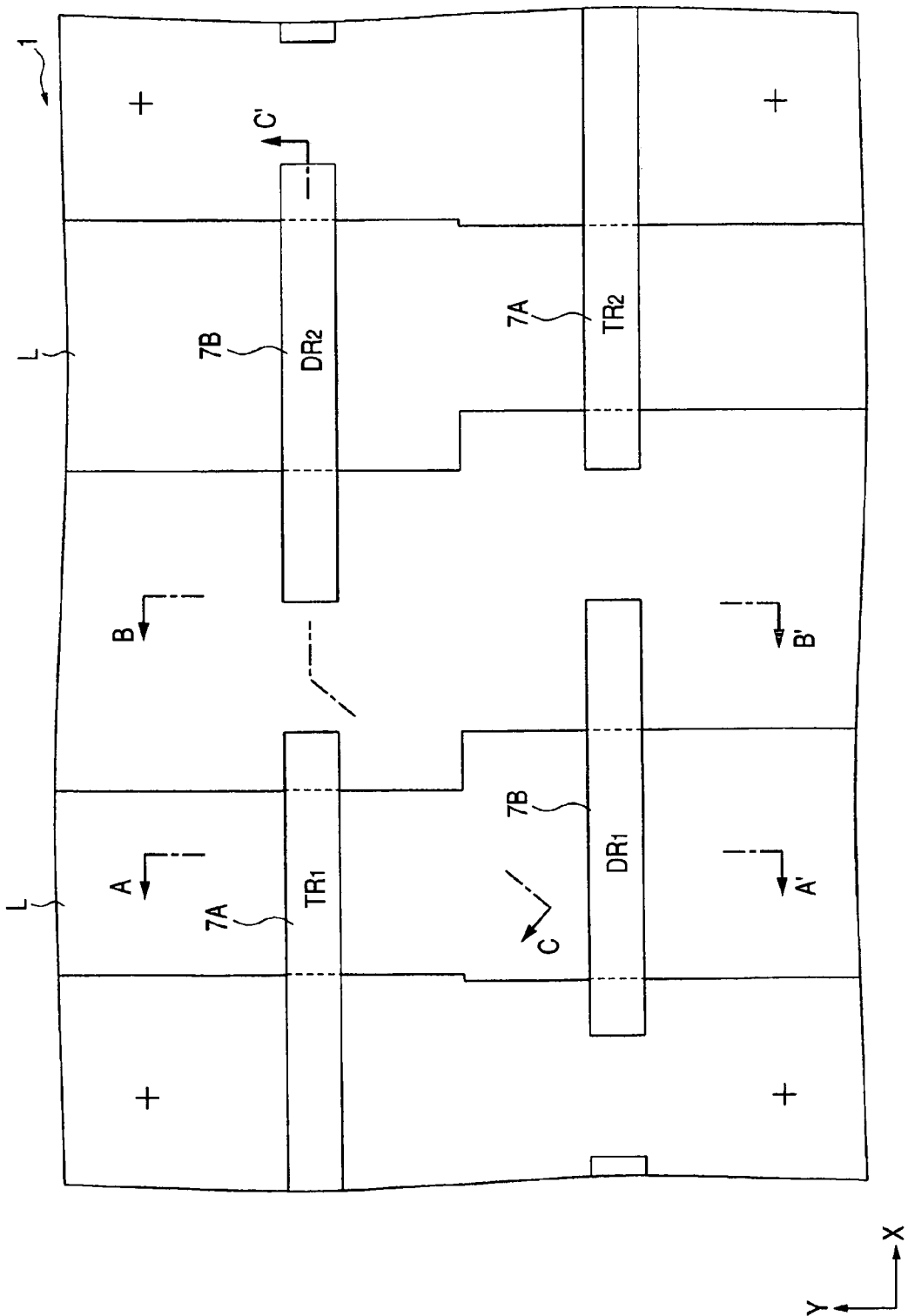
FIG. 8 is a plan view of a main portion showing a method of manufacturing an SRAM representing the preferred embodiment according to the invention.

As shown in FIG. 8, the transfer MISFET (TR$_1$) and the driving MISFET (DR$_1$) on one side and the transfer MISFET (TR$_2$) and the driving MISFET (DR$_2$) on the other side are isolated in the lateral direction (direction X) as seen in the drawing by way of the device isolation portion and they are arranged in a point-to-point symmetry with respect to the center for the memory cell forming region. Further, the gate electrodes 7B for the driving MISFET (DR$_2$) and the driving MISFET (DR$_1$) are arranged so as to extend in the lateral direction (direction X) as seen in the drawing, and each one end thereof is terminated above the device isolation portion between the transfer MISFET (TR$_1$) and the driving MISFET (DR$_1$) on one side and the transfer MISFET (TR$_2$) and the driving MISFET (DR$_2$) on the other side, and the vertical MISFETs (SV$_1$, SV$_2$) to be described later are formed above the one end.

Figure 9:
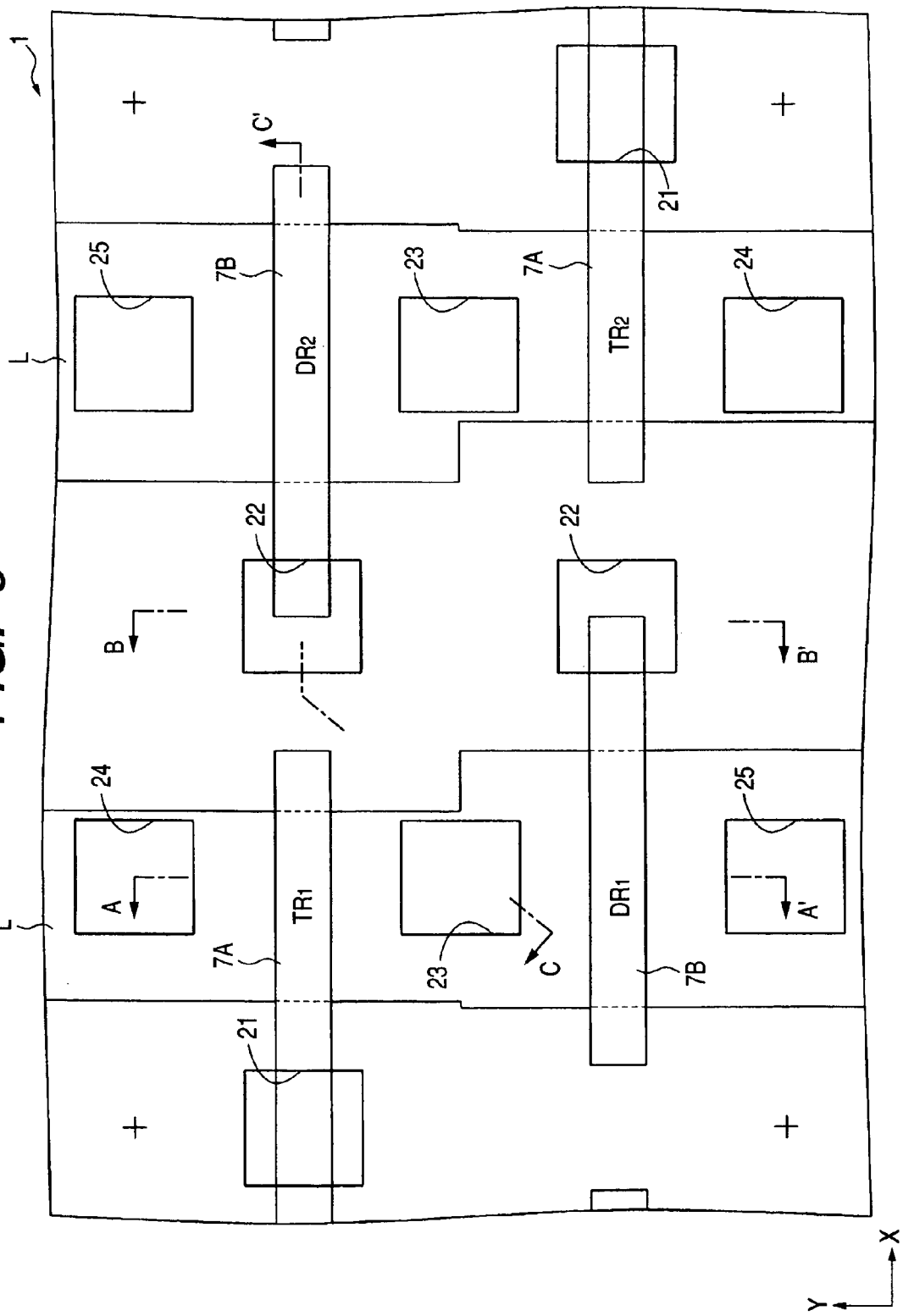
FIG. 9 is a plan view of a main portion showing a method of manufacturing an SRAM representing the preferred embodiment according to the invention.
Figure 10:
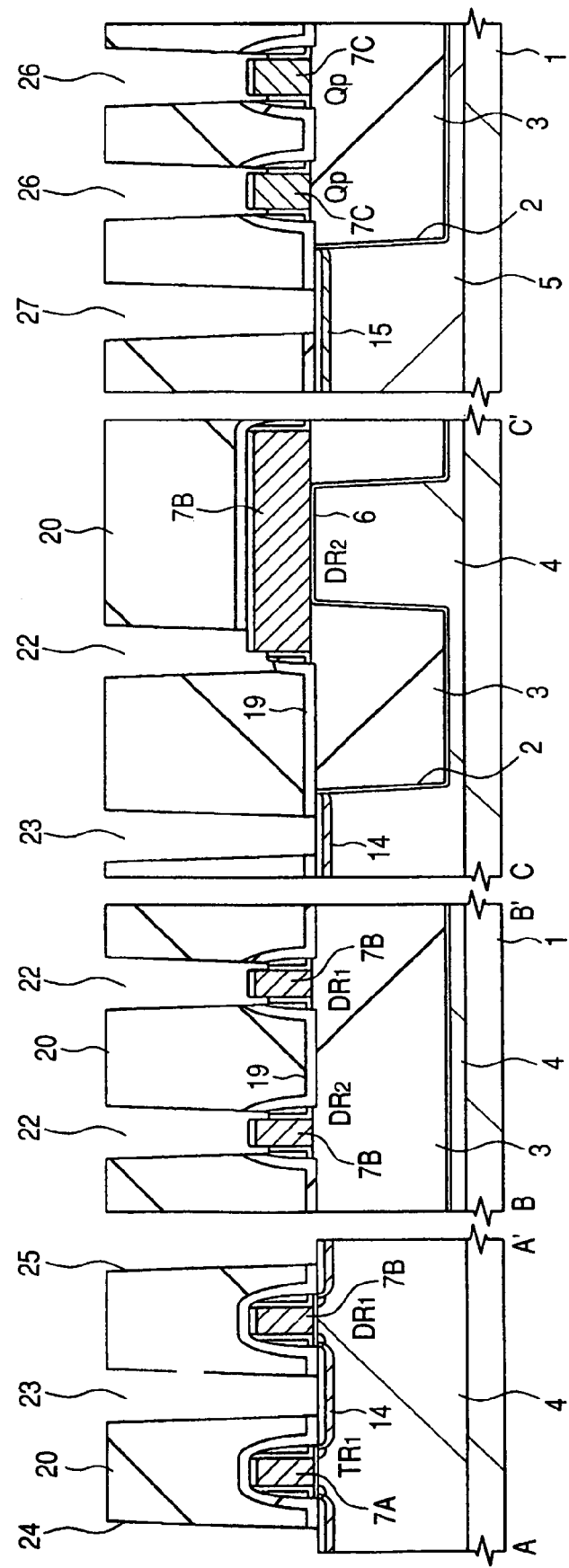
FIG. 10 is a cross sectional view of a main portion showing a method of manufacturing an SRAM representing the preferred embodiment according to the invention.

Then, as shown in FIG. 9 and FIG. 10, a silicon nitride film 19 and a silicon oxide film 20 are deposited, for example, by a CVD process as insulating films covering the MISFETs (TR$_1$, TR$_2$, DR$_1$, DR$_2$, Qp) and, successively, the surface of the silicon film 20 is planarized by a chemical polishing method.

Then, the silicon oxide film 20 and the silicon nitride film 19 are dry etched by using a photoresist film as a mask, thereby forming a contact hole 21 over the gate electrode 7B of the driving MISFETs (DR$_1$, DR$_2$), and contact holes 22 over the gate electrodes 7B of the transfer MISFETs (TR$_1$, TR$_2$). Further, contact holes 23, 24, and 25 are formed over the source and the drain (n+-semiconductor region 14) of the transfer MISFETs (TR$_1$, TR$_2$) and the driving MISFETs (DR$_1$, DR$_2$) respectively, and contact holes 26 and 27 are formed over the gate electrode 7C and the source and the drain (p+-semiconductor region 15) of the p-channel type MISFET (Qp) in the peripheral circuit region.

Figure 11:
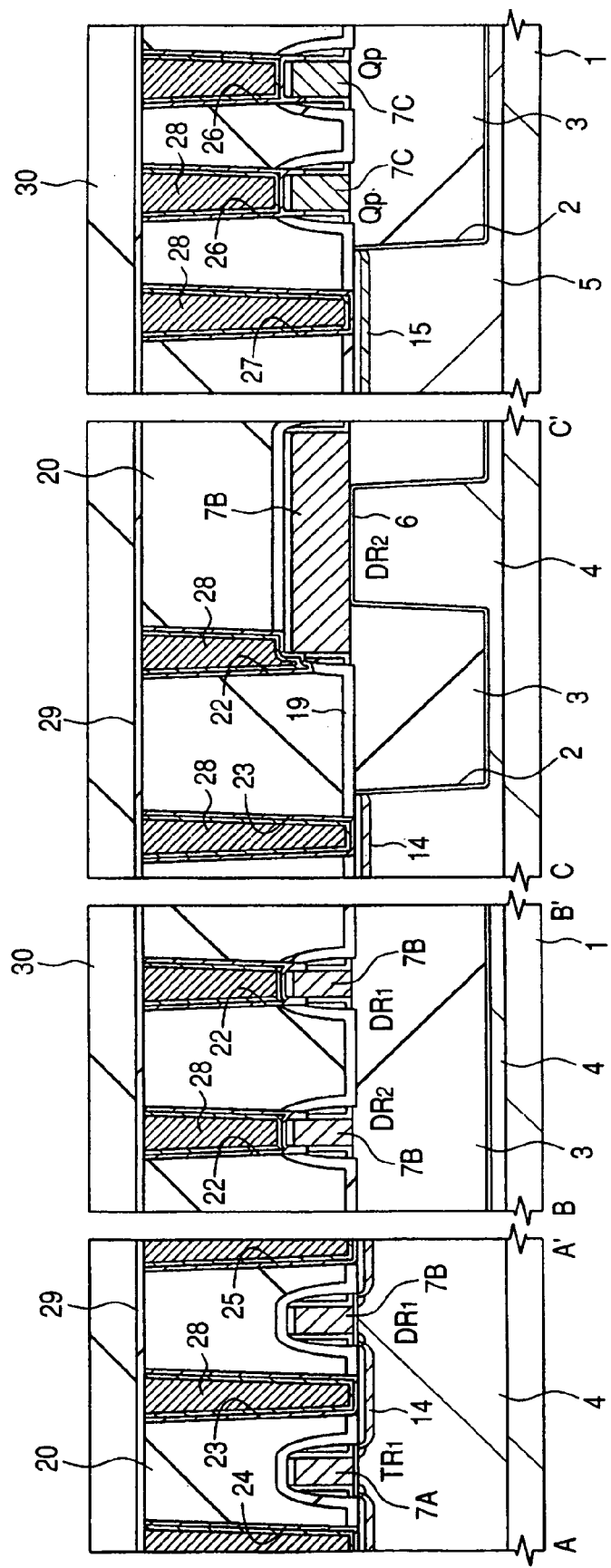
FIG. 11 is a cross sectional view of a main portion showing a method of manufacturing an SRAM representing the preferred embodiment according to the invention.

Then, as shown in FIG. 11, after forming a plug 28 inside the contact holes 21 to 27, a silicon nitride film 29 and a silicon oxide film 30 are deposited over the substrate 1 by a CVD process. The plug 28 is formed, for example, by depositing a titaniunm (Ti) film and a titanium nitride (TiN) film on the silicon oxide film 20 including the inside of the contact holes 21 to 27 by a sputtering method, successively depositing a TiN film and a tungsten (W) film as a metal film by a CVD process and then removing the W film, TiN film, and Ti film outside the contact holes 21 to 27 by a chemical mechanical polishing method. The silicon nitride film 29 under the silicon oxide film 30 is used as a stopper film upon etching the silicon oxide film 30 in the next step.

Figure 12:
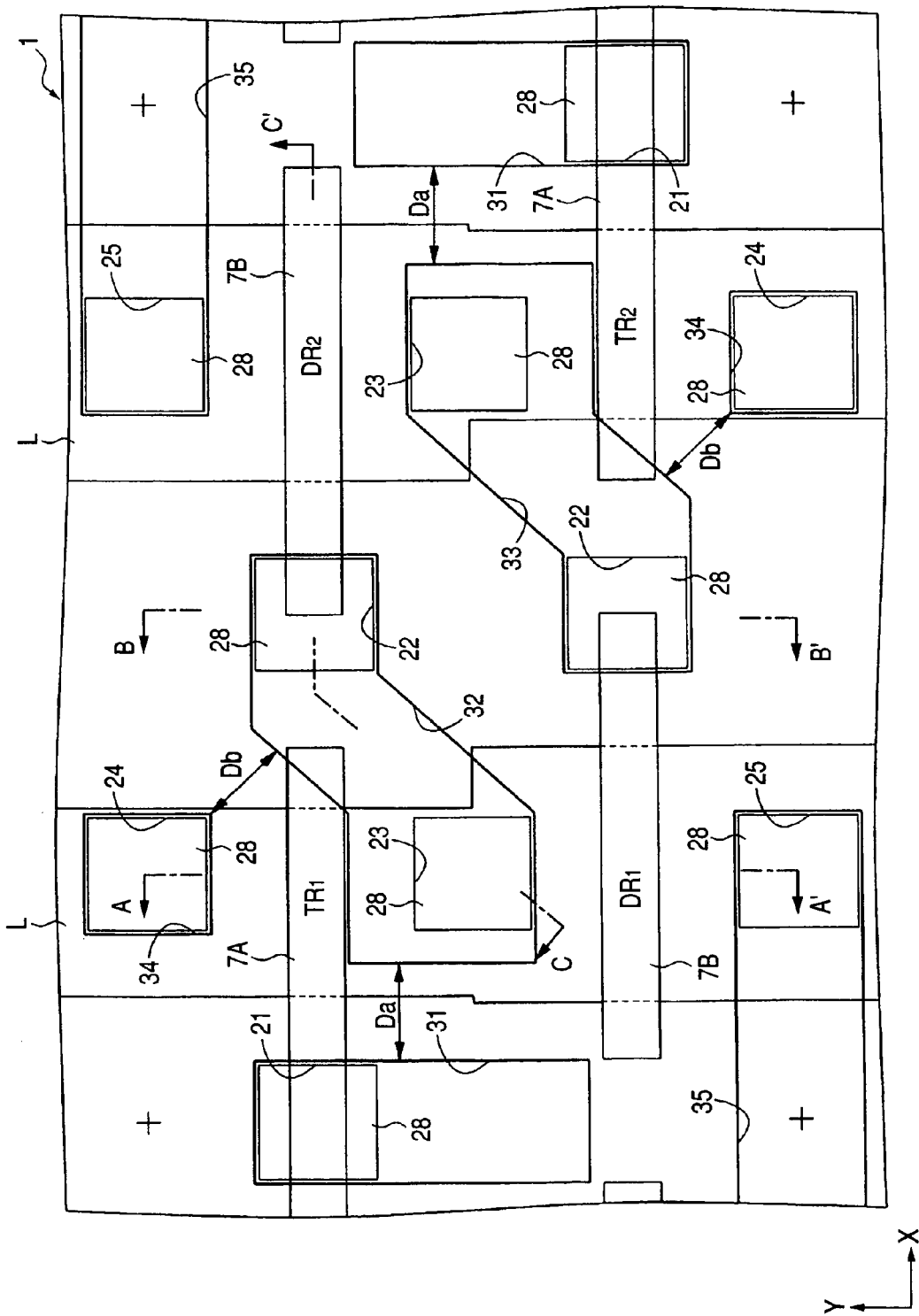
FIG. 12 is a plan view of a main portion showing a method of manufacturing an SRAM representing the preferred embodiment according to the invention.
Figure 13:
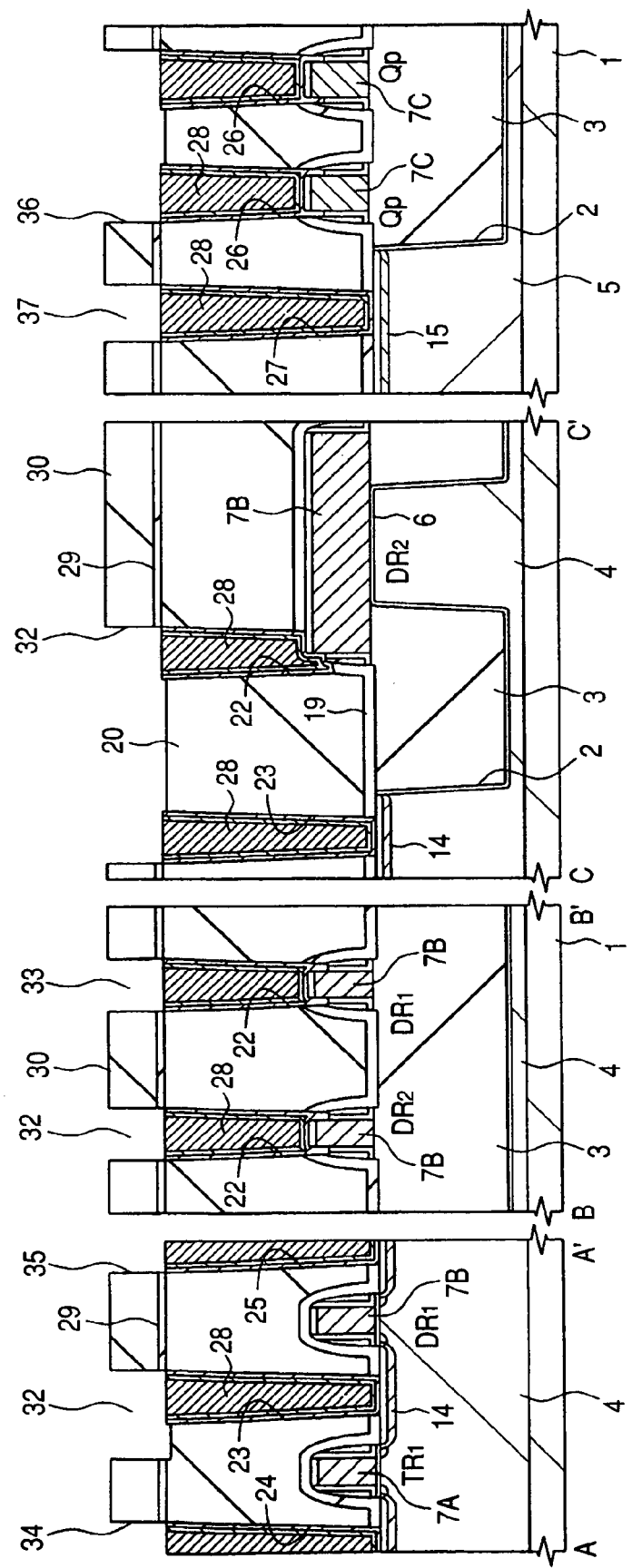
FIG. 13 is a cross sectional view of a main portion showing a method of manufacturing an SRAM representing the preferred embodiment according to the invention.

Then, as shown in FIG. 12 and FIG. 13, the silicon nitride film 29 and the silicon oxide film 30 are dry etched by using a photoresist film as a mask thereby forming trenches 31 to 37 over the contact holes 21 to 27, respectively. Among the trenches 31 to 37, each of the trenches 32 and 33 formed in the memory array respectively has a planar pattern extending from one to the other of the contact holes 22 and 23.

Further, among the trenches 31 to 35 formed to the memory array, the shortest distance (Da) between the trench 31 and the trench 32, and the shortest distance (Da) between the trench 31 and trench 33 shown in FIG. 12 is, for example, 0.14 μm and the shortest distance (Db) and the shortest distance (Db) between the trench 33 and the trench 34 is, for example, 0.11 μm.

In this case, when the patterns for the trenches 31 to 37 are intended to be transferred to the photoresist film by using an exposure apparatus using, as a light source, KrF (krypton fluoride) at a wavelength of 0.193 μm for instance, since each of the shortest distance (Da) or (Db) is smaller than the resolution limit for the exposure light, the pattern for the trench 31 and the pattern for the trench 32 or 33, as well as the pattern for the trench 32 or 33 and the pattern for the trench 34 are connected, not isolated from each other by the interference between the exposure lights. That is, in this case, the trenches 31 to 34 can not be isolated from each other. In view of the above, the trenches 31 to 37 are formed in this embodiment by using the following method.

Figure 14:
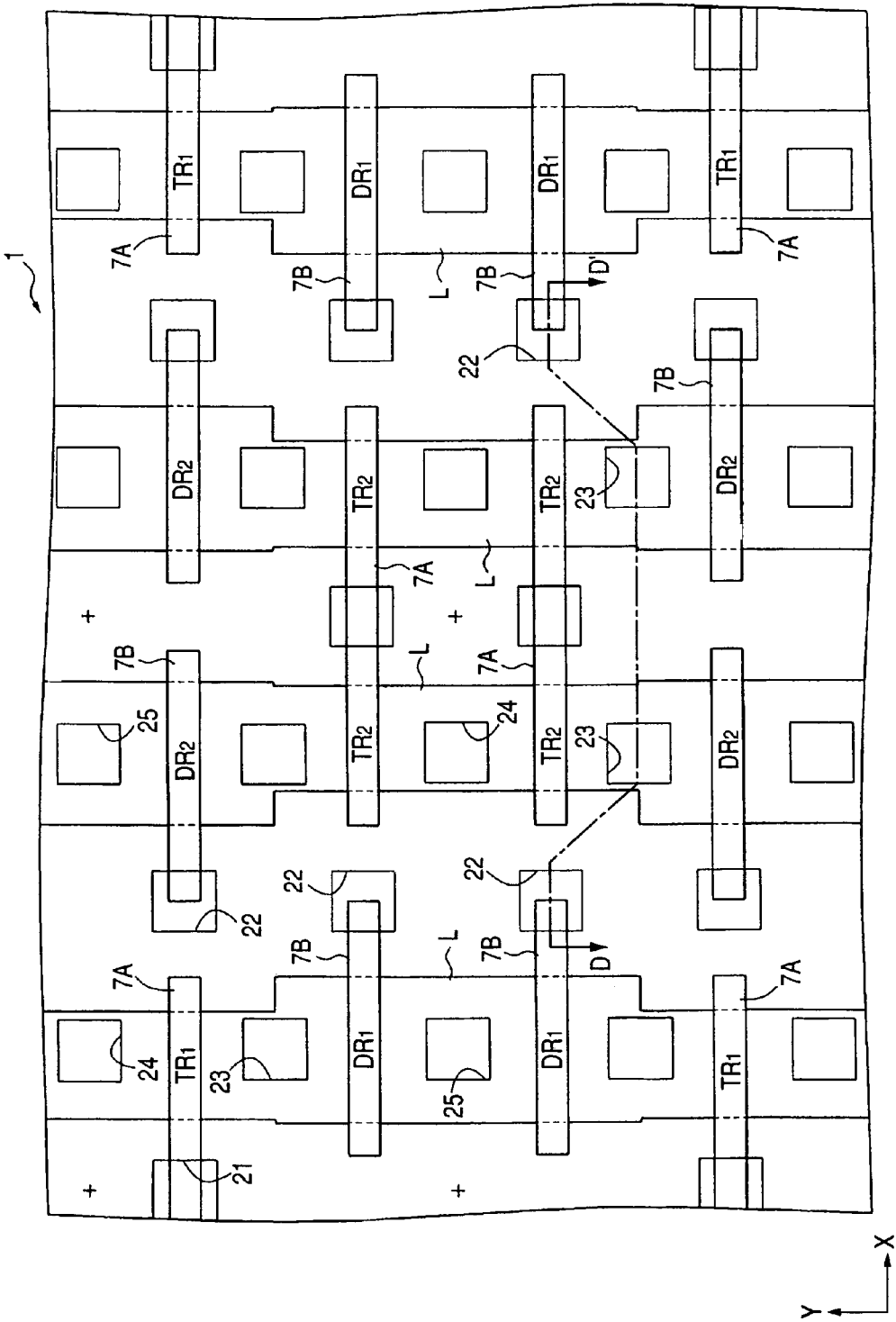
FIG. 14 is a plan view of a main portion showing a method of manufacturing an SRAM representing the preferred embodiment according to the invention.
Figure 15:
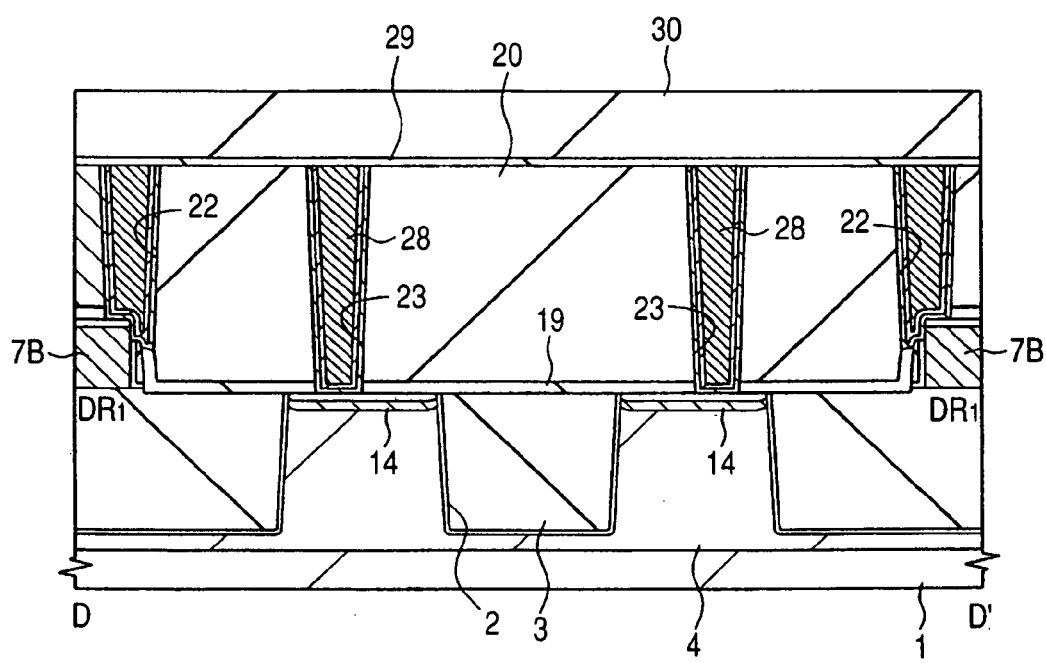
FIG. 15 is a cross sectional view taken along line D-D' in FIG. 14.

FIG. 14 is a plan view of a memory array in the stage of depositing the silicon nitride film 29 and the silicon oxide film 30 over the substrate 1 (step shown in FIG. 11) which shows the region including about four memory cells. Further, FIG. 15 is a cross sectional view taken along line D-D' in FIG. 14.

Figure 16:
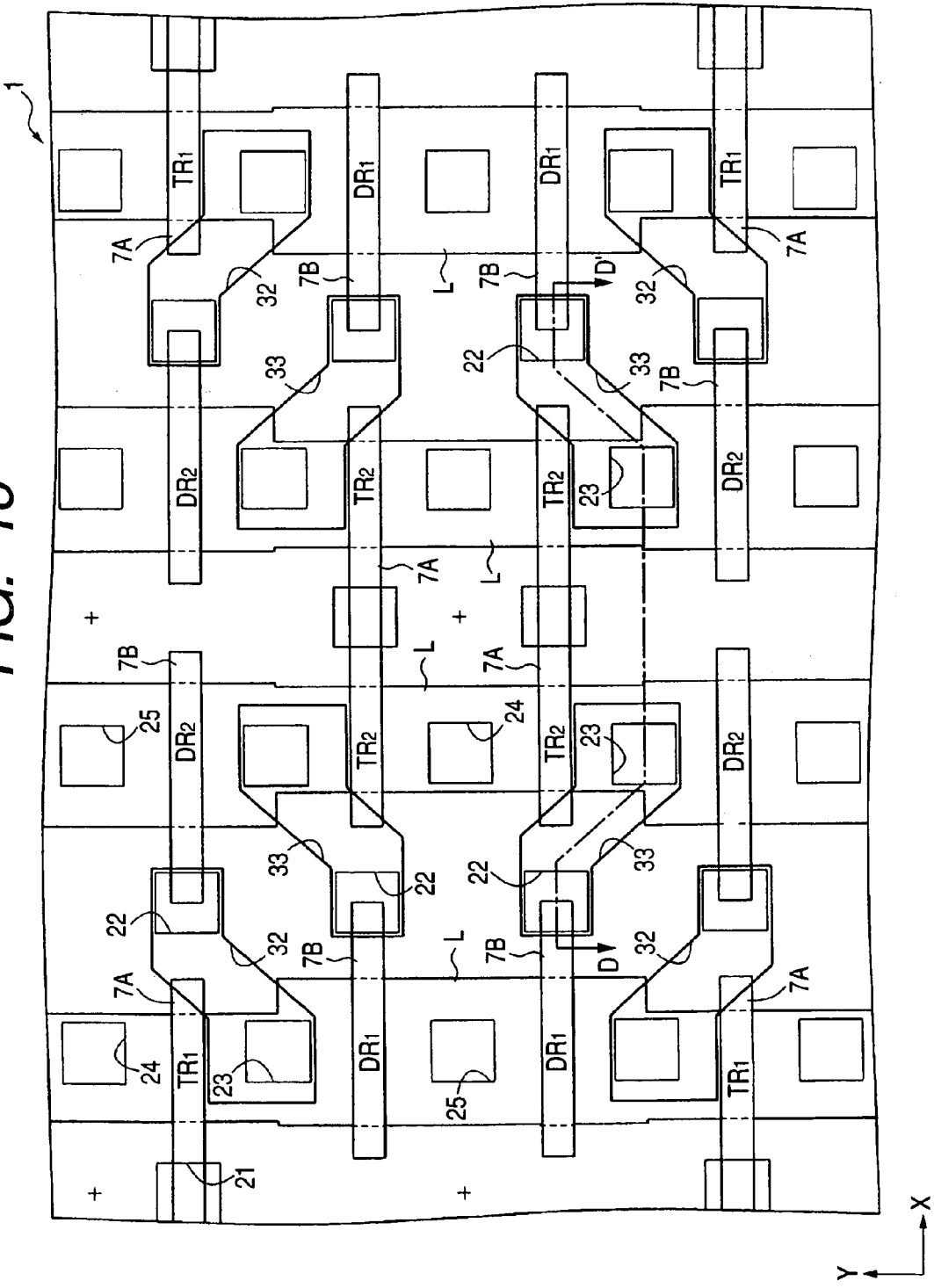
FIG. 16 is a plan view of a main portion showing a method of manufacturing an SRAM representing the preferred embodiment according to the invention.
Figure 17:
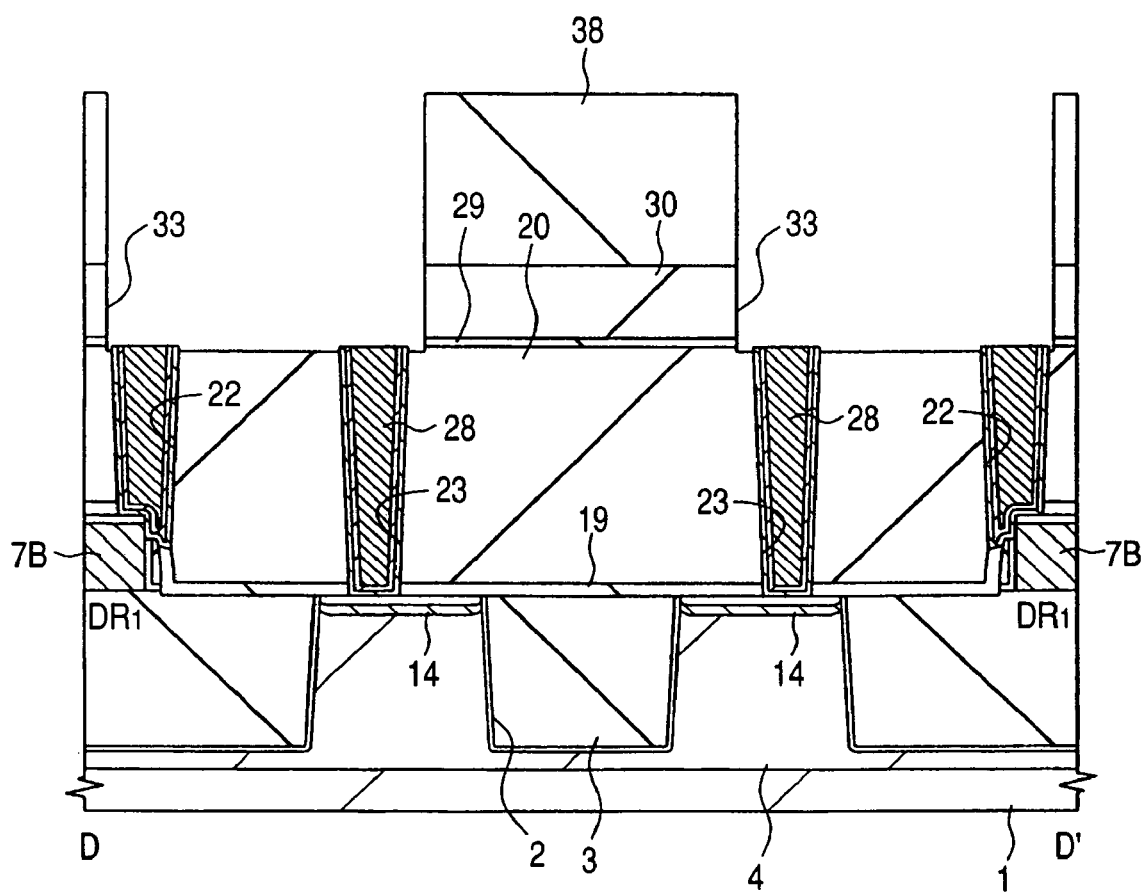
FIG. 17 is a cross sectional view of a main portion showing a method of manufacturing an SRAM representing the preferred embodiment according to the invention.

As shown in FIG. 16 and FIG. 17, a first photoresist film 38 is formed over the silicon oxide film 30, and the silicon oxide film 30 and the silicon nitride film 29 are dry etched by using the photoresist film 38 as a mask, thereby forming a portion for the trenches 31 to 35, for example, the trench 32 and the trench 33. That is, in this step, the patterns for the trenches 32 and 33 are transferred to the photoresist film 38 by using the first photomask (not illustrated) formed with the patterns for the trenches 32 and 33 and then the trenches 32 and 33 are formed to the silicon oxide film 30 and the silicon oxide nitride film 29 by dry etching using the photoresist film 38 as a mask.

With such a constitution, since the distance between the two trenches 32 and 33 is larger than the resolution limit for the exposure light (0.193 μm in a case of using KrF as a light source) even at the shortest portion, the patterns for the trenches 32 and 33 can be transferred at a good accuracy to the photoresist film 38 and, accordingly, trenches 32 and 33 can be formed at a good accuracy to the silicon oxide film 30 and the silicon nitride film 29.

Figure 18:
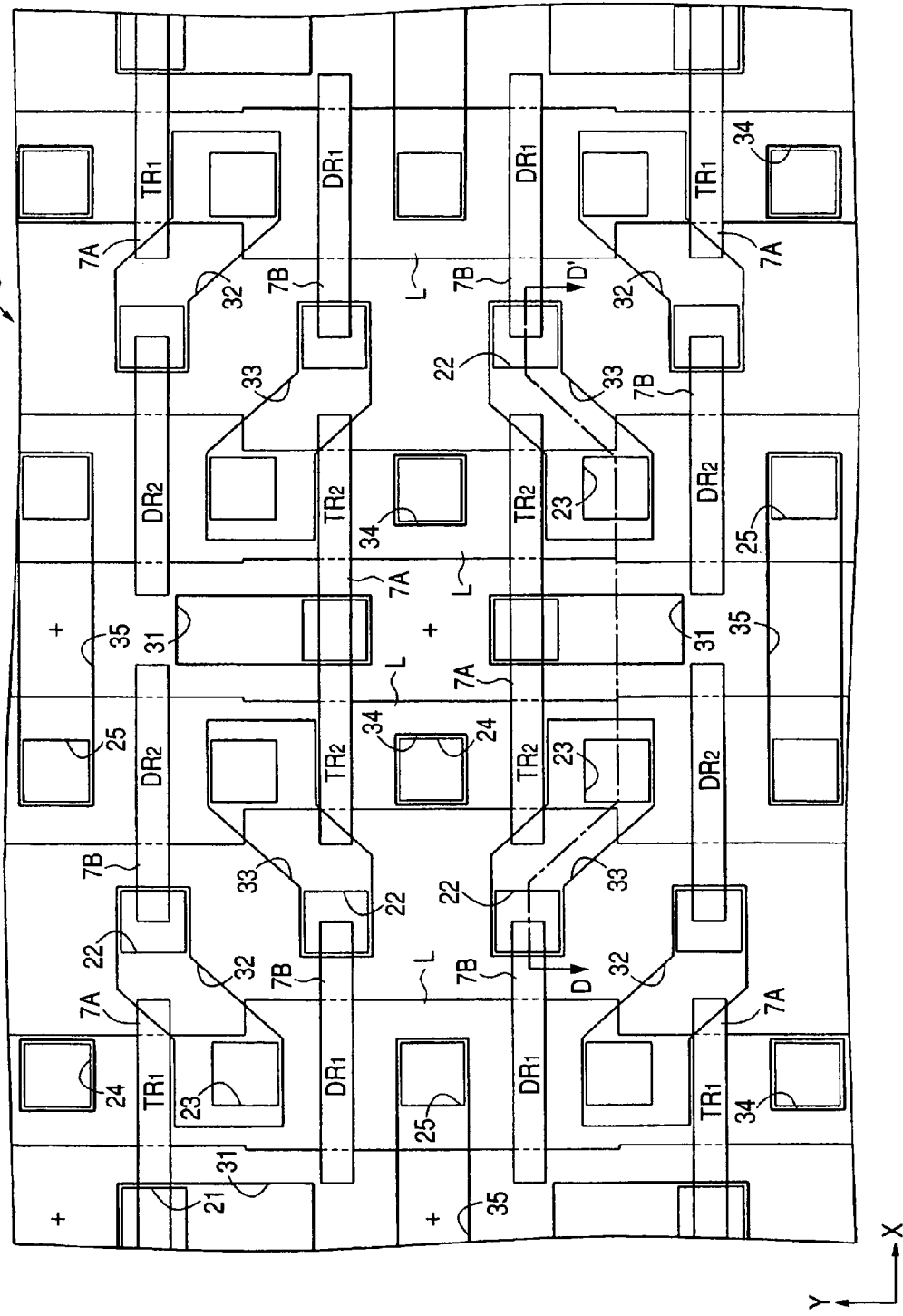
FIG. 18 is a plan view of a main portion showing a method of manufacturing an SRAM representing the preferred embodiment according to the invention.
Figure 19:
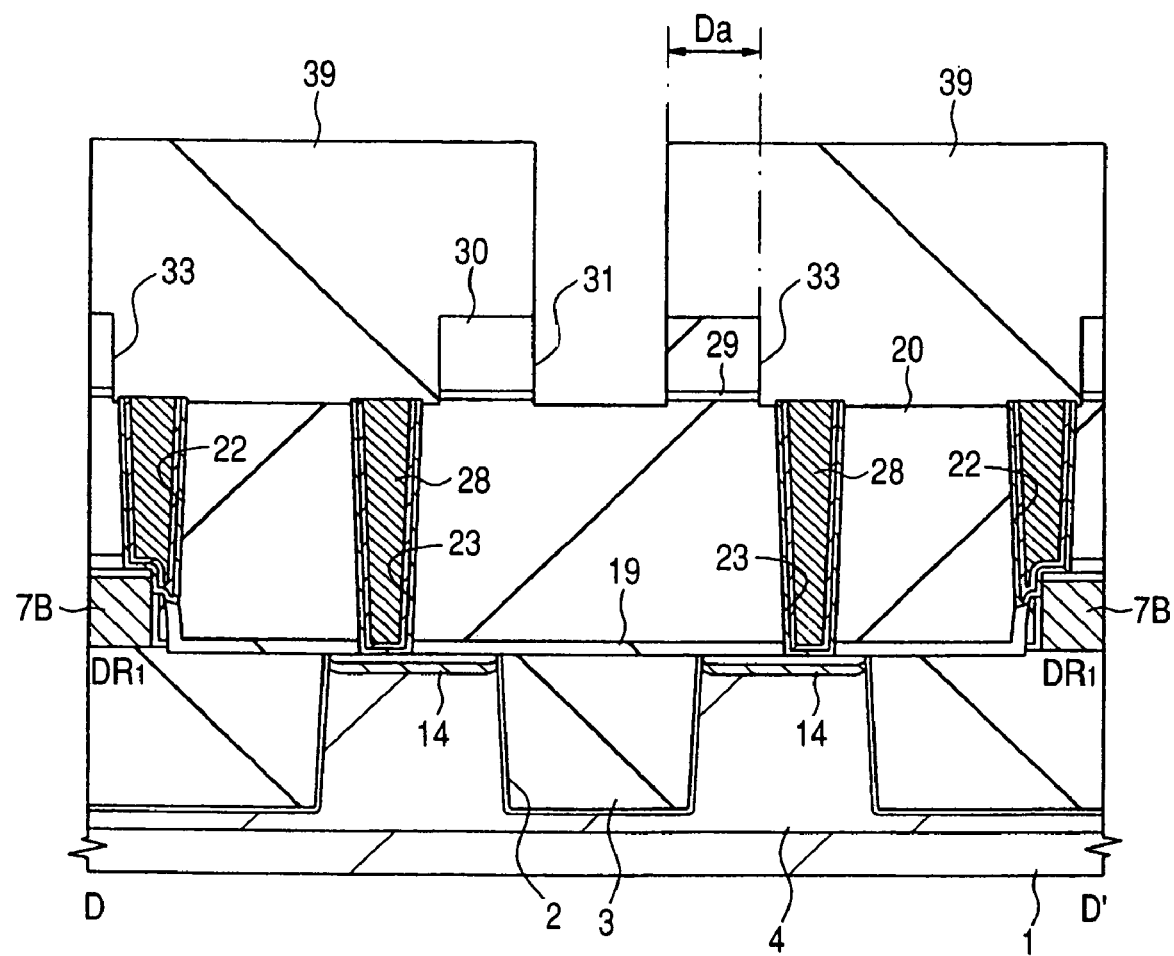
FIG. 19 is a cross sectional view of a main portion showing a method of manufacturing an SRAM representing the preferred embodiment according to the invention.

Then, after removing the photoresist film 38, as shown in FIG. 18 and FIG. 19, a second photoresist film 39 is formed over the silicon oxide film 30, and the silicon oxide film 30 and the silicon nitride film 29 are dry etched by using the photoresist film 39 as a mask thereby forming, for example, a trench 31, a trench 34 and a trench 35. That is, in this step, patterns for the trenches 31, 34, and 35 are transferred to the photoresist film 39 by using a second photomask (not illustrated) formed with the patterns for the trenches 31, 34, and the 35 and then the trenches 31, 34, and the 35 are formed to the silicon oxide film 30 and the silicon nitride film 29 by dry etching using the photoresist 39 as a mask. With such a constitution, since the distance between each of the trenches 31, 34, and 35 is larger than the resolution limit for the exposure light even at the shortest portion, the patterns for the trenches 31, 34, and 35 can be transferred at a good accuracy to the photoresist film 39 and, accordingly, the trenches 31, 34, and 35 can be formed at a good accuracy to the silicon oxide film 30 and the silicon nitride film 29.

As described above, in this embodiment, in a case of forming the trenches 31 to 35 each at a distance closer to each other in one identical memory cell, the trenches 32 and 33 are at first formed by using the first photoresist film 38 transferred with the patterns for the two trenches 32 and 33 at a distance between them which is larger than the resolution limit for the exposure light, then the trenches 31, 34, and 35 are formed by using the second photoresist film 39 transferred with the patterns for the three trenches 31, 34, and 35 with the distance between each of them being larger than the resolution limit to the exposure light. Alternatively, the trenches 31, 34, and 35 may be formed at first by using the photoresist film 39 and then the trenches 32 and 33 may be formed by using the photoresist film 38.

With the constitution described above, even in a case where the shortest distance (Da) between the trench 31, and the trench 32 or 33 or the shortest distance (Db) between the trench 32 or 33 and the trench 34 is smaller than the resolution limit for the exposure light, among the trenches 31 to 35 formed in one identical memory cell, all the trenches 31 to 35 can be formed at a good accuracy.

The trenches 36 and 37 formed in the peripheral circuit region generally have a larger distance between each other even in a case where they are connected with one MISFET compared with the trenches 31 to 35 formed in the memory array.

Accordingly, the trenches 36 and 37 in the peripheral circuit region can be formed simultaneously upon formation of the trenches 32 and 33 in the memory array by dry etching using the first photoresist film 38, or upon formation of the trenches 31, 34, and 35 in the memory array by dry etching using the second photoresist film 39 as a mask. When it is intended to make the distance between the trenches 36 and 37 formed in the peripheral circuit region narrower than the resolution limit for the exposure light, this may be achieved by forming one of the trenches 36 and 37 upon forming the trenches 32 and 33 to the memory array by dry etching using the first photoresist film 38 as a mask and by forming the other of the trenches 36 and 37 upon forming the trenches 31, 34, and 35 in the memory array by dry etching using the second photoresist film 39 as a mask.

Figure 20:
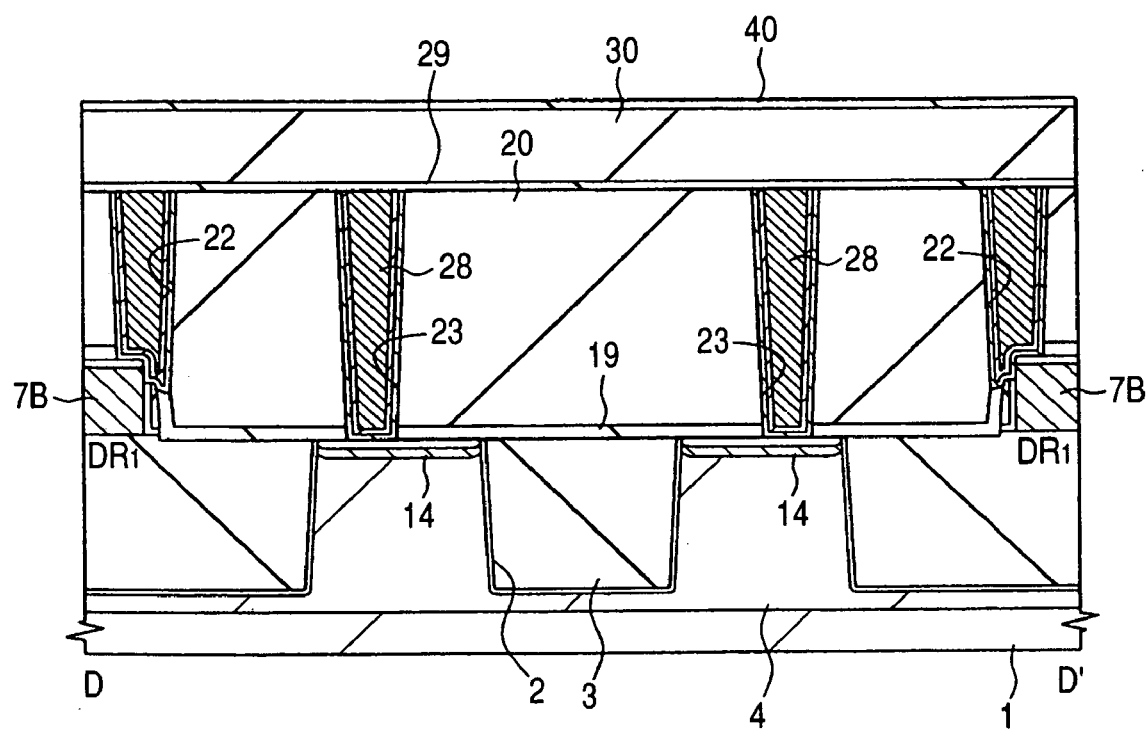
FIG. 20 is a cross sectional view of a main portion showing a method of manufacturing an SRAM representing the preferred embodiment according to the invention.

The trenches 31 to 35 can be formed also by the following method. At first, as shown in FIG. 20, after depositing a silicon nitride film 29 and a silicon oxide film 30 over a substrate 1, a silicon nitride film 40 is deposited over the silicon oxide film 30. The silicon nitride film 40 as the uppermost layer is used as a hard mask upon etching the silicon oxide film 30 as the lower layer thereof.

Figure 21:
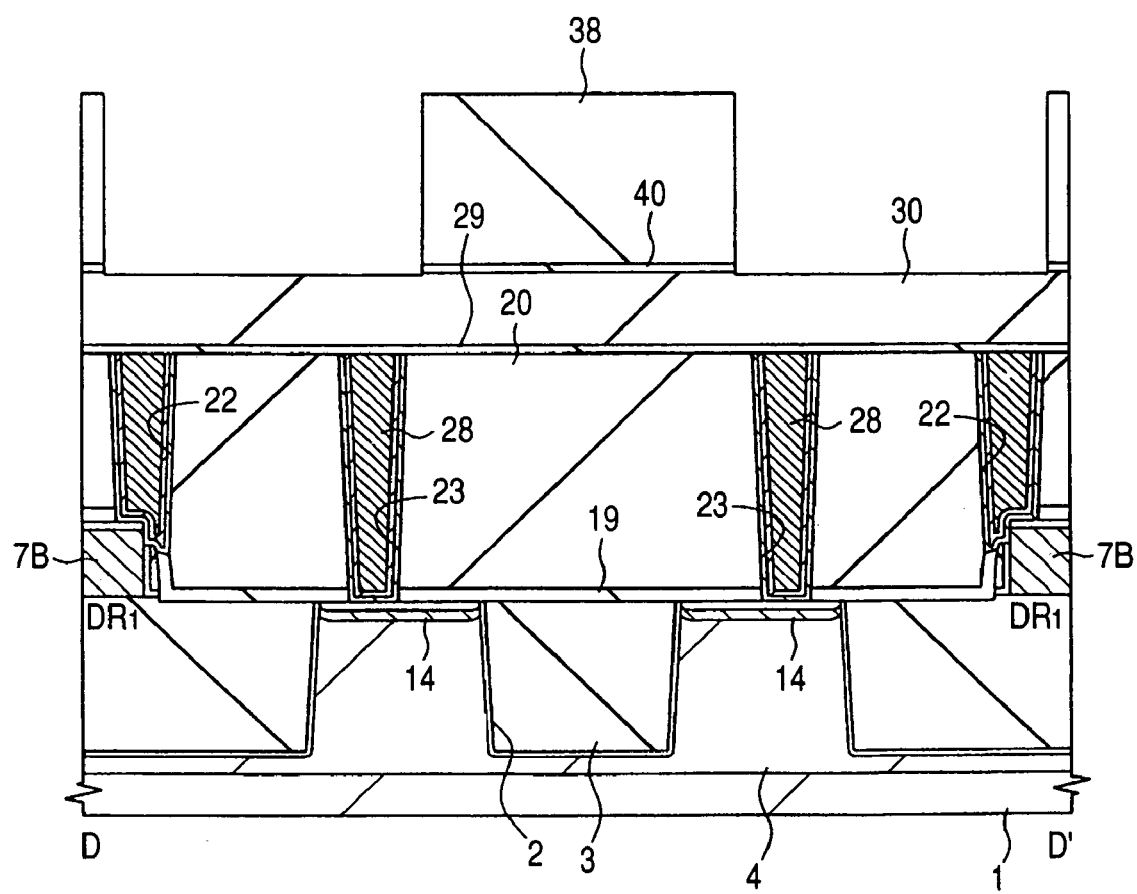
FIG. 21 is a cross sectional view of a main portion showing a method of manufacturing an SRAM representing the preferred embodiment according to the invention.

Then, as shown in FIG. 21, after transferring patterns for the groove 32 and 33 to the first photoresist film 38 formed over the silicon nitride film 40, the silicon nitride film 40 is dry etched by using the photoresist film 38 as a mask.

Figure 22:
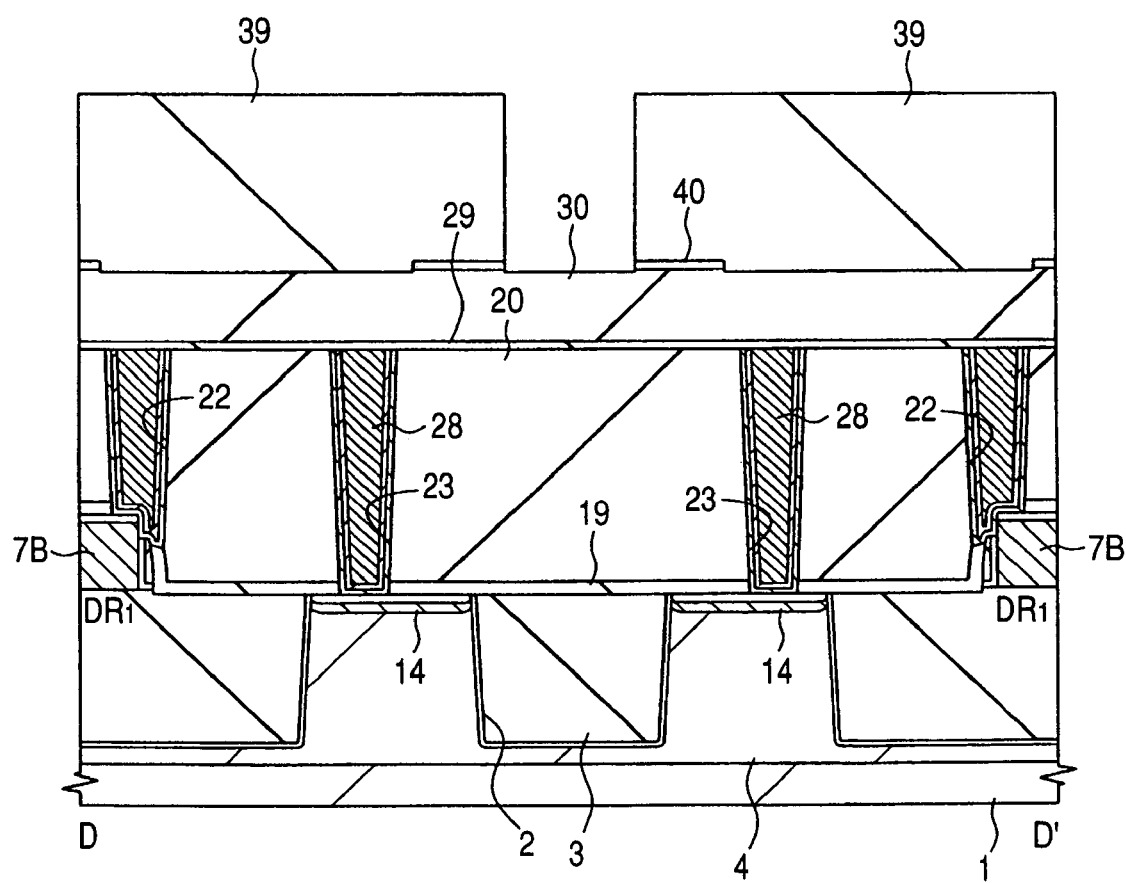
FIG. 22 is a cross sectional view of a main portion showing a method of manufacturing an SRAM representing the preferred embodiment according to the invention.

Then, after removing the photoresist film 38, as shown in FIG. 22, patterns for the trenches 31, 34 and 35 are transferred to the second photoresist film 39 formed over the silicon nitride film 40, and the silicon nitride film 40 is dry etched by using the photoresist film 39 as a mask.

As described above, the trenches 32 and 33 are formed at first to the silicon nitride film 40 by using the first photoresist film 38 transferred with the patterns for the two trenches 32 and 33 having a distance between each other larger than the resolution limit for the exposure light and then the trenches 31, 34, and 35 are formed to the silicon nitride film 40 by using the second photoresist film 39 transferred with the patterns for the three trenches 31, 34, and 35 having a distance between each other larger than the resolution limit for the exposure light. This can form the patterns for the trenches 31 to 35 to the silicon nitride film 40 at a good accuracy.

Figure 23:
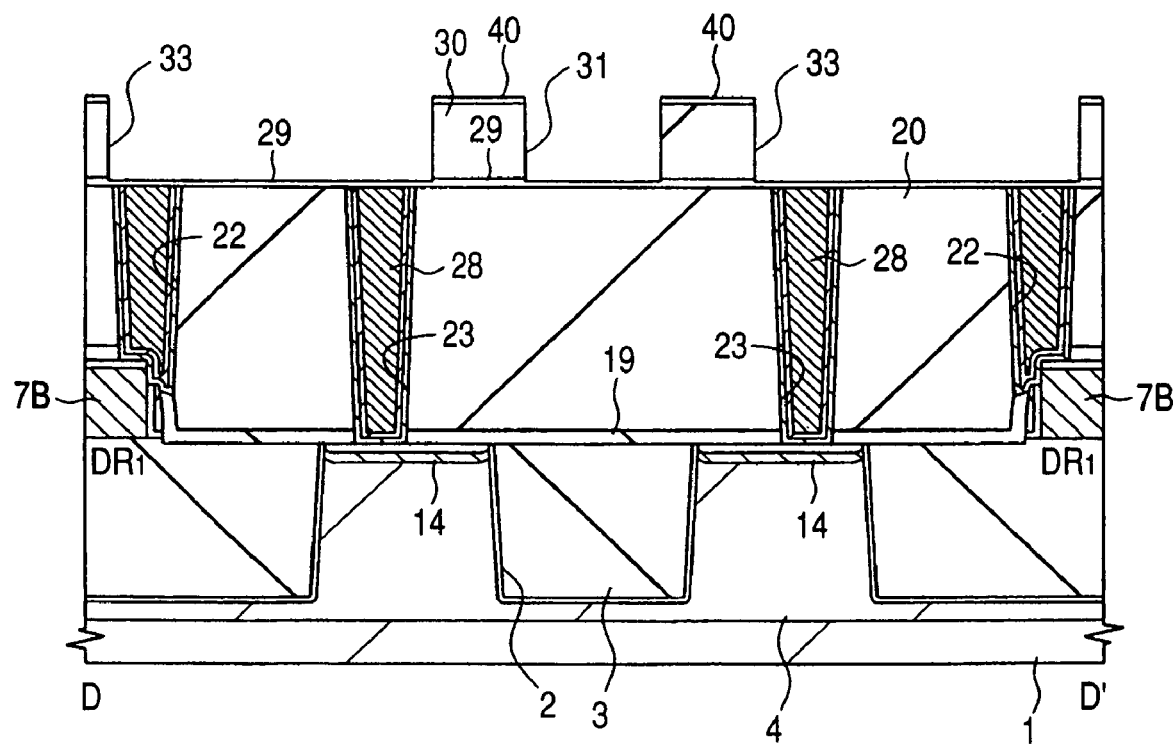
FIG. 23 is a cross sectional view of a main portion showing a method of manufacturing an SRAM representing the preferred embodiment according to the invention.

Then, after removing the photoresist film 39, the silicon oxide film 30 is dry etched by using the silicon nitride film 40 as a mask, as shown in FIG. 23, thereby forming trenches 31, 33 and not illustrated trenches 32, 34 and 35 in the silicon oxide film 30. In this case, etching is stopped at a stage where the surface of the underlying silicon nitride film 29 is exposed, so that the silicon oxide film 20 below the trenches 31 to 35 is not etched.

Figure 24:
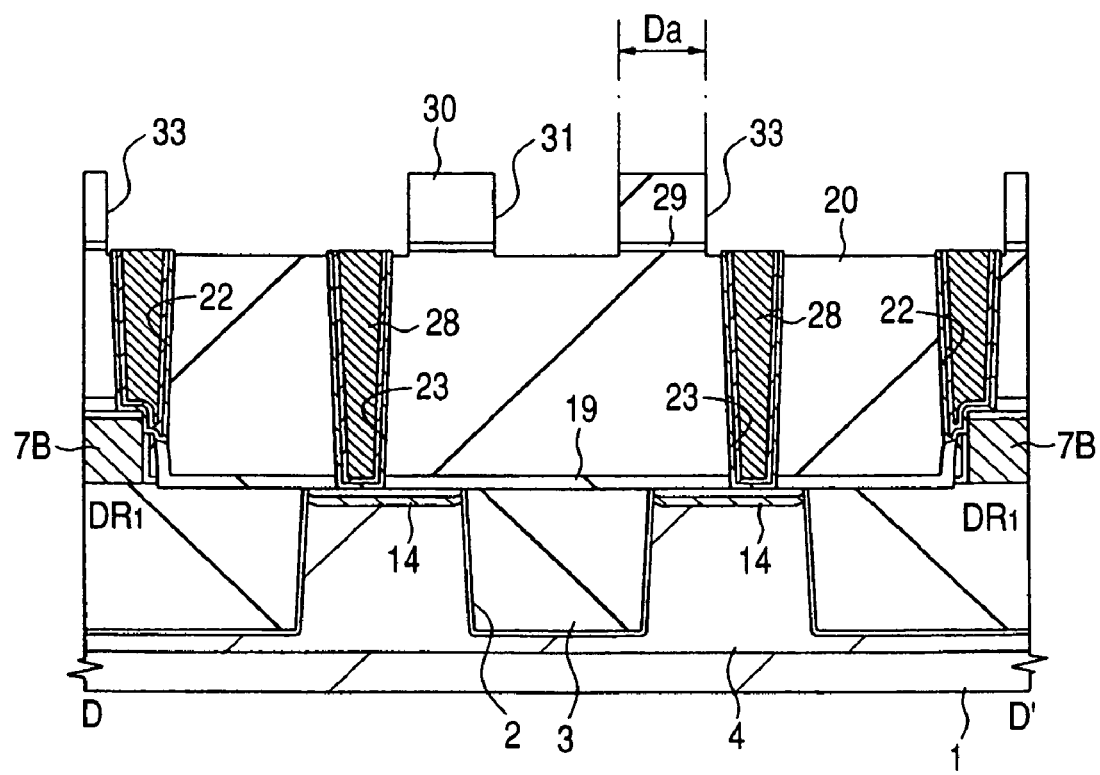
FIG. 24 is a cross sectional view of a main portion showing a method of manufacturing an SRAM representing the preferred embodiment according to the invention.

Then, as shown in FIG. 24, the silicon nitride film 40 left on the silicon oxide film 30 outside the trenches 31 to 35 and the silicon nitride film 29 exposed to the bottom of the trenches 31 to 35 are etched simultaneously, to complete the trenches 31 to 35.

The method of forming the trenches 31 to 35 described above has an advantage capable of transferring the patterns for the trenches 31, 34, and 35 at a high accuracy to the second photoresist film 39 since the underlying step (step between the surface of the silicon nitride film 40 and the surface of the silicon oxide film 30) is small upon forming the second photoresist film 39 over the silicon nitride film 40. On the other hand, in the method of forming the trenches 31 to 35 shown in FIG. 16 to FIG. 19, since the underlying step (step between the surface of the silicon oxide film 30 and the surface of the silicon oxide film 20) is larger upon exposing the second photoresist film 39 to transfer the patterns of the trenches 31, 34, and 35 (refer to FIG. 19), the accuracy for transferring the patterns for the trenches 31, 34, and 35 is somewhat lowered compared with the second method.

Figure 25:
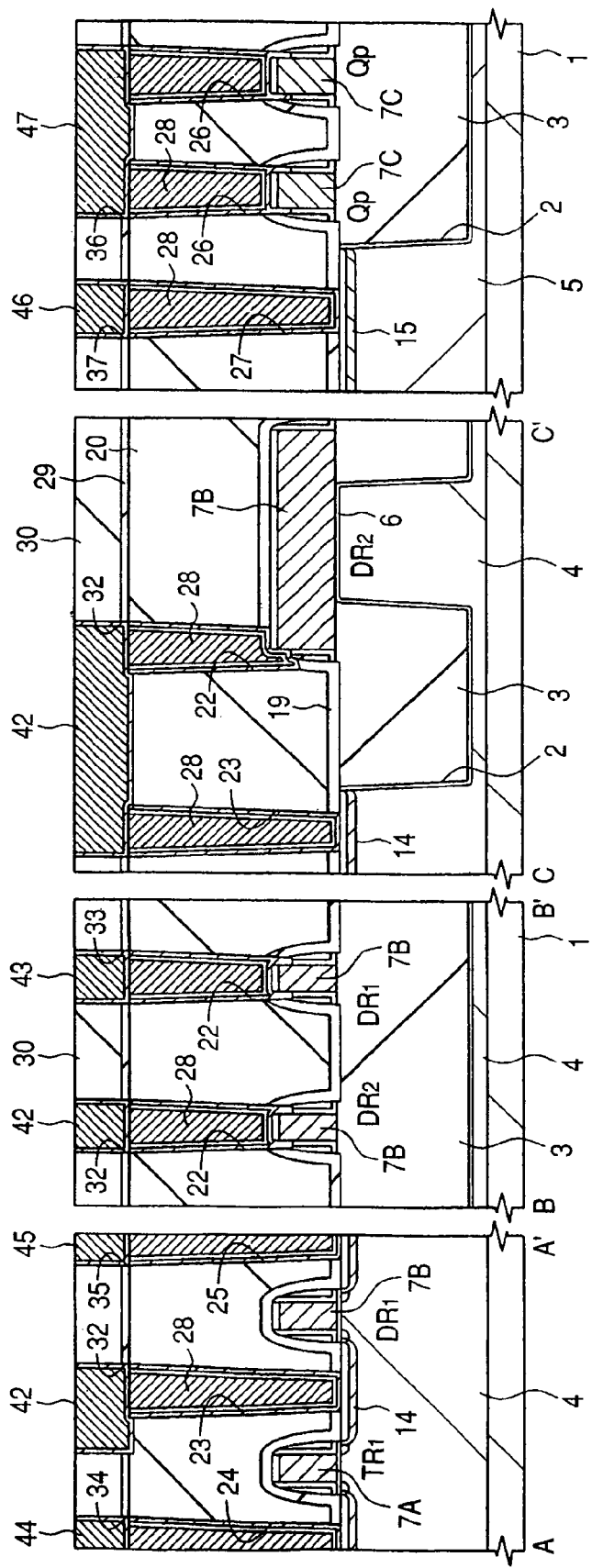
FIG. 25 is a cross sectional view of a main portion showing a method of manufacturing an SRAM representing the preferred embodiment according to the invention.

Then, as shown in FIG. 25, intermediate conductive layers 41 to 45 are formed respectively inside the trenches 31 to 35 formed in the memory array and first layer interconnections 46 and 47 are formed to the inside of the trenches 36 and 37 formed in the peripheral circuit region respectively. The intermediate conductive layers 41 to 45 and the first layer interconnections 46 and 47 are formed, for example, by depositing a TiN film over the silicon oxide film 30 including the inside of the trenches 31 to 37 by a sputtering method, successively depositing a W film as a metal film by a CVD process and then removing the W film and the TiN film outside the trenches 31 to 37 by a chemical mechanical polishing method.

Figure 26:
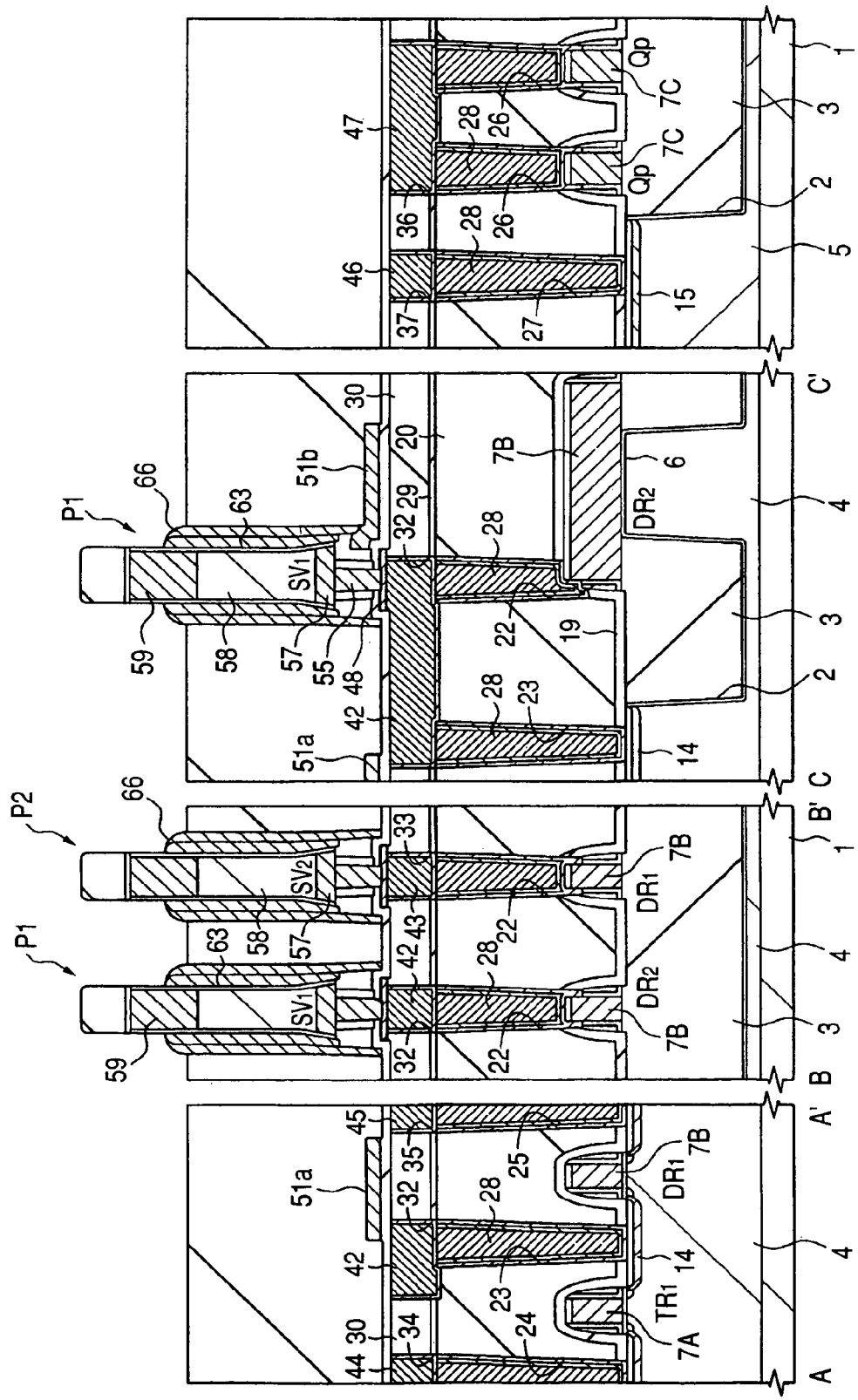
FIG. 26 is a cross sectional view of a main portion showing a method of manufacturing an SRAM representing the preferred embodiment according to the invention.

Then, as shown in FIG. 26, a vertical MISFET ($SV_1$) is formed over one end of the gate electrode 7B for the driving MISFET ($DR_2$) and a vertical MISFET ($SV_2$) is formed over one end of the gate electrode 7B for the driving MISFET ($DR_1$).

The vertical MISFET ($SV_1$) comprises a square columnar stack ($P_1$) formed by stacking a lower semiconductor layer (drain) 57, an intermediate semiconductor layer 58, and an upper semiconductor layer (source) 59, and a gate electrode 66 formed on the side wall of the stack ($P_1$) by way of a gate insulating film 63. The lower semiconductor layer (drain) 57 of the vertical MISFET ($SV_1$) is connected with the intermediate conductive layer 42 by way of a plug 55 and a barrier layer 48 formed therebelow and, further, it is electrically connected by way of the intermediate conductive layer 42 and plugs 28 and 28 therebelow to one of the source and the drain of the transfer MISFET ($TR_1$), the $n^+$-semiconductor region 14 as the drain of the driving MISFET ($DR_1$), and the gate electrode 7B of the driving MISFET ($DR_2$).

The vertical MISFET ($SV_2$) comprises a square columnar stack ($P_2$) formed by stacking a lower semiconductor layer (drain) 57, an intermediate semiconductor layer 58, and an upper semiconductor layer (source) 59, and a gate electrode 66 formed on the side wall of the stack ($P_2$) by way of a gate insulating film 63. The lower semiconductor layer (drain) 57 of the vertical MISFET ($SV_2$) is connected with the intermediate conductive layer 43 by way of a plug 55 and a barrier layer 48 formed therebelow and, further, it is electrically connected by way of the intermediate conductive layer 43 and plugs 28 and 28 therebelow to one of the source and the drain of the transfer MISFET ($TR_2$), the $n^+$-semiconductor region 14 as the source of the driving MISFET ($DR_2$), and the gate electrode 7B of the driving MISFET ($DR_1$).

In the vertical MISFET ($SV_1, SV_2$), the lower semiconductor layer 57 constitutes the drain, the intermediate semiconductor layer 58 constitutes the substrate (channel region), and the upper semiconductor layer 59 constitutes the source. Each of the lower semiconductor layer 57, the intermediate semiconductor layer 58, and the upper semiconductor layer 59 is constituted with a silicon film, the lower semiconductor layer 57 and the upper semiconductor layer 59 are p-doped and constituted with a p-silicon film. That is, the vertical MISFET ($SV_1, SV_2$) are constituted each with a p-channel type MISFET formed with the silicon film.

Figure 27:
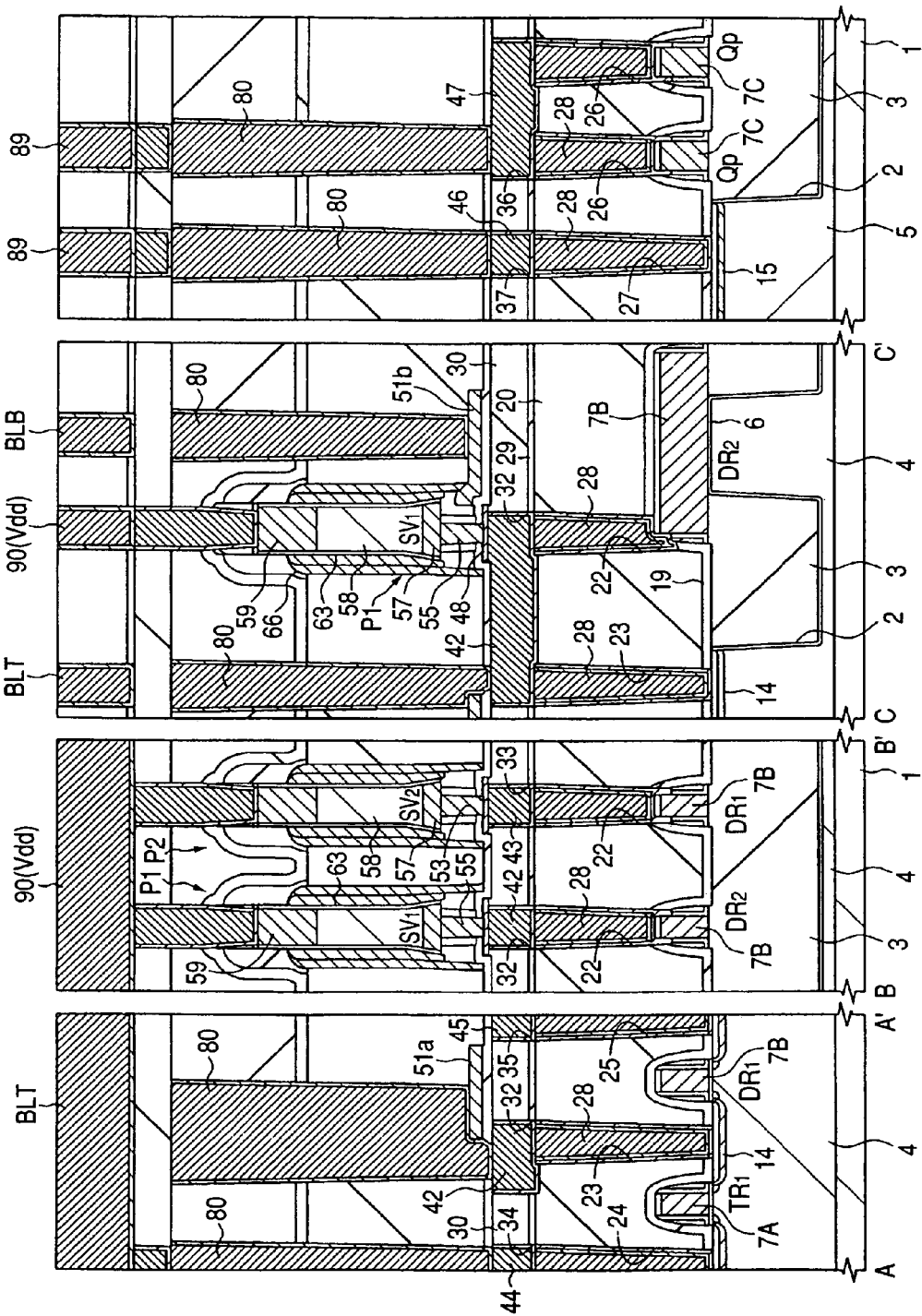
FIG. 27 is a cross sectional view of a main portion showing a method of manufacturing an SRAM representing the preferred embodiment according to the invention.

Then, as shown in FIG. 27, a plug 80, a power supply voltage line (Vdd) 90, complementary data lines (BLT, BLB) and a second layer interconnections 89 in the peripheral circuit are formed over the vertical MISFETs ($SV_1, SV_2$). The power supply voltage line (Vdd) 90, the complementary data lines (BLT, BLB), and the second layer interconnection 89 are each constituted with a metal film mainly comprising copper (Cu).

The gate electrode 66 for the vertical MISFET ($SV_1$) is electrically connected by way of the gate extension electrode 51$b$, the plug 80, the intermediate conductive layer 43, and the plugs 28, 28 therebelow with one of the source and the drain for the transfer MISFET ($TR_2$), the $n^+$-semiconductor region 14 as the drain for the driving MISFET ($DR_2$), and the gate electrode 7B for the driving MISFET ($DR_1$). The gate electrode 66 for the vertical MISFET ($SV_2$) is electrically connected by way of the gate extension electrode 51$a$, the plug 80, the intermediate conductive layer 42, and the plugs 28, 28 therebelow with one of the source and the drain for the transfer MISFET ($TR_1$), the $n^+$-semiconductor region 14 as the drain for the driving MISFET ($DR_2$), and the gate electrode 7B for the driving MISFET ($DR_2$).

The power supply voltage line (Vdd) 90 is electrically connected with the upper semiconductor layer (source) 59 of the vertical MISFET ($SV_1$) and the upper semiconductor layer (source) 59 for the vertical MISFET ($SV_2$).

The complementary data line BLT is electrically connected with the other of the source and the drain ($n^+$-semiconductor region 14) of the transfer MISFET ($TR_1$) and the complementary data line (BLB) is electrically connected with the other of the source and the drain ($n^+$-semiconductor region 14) of the transfer MISFET ($TR_2$).

Not illustrated word line (WL) and reference voltage line (Vss) are formed over the power supply voltage line (Vdd) 90 and the complementary data lines (BLT, BLB). The word line (WL) is electrically connected with the gate electrode 7A for the transfer MISFETs ($TR_1, TR_2$) and the reference voltage line (Vss) is electrically connected with the $n^+$-semiconductor region (source) 14 for the driving MISFETs ($DR_1, DR_2$). The word line (WL) and the reference voltage line (Vss) are constituted each, for example, with a metal film mainly comprising copper (Cu).

By the steps described so far, a memory cell (MC) constituted with the two transfer MISFETs ($TR_1, TR_2$), two driving MISFETs ($DR_1, DR_2$), and two vertical MISFETs ($SV_1, SV_2$) is substantially completed. The structure and the manufacturing method for the memory cell (MC) are described specifically in Japanese Patent Application No. 2002-224254.

As described above, in this embodiment, upon forming the trenches 31 to 35 buried with the intermediate conductive layers 41 to 45 for connecting the transfer MISFETs ($TR_1, TR_2$) and the driving MISFETs ($DR_1, DR_2$), and the vertical MISFETs ($SV_1, SV_2$) formed thereover, the trenches 32 and 33, and the trenches 31, 34, and 35 are formed separately by twice etching using the first and the second photoresist films 38 and 39 as the masks.

With the constitution described above, since all the trenches 31 to 35 can be formed at a good accuracy even in a case where the shortest distance (Da) between the trench 31 and the trench 32 or 33, and the shortest distance (Db) between the trench 32, 33, and the trench 34 are made smaller than the resolution limit for the exposure light, it is possible to reduce the distance between each of the trenches 31 to 35 disposed in one identical memory cell, and the memory cell size of the SRAM can be reduced. Further, this can also increase the capacity of the SRAM or reduce the chip size of the SRAM.

According to this embodiment, the memory cell size of the SRAM can be reduced without using an expensive phase shift mask. Further, combination of the technique disclosed in this embodiment with the phase shift technique enables further reduction of the memory cell size.

Preferred Embodiment 2

This embodiment is applied to a method of forming plural interconnections each at a distance smaller than the resolution limit for the exposure lights in one identical interconnection layer.

Figure 28:
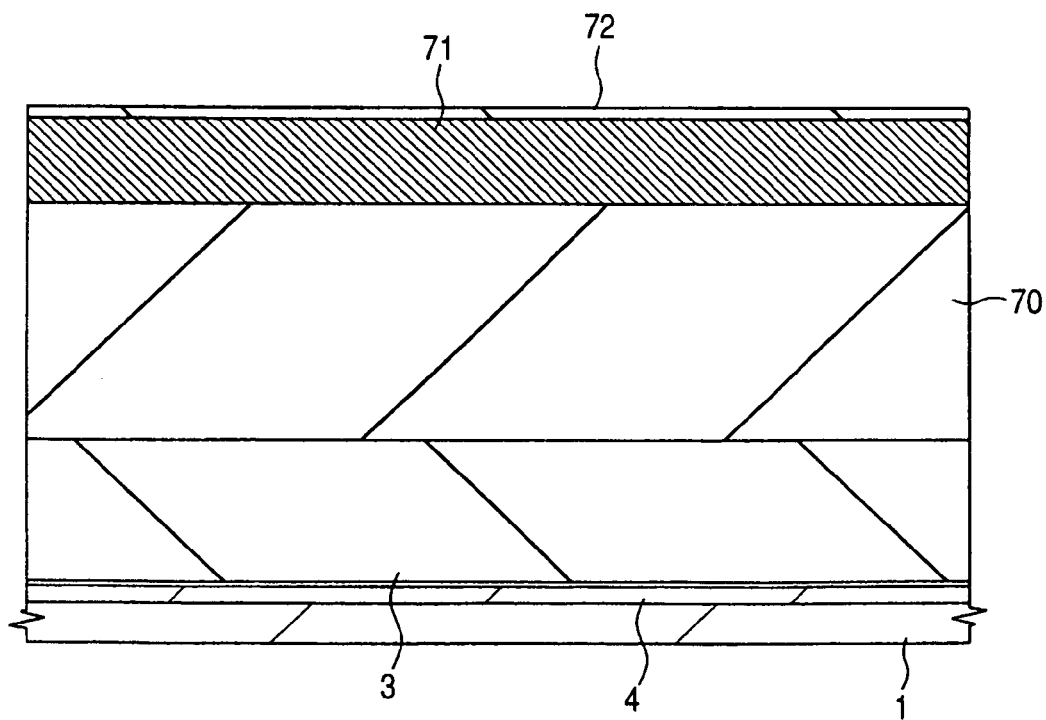
FIG. 28 is a cross sectional view of a main portion showing a method of manufacturing an SRAM representing a second preferred embodiment according to the invention.

As shown in FIG. 28, after forming a silicon oxide film 70 over a substrate 1, a W film 71 is deposited over the silicon oxide film 70 by a sputtering method and, successively, a silicon nitride film 72 is deposited over the W film 71. The W film 71 as the interconnection material may be replaced with another metal film such as an Al-alloy film. Further, the silicon nitride film 72 is used as a hard mask upon etching the interconnection material in the underlying layer thereof.

Figure 29:
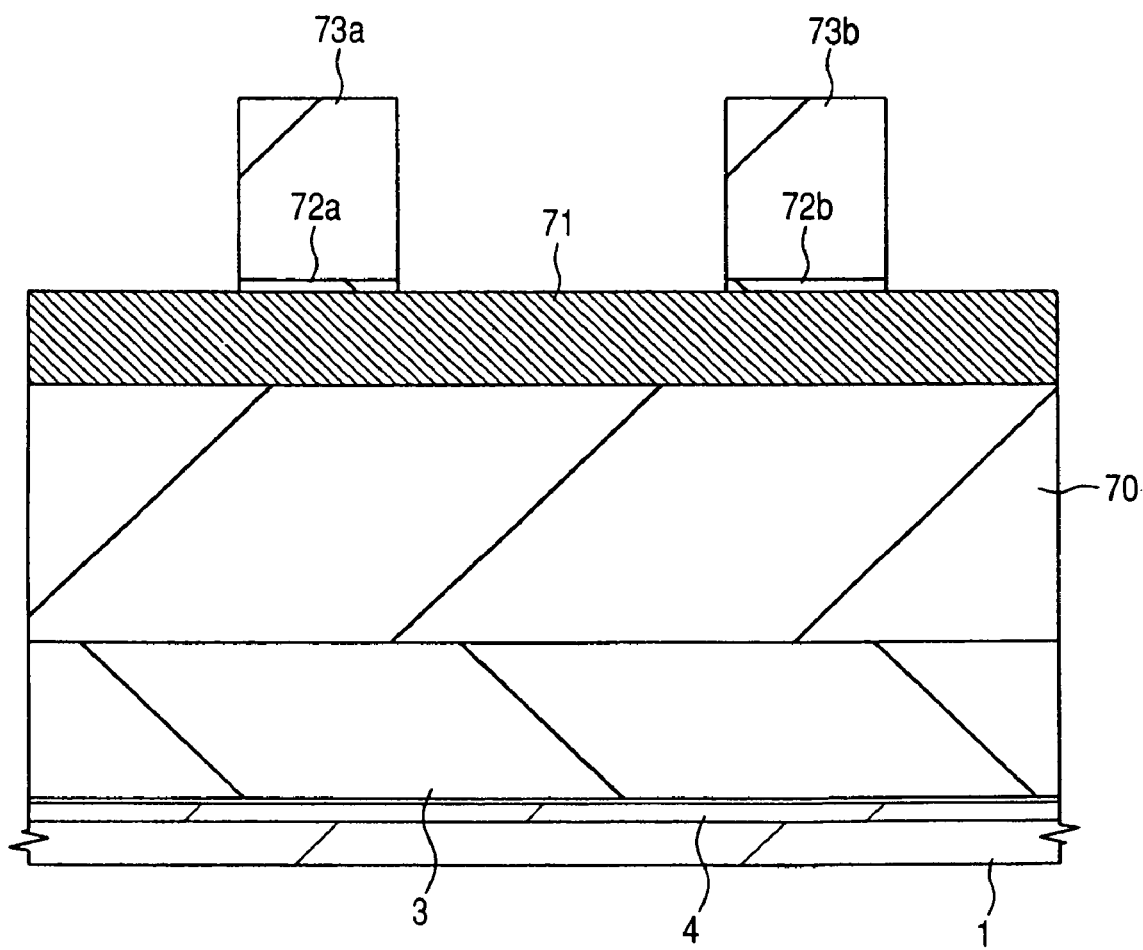
FIG. 29 is a cross sectional view of a main portion showing a method of manufacturing an SRAM representing the second preferred embodiment according to the invention.

Then, as shown in FIG. 29, first photoresist films 73$a$ and 73$b$ are formed over the silicon nitride film 72, and the silicon nitride film 72 is dry etched by using the photoresist films 73$a$ and 73$b$ as a mask thereby forming two hard masks 72$a$ and 72$b$ having a shape identical with the interconnections. In this case, the two hard marks 72$a$ and 72$b$ can be formed at a good accuracy by making the distance between the two photoresist films 73$a$ and 73$b$ as shown in the drawing larger than the resolution limit for the exposure light.

Figure 30:
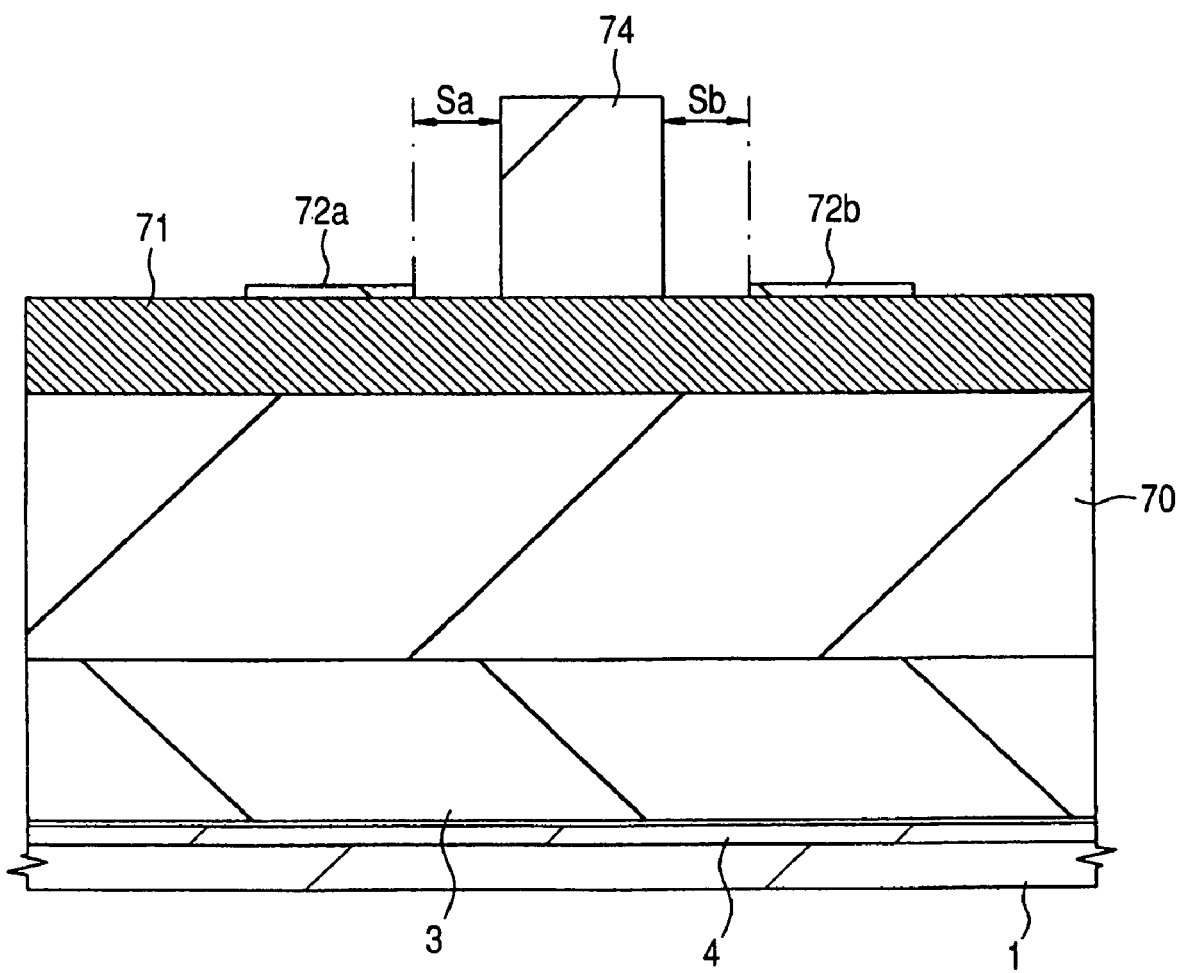
FIG. 30 is a cross sectional view of a main portion showing a method of manufacturing an SRAM representing the second preferred embodiment according to the invention.

Then, after removing the photoresist films 73$a$ and 73$b$, as shown in FIG. 30, a second photoresist film 74 having the same shape as that of interconnections is formed between the two hard masks 72$a$ and 72$b$ remaining on the W film 71. In this case, the distance (Sa) between the second photoresist film 74 and the hard mask 72$a$ and the distance (Sb) between the second photoresist film 74 and the hard mask 72$b$ is smaller than the resolution limit for the exposure light.

Figure 31:
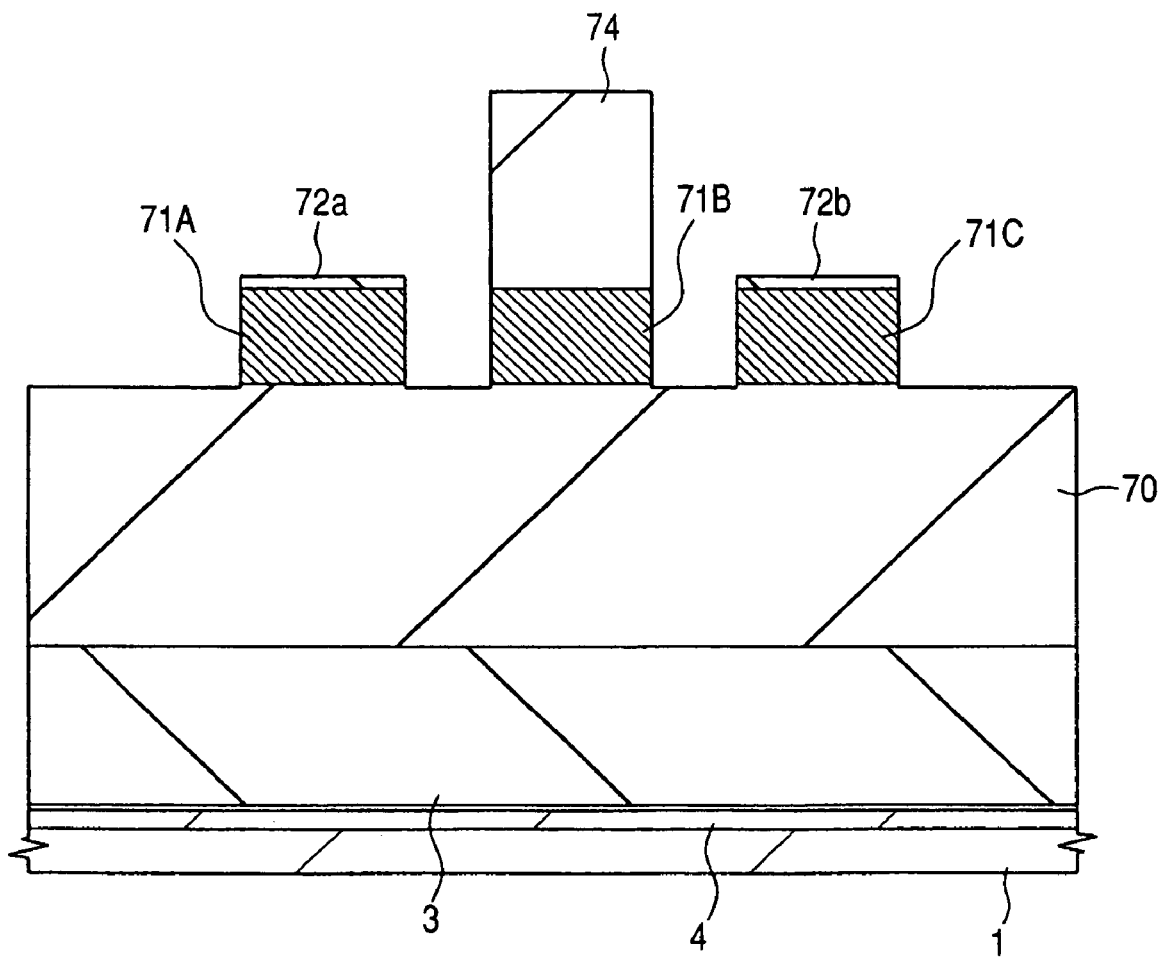
FIG. 31 is a cross sectional view of a main portion showing a method of manufacturing an SRAM representing the second preferred embodiment according to the invention.

Then, interconnections 71A, 71B, and 71C are formed by dry etching the W film 71 using the hard masks 72$a$ and 72$b$ and the photoresist film 74 as a mask as shown in FIG. 31.

According to the method described above, plural interconnections 71A, 71B and 71C each having a distance (Sa, Sb) smaller than the resolution limit for the exposure light can be formed at a good accuracy.

Figure 32:
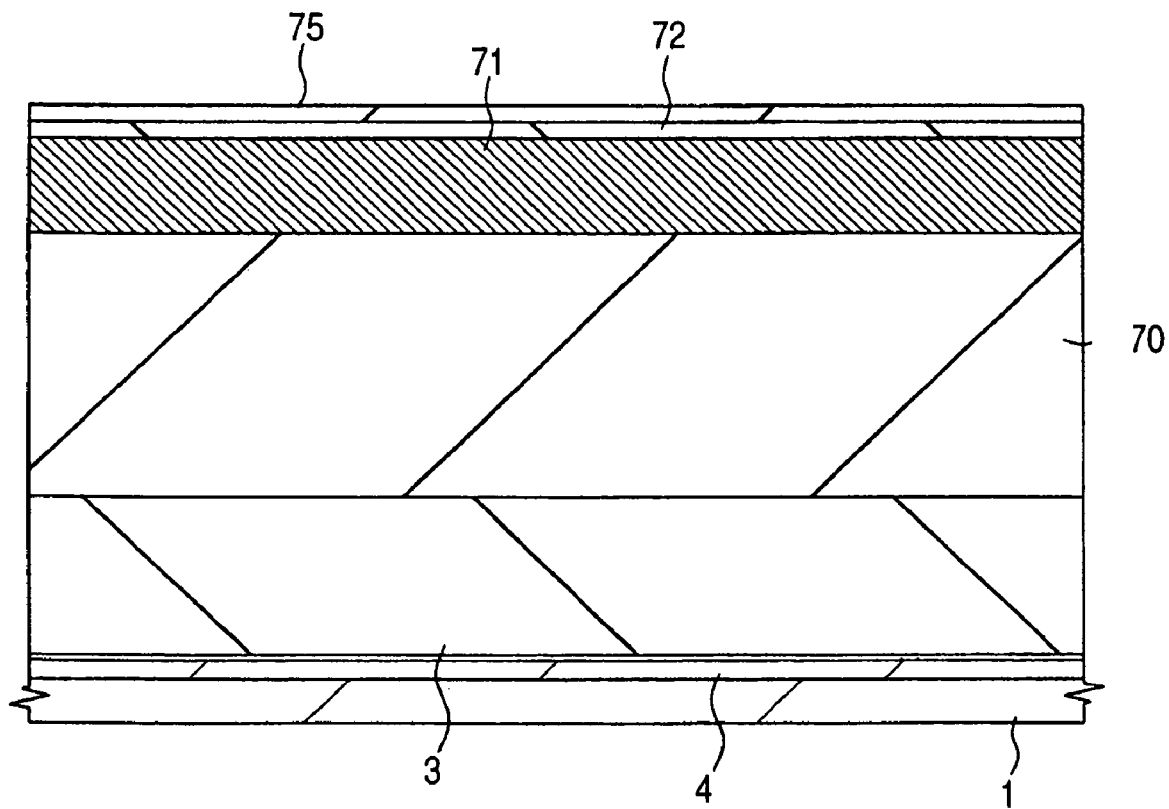
FIG. 32 is a cross sectional view of a main portion showing a method of manufacturing an SRAM representing the second preferred embodiment according to the invention.

The interconnections 71A, 71B, and 71C can also be formed by the following method. At first, as shown in FIG. 32, a W film 71 is deposited over a silicon oxide film 70, a silicon nitride film 72 is deposited successively over the W film 71 and then a silicon oxide film 75 is deposited over the silicon nitride film 72. The silicon nitride film 72 and the silicon oxide film 75 are used as a hard mask upon etching the interconnection material (W film 71) in the underlayer.

Figure 33:
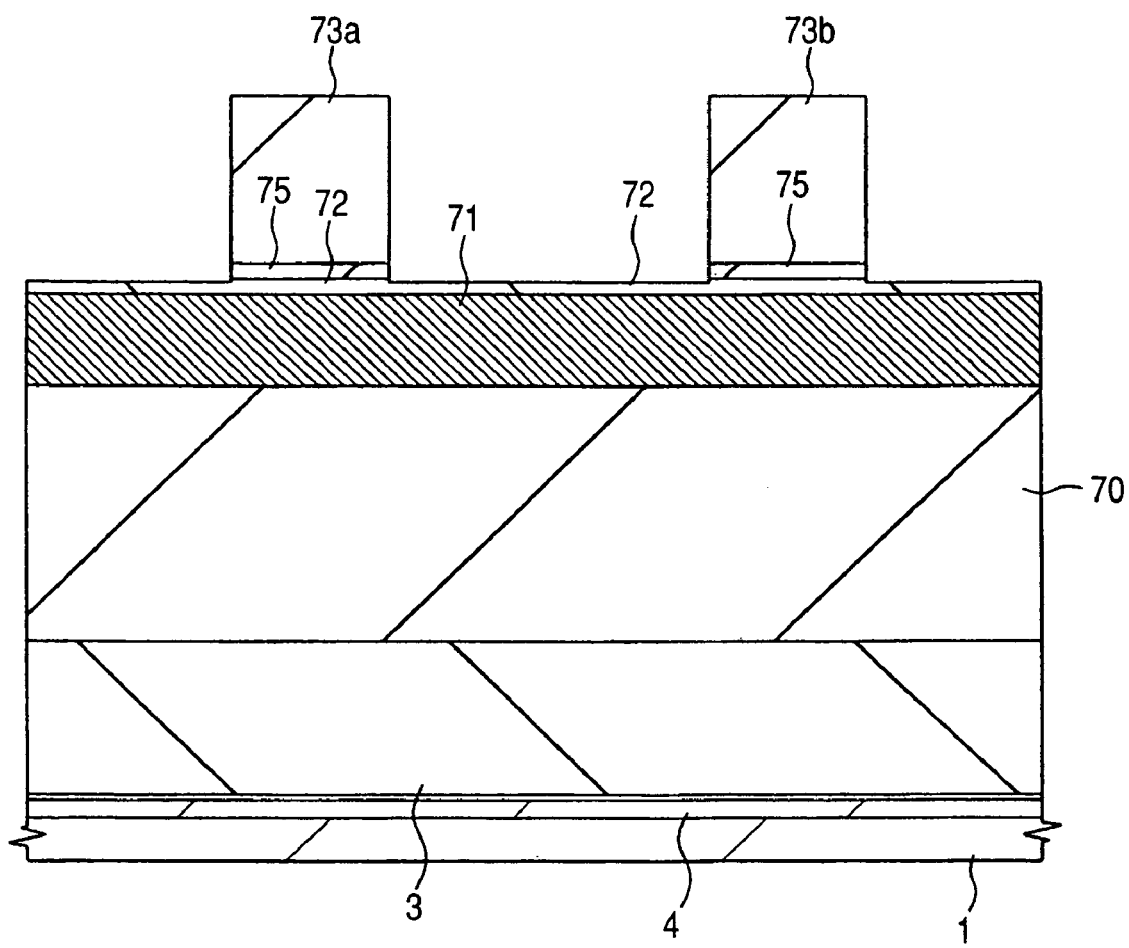
FIG. 33 is a cross sectional view of a main portion showing a method of manufacturing an SRAM representing the second preferred embodiment according to the invention.

Then, as shown in FIG. 33, first photoresist films 73a and 73b having the same shape as that of the interconnections are formed over the silicon oxide film 75, and the silicon oxide film 75 is dry etched using the photoresist films 73a and 73b as a mask. The distance between the two photoresist films 73a and 73b is larger than the resolution limit for the exposure light.

Figure 34:
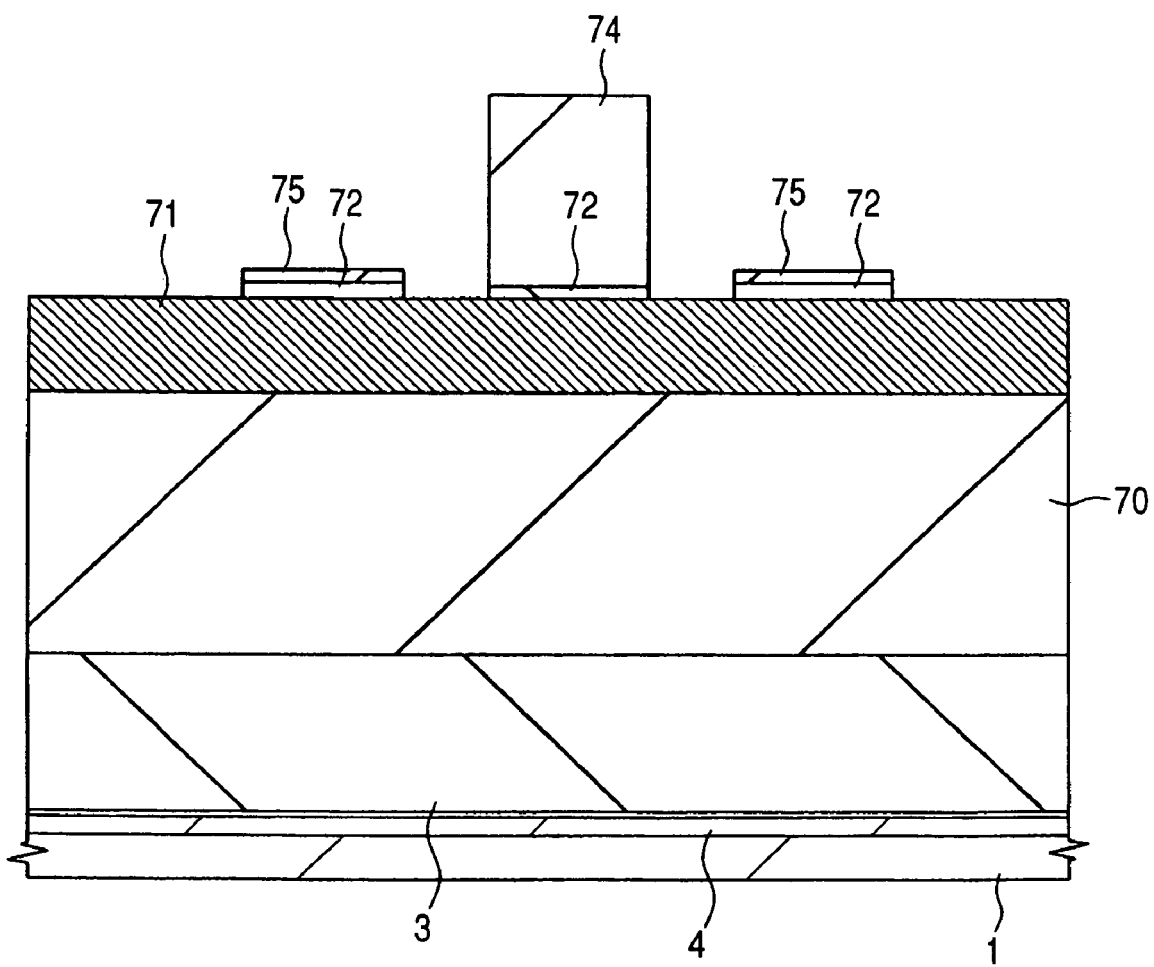
FIG. 34 is a cross sectional view of a main portion showing a method of manufacturing an SRAM representing the second preferred embodiment according to the invention.

Then, after removing the photoresist films 73a and 73b, as shown in FIG. 34, a second photoresist film 74 having the same shape as that of the interconnections is formed between the two silicon nitride films 72 patterned to have the same shape as that of the interconnections and the silicon nitride film 72 is patterned to have a shape identical with that of the interconnections by dry etching using the photoresist film 74 and the silicon oxide film 75 as a mask. In this case, the distance between the second photoresist film 74 and the silicon oxide film 75 is smaller than the resolution limit for the exposure light.

Figure 35:
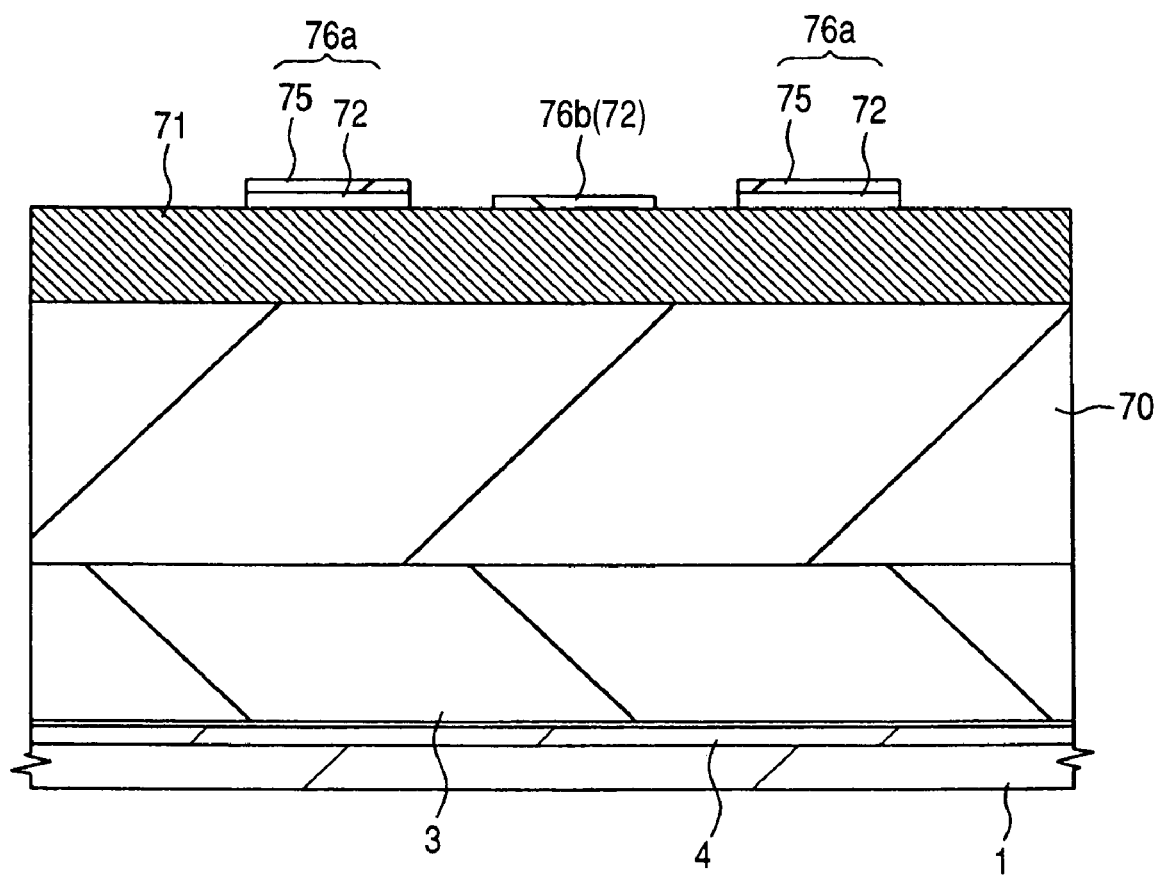
FIG. 35 is a cross sectional view of a main portion showing a method of manufacturing an SRAM representing the second preferred embodiment according to the invention.

Then, when the photoresist film 74 is removed, a first hard mask 76a comprising a stacked film of the silicon nitride film 72 and the silicon oxide film 75 and a second hard mask 76b comprising the silicon nitride film 72 are formed over the W film 71 as shown in FIG. 35.

Figure 36:
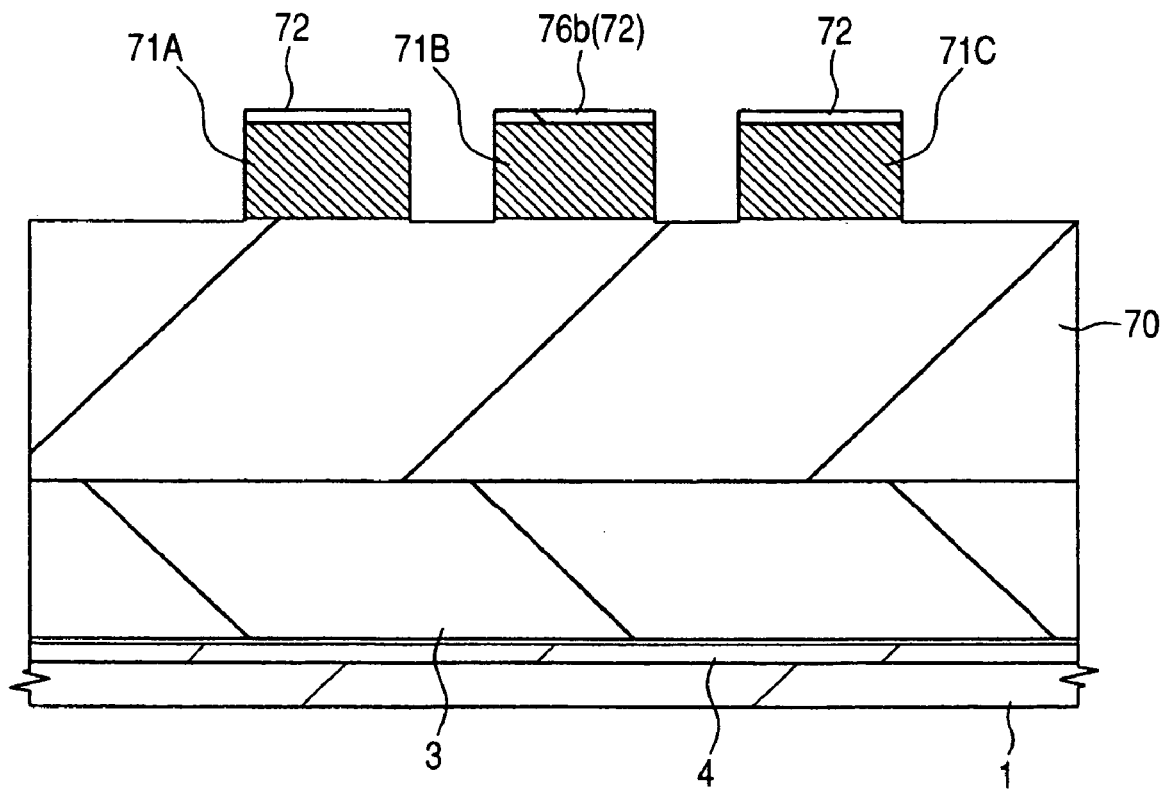
FIG. 36 is a cross sectional view of a main portion showing a method of manufacturing an SRAM representing the second preferred embodiment according to the invention.

Then, as shown in FIG. 36, the W film 71 is dry etched by using the hard masks 76a and 76b as the mask thereby forming plural interconnections 71A, 71B, and 71C having a distance between them smaller than the resolution limit for the exposure light. Further, upon dry etching the W film 71 or after dry etching the W film 71, only the silicon nitride film 72 can be left over each of the interconnections 71A, 71B, and 71C by etching the silicon oxide film 75 constituting a portion of the hard mask 76a. This can facilitate the operation, for example, of forming through holes reaching the surface of the interconnections 71A, 71B, and 71C by etching the interlayer insulation film over the interconnections 71A, 71B, and 71C in the subsequent step.

Preferred Embodiment 3

This embodiment is applied to a method of forming plural contact holes each at a distance smaller than the resolution limit for the exposure light to one identical insulating film.

Figure 37:
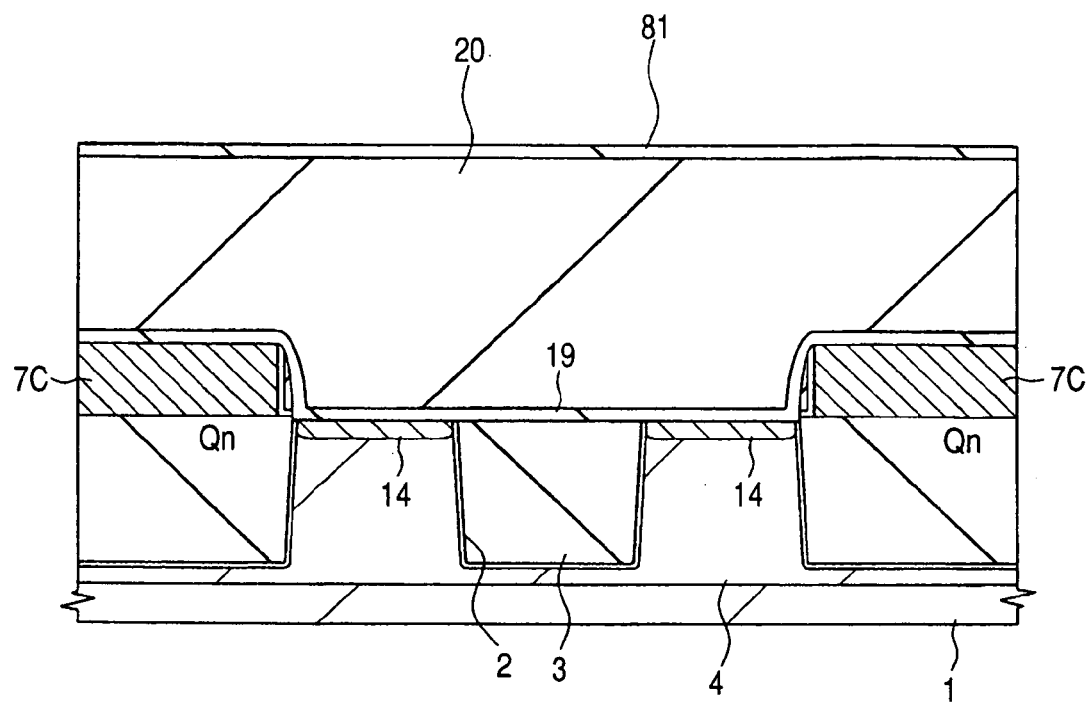
FIG. 37 is a cross sectional view of a main portion showing a method of manufacturing an SRAM representing a third preferred embodiment according to the invention.

At first, as shown in FIG. 37, after forming n-channel type MISFETs Qn including a gate electrode 7c and an n$^+$-semiconductor region 14 over a substrate 1, a silicon nitride film 19, a silicon oxide film 20, and a silicon nitride film 81 are deposited over the n-channel type MISFET Qn. The silicon nitride film 81 is used as a hard mask upon etching the silicon oxide film 20 in the lower layer thereof.

Figure 38:
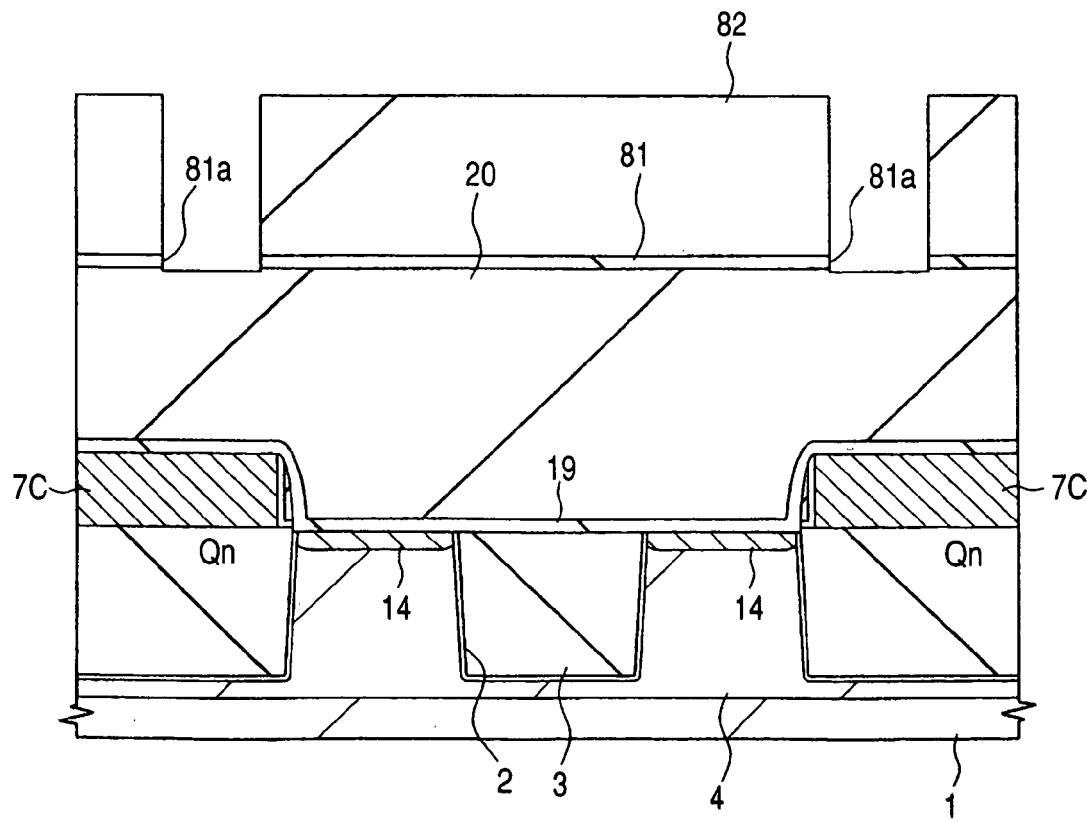
FIG. 38 is a cross sectional view of a main portion showing a method of manufacturing an SRAM representing the third preferred embodiment according to the invention.

Then, as shown in FIG. 38, a first photoresist film 82 is formed over the silicon nitride film 81, and the silicon nitride film 81 over the gate electrode 7C is dry etched by using the photoresist film 82 as the mask. Thus, a hole pattern 81a having the same shape as that of the contact hole is formed in the silicon nitride film 81 over the gate electrode 7C.

Figure 39:
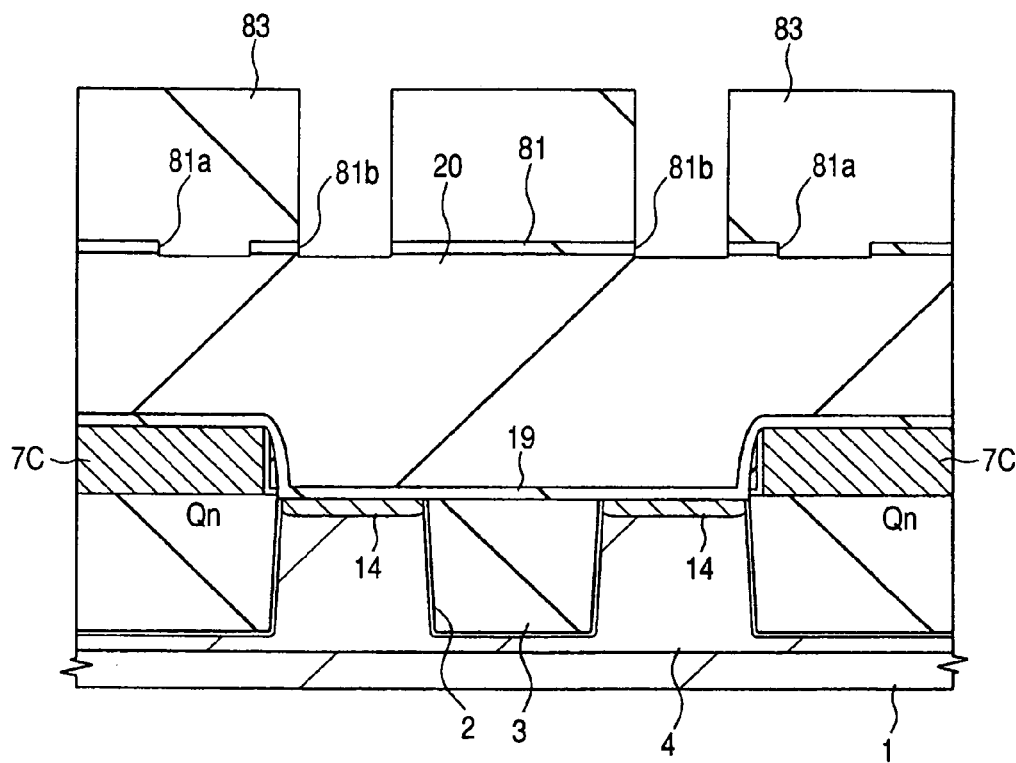
FIG. 39 is a cross sectional view of a main portion showing a method of manufacturing an SRAM as representing the third preferred embodiment according to the invention.

Then, after removing the photoresist film 82, a second photoresist film 83 is formed over the silicon nitride film 81 and the silicon nitride film 81 over the n$^+$-semiconductor region 14 is dry etched using the photoresist film 83 as a mask. Thus, a hole pattern 81b having the same shape as that of a contact hole is formed in the silicon nitride film 81 over the n$^+$-semiconductor region 14 as shown in FIG. 39.

Figure 40:
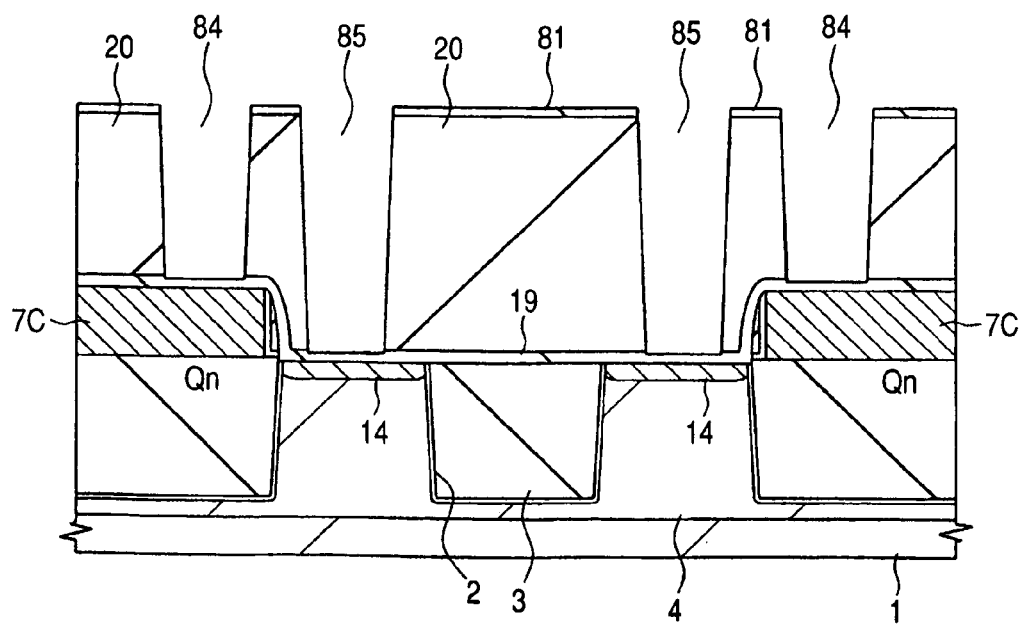
FIG. 40 is a cross sectional view of a main portion showing a method of manufacturing an SRAM representing the third preferred embodiment according to the invention.

Then, after removing the photoresist film 83, a contact hole 84 is formed in the silicon oxide film 20 over the gate electrode 7C, and a contact hole 85 is formed in the silicon oxide film 20 over the n$^+$-semiconductor region 14 by dry etching using the silicon nitride film 81 formed with the hole patterns 81a and 81b as a mask as shown in FIG. 40.

Figure 41:
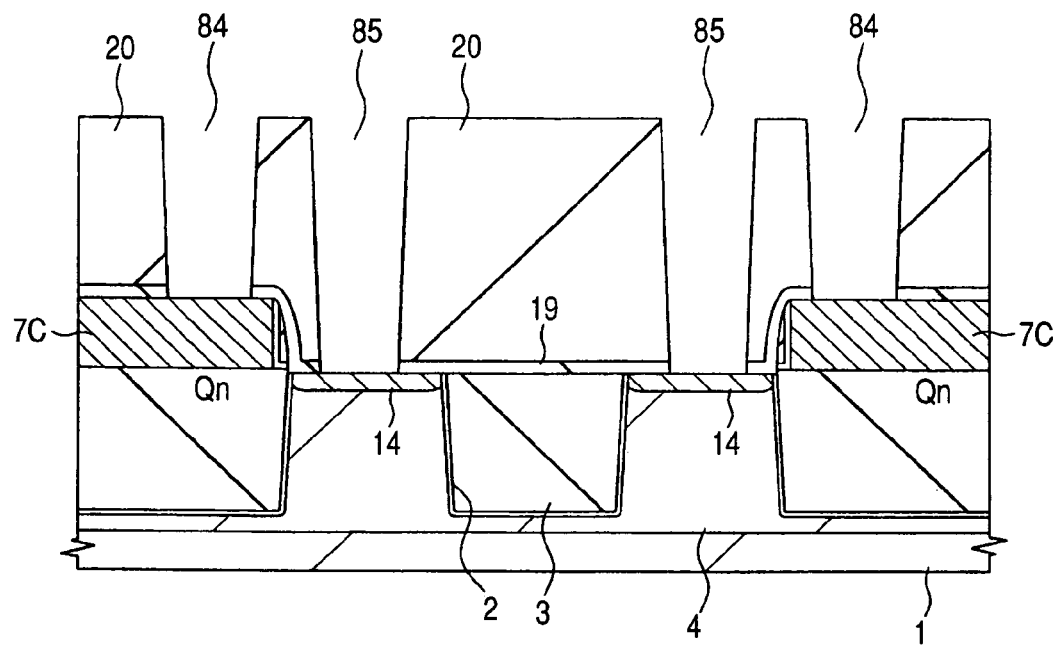
FIG. 41 is a cross sectional view of a main portion showing a method of manufacturing an SRAM representing the third preferred embodiment according to the invention.
Figure 42:
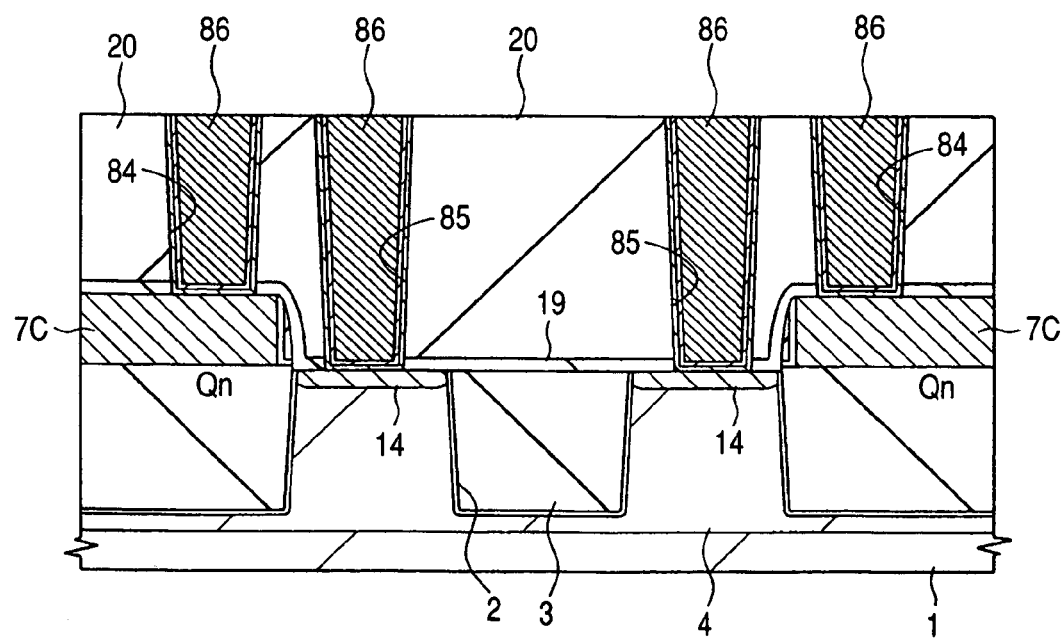
FIG. 42 is a cross sectional view of a main portion showing a method of manufacturing an SRAM representing the third preferred embodiment according to the invention.

Then, as shown in FIG. 41, the silicon nitride film 81 left on the silicon oxide film 20, and the silicon nitride film 19 exposed to the bottom of the contact holes 84 and 85 are etched simultaneously, to complete the contact holes 84 and 85. Then, as shown in FIG. 42, a plug 86 is formed inside the contact holes 84 and 85.

As described above, in this embodiment, in a case of forming the contact holes 84 and 85 in the silicon oxide film 20 using the silicon nitride film 81 formed with the hole patterns 81a and 81b as a mask, the hole pattern 81a and the hole pattern 81b are formed separately by twice etching using the first and the second photoresist films 82 and 83 as the mask.

Thus, since the distance between the hole pattern 81a and the hole pattern 81b can be decreased to be smaller than the resolution limit for the exposure light, the distance between the contact hole 84 over the gate electrode 7c and the contact hole 85 over the n$^+$-semiconductor region 14 can be decreased to be smaller than the resolution limit for the exposure light and the MISFET can be refined.

Preferred Embodiment 4

Figure 43:
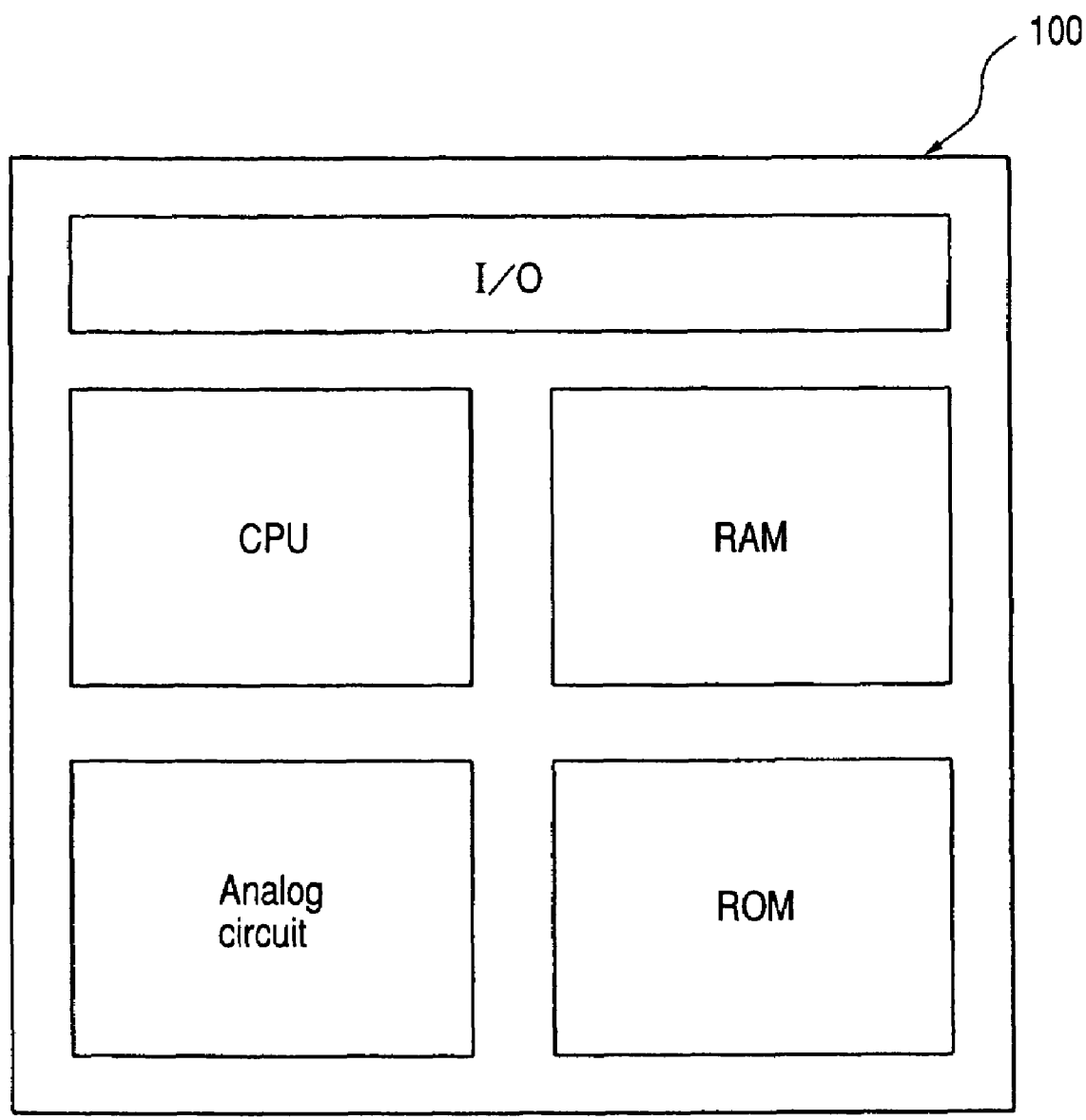
FIG. 43 is a schematic plan view showing a circuit block for a memory hybridized logic device representing a fourth preferred embodiment of the invention.

This embodiment is applied to a method of forming interconnections in a memory hybridized logic device in which a central processing unit (CPU), an analog circuit, an input/output circuit (I/O), and a memory circuit (RAM, ROM) are integrated on the main surface of a semiconductor chip 100 for example, as shown in FIG. 43.

Figure 44:
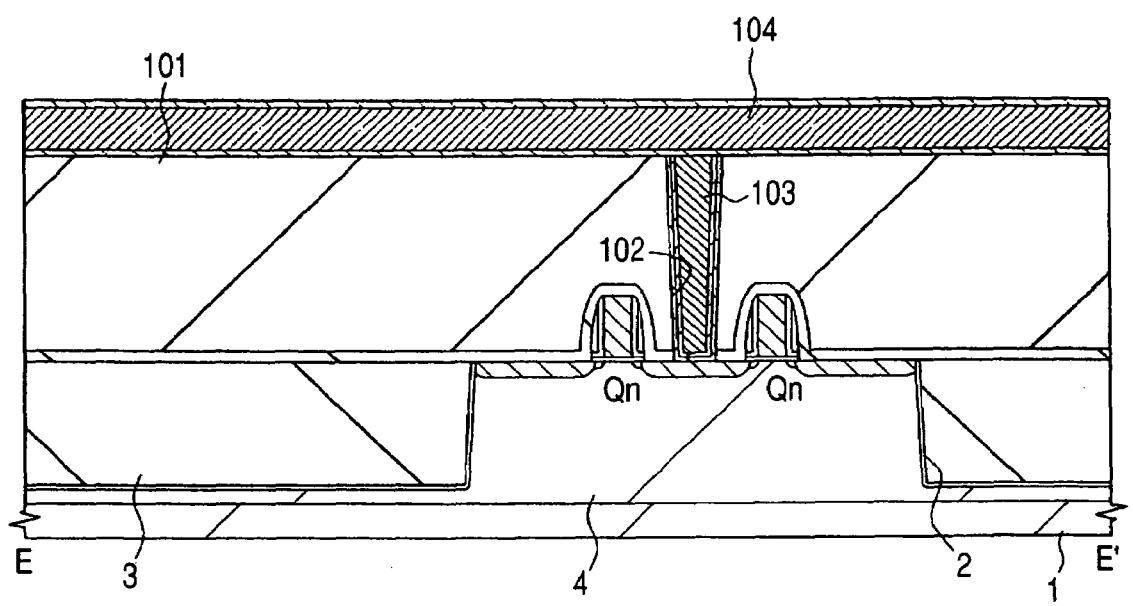
FIG. 44 is a cross sectional view of a main portion showing a method of forming interconnections representing the fourth embodiment of the invention.

At first, as shown in FIG. 44, an n-channel type MISFET Qn (and not illustrated p-channel type MISFET) is formed to a portion of a substrate 1 constituting a semiconductor chip 100 (for example, CPU forming region, memory circuit forming region, analog circuit forming region or input/output circuit forming region) and, successively, a contact hole 102 is formed in a silicon oxide film 101 as an insulating film for covering the MISFETs, a plug 103 as a conductive film is buried to the inside thereof, and then a conductive film 104 for the first layer interconnection is deposited over the silicon oxide film 101. The conductive layer 104 comprises, for example, a three layered film of a TiN film, an Al-alloy film and a TiN film deposited, for example, by a sputtering method.

Figure 45:
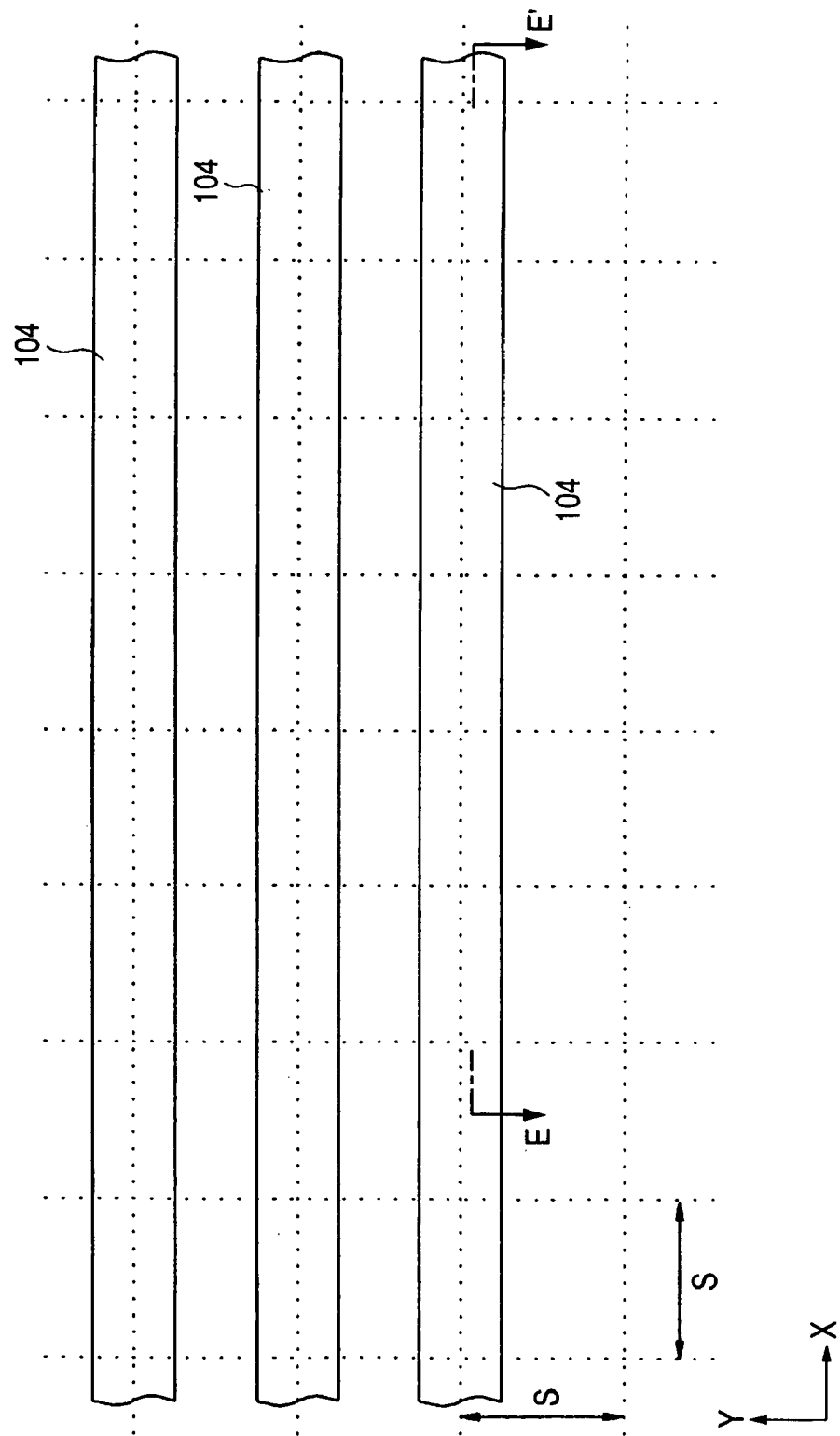
FIG. 45 is a plan view of a main portion showing a method of forming interconnections representing the fourth embodiment of the invention.
Figure 46:
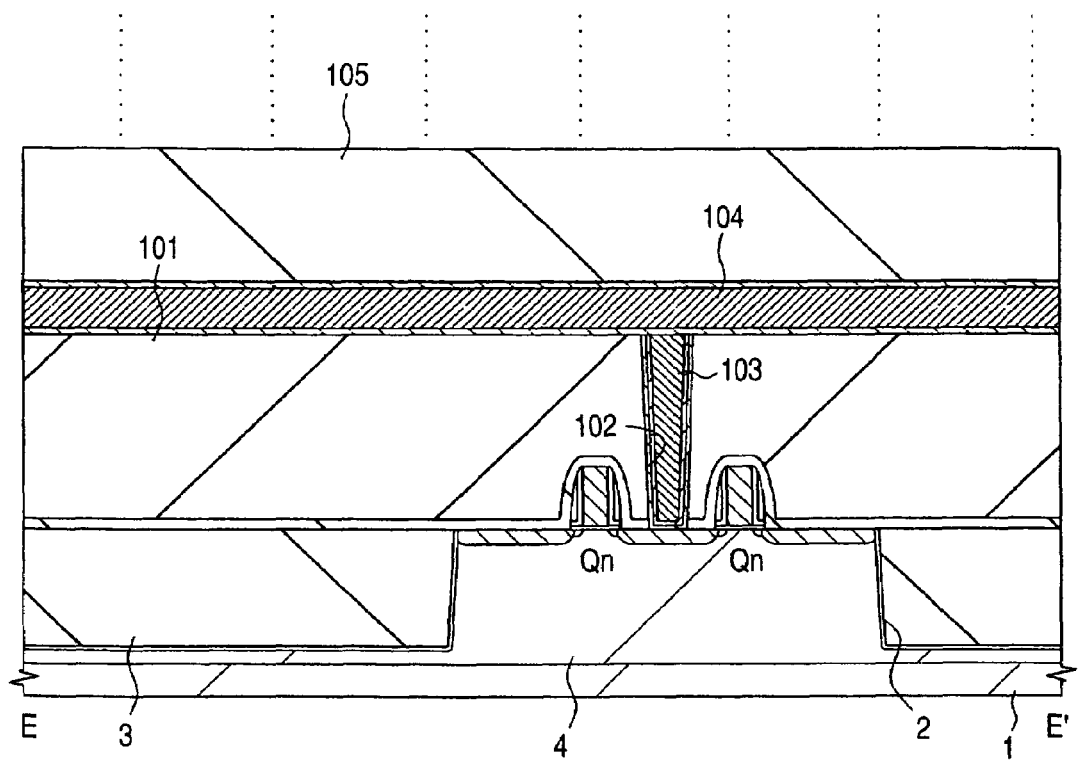
FIG. 46 is a cross sectional view taken along line E-E' in FIG. 45 showing a method of forming interconnections representing the fourth embodiment of the invention.

Then, as shown in FIG. 45 (plan view) and FIG. 46 (cross sectional view taken along line E-E' in FIG. 45), the conductive film 104 is patterned by dry etching using a first photoresist film 105 formed over the conductive film 104 as a mask. In this case, as shown in FIG. 45, the conductive film 104 is patterned such that a planar pattern thereof extends in a stripe-shape along a right-to-left direction (direction X) as seen in the drawing.

Lattice-like lines shown by broken lines in FIG. 45 show a pattern in which interconnections are disposed for easy understanding of the drawing. Broken lines extending in the right-to-left direction (direction X) shows channels in which the first layer interconnections are formed, and broken lines extending in the upward-to-downward direction (direction Y) show channels in which the second layer interconnections are formed, respectively. That is, the conductive film 104 is at first patterned along the extending direction of the first layer interconnections (channel direction). Although the invention is not restricted particularly, the distance S between the channels is equal with respect to both the direction X and the direction Y in this embodiment.

Figure 47:
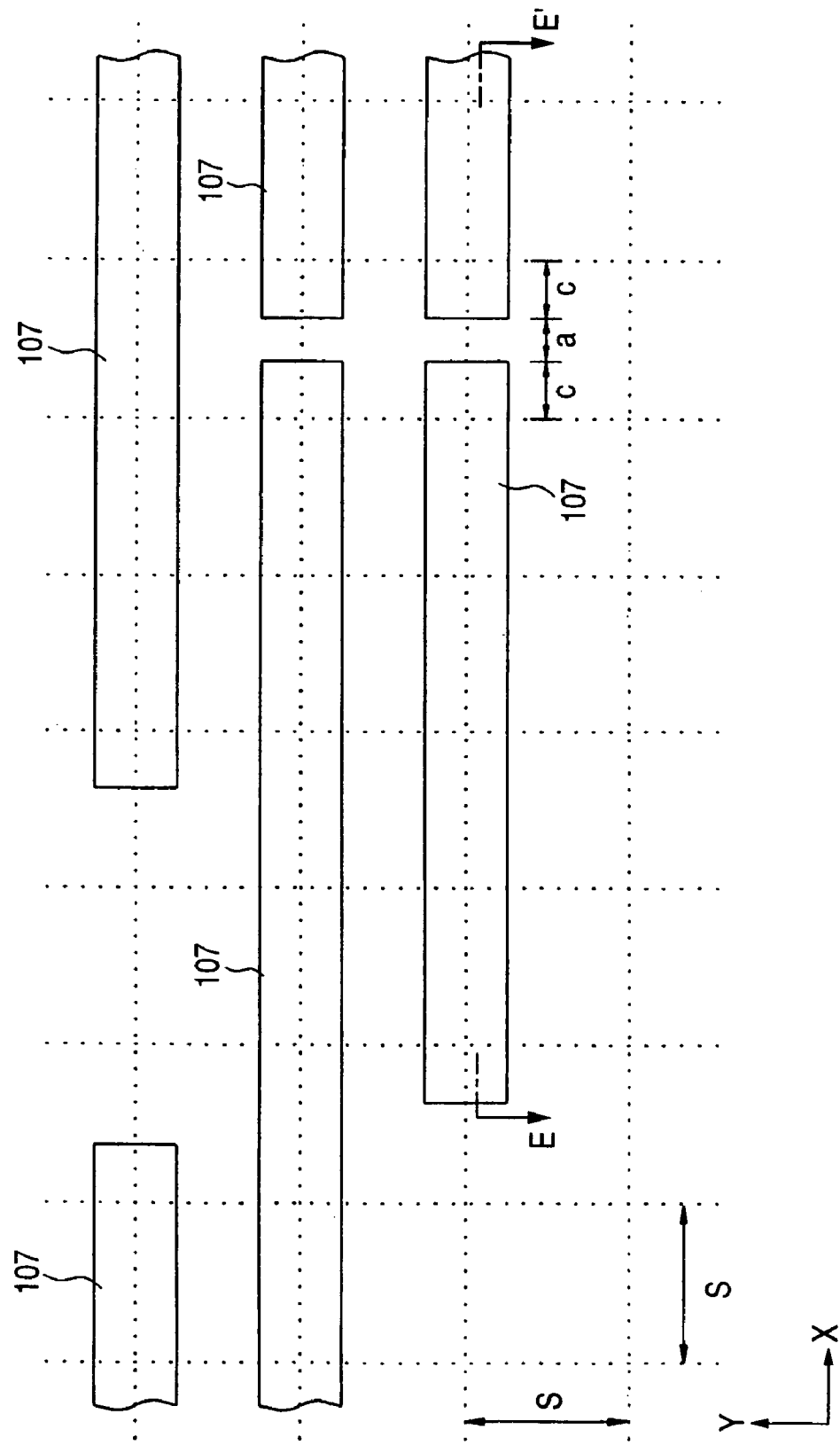
FIG. 47 is a plan view of a main portion showing a method of forming interconnections representing the fourth embodiment of the invention.
Figure 48:
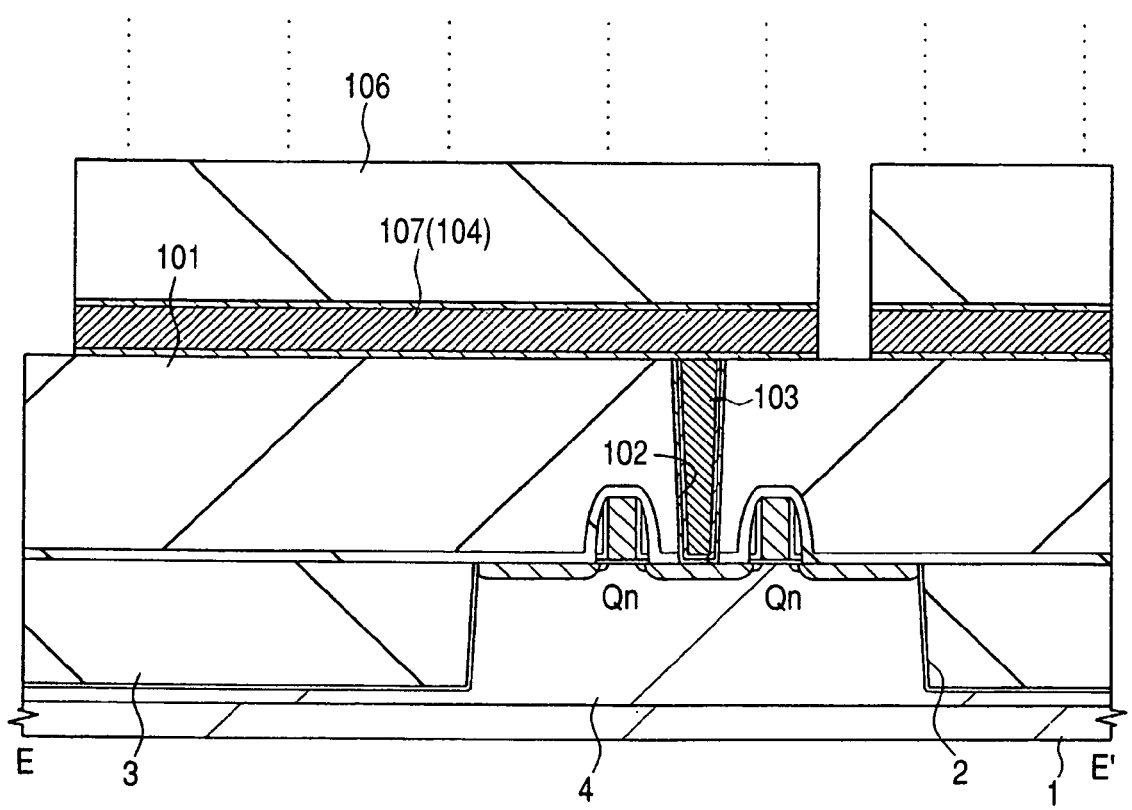
FIG. 48 is a cross sectional view of a main portion showing a method of forming interconnections representing the fourth embodiment of the invention.

Then, after removing the photoresist film 105, as shown in FIG. 47 and FIG. 48, the conductive film 104 is patterned by dry etching using, for example, the second photoresist film 106 as a mask. In this case, the conductive film 104 is patterned in the direction of the channel of the first layer interconnections (direction X) and in the direction perpendicular thereto (direction Y), to complete the first layer interconnections 107 comprising the conductive film 104. The first layer interconnections 107 can be formed also by patterning the conductive film 104 in the direction perpendicular to the channel direction (direction Y) and then patterning the film along the channel direction (direction X).

In the method of forming the first layer interconnections 107 described above, since the conductive film 104 is patterned by twice etching using two sheets of photomasks, the effect of interference between the exposure lights can be eliminated. That is, plural conductive films 104 are formed by using photolithographic steps several times by using plural sheets of photoresist masks. As a result, since the roundness on both ends of the first layer interconnections 107 is decreased, the amount of inward retraction for both ends of the first layer interconnections 107 can be decreased.

Thus, the width between the end of the first layer interconnections 107 and the channel (space=c, shown in FIG. 47) can be decreased in the channel direction (direction X) for the first layer interconnections. Accordingly, even in a case where the first layer interconnections 107 are disposed at the crossing point between adjacent channels, the width between the end of the first layer interconnection 107 and the channel (space=c, shown in FIG. 47) and the space between the first layer interconnections 107 and 107 (space=a, shown in FIG. 47) can be narrowed in the channel direction of the first layer interconnections (direction X), the distance S between the channels can be decreased in the channel direction (direction X) of the first layer interconnections to improve the interconnection density.

Figure 49:
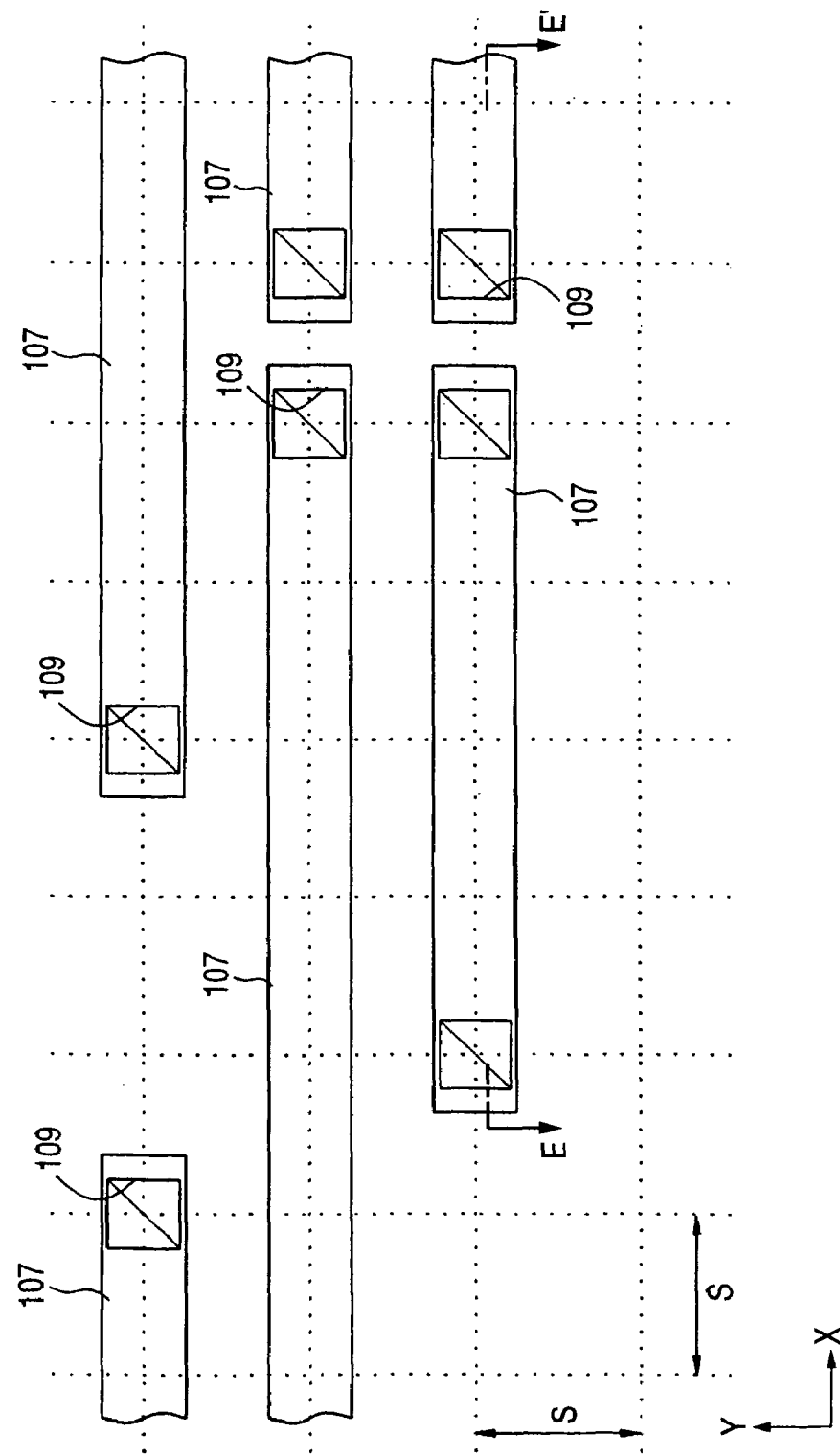
FIG. 49 is a plan view of a main portion showing a method of forming interconnections representing the fourth embodiment of the invention.
Figure 50:
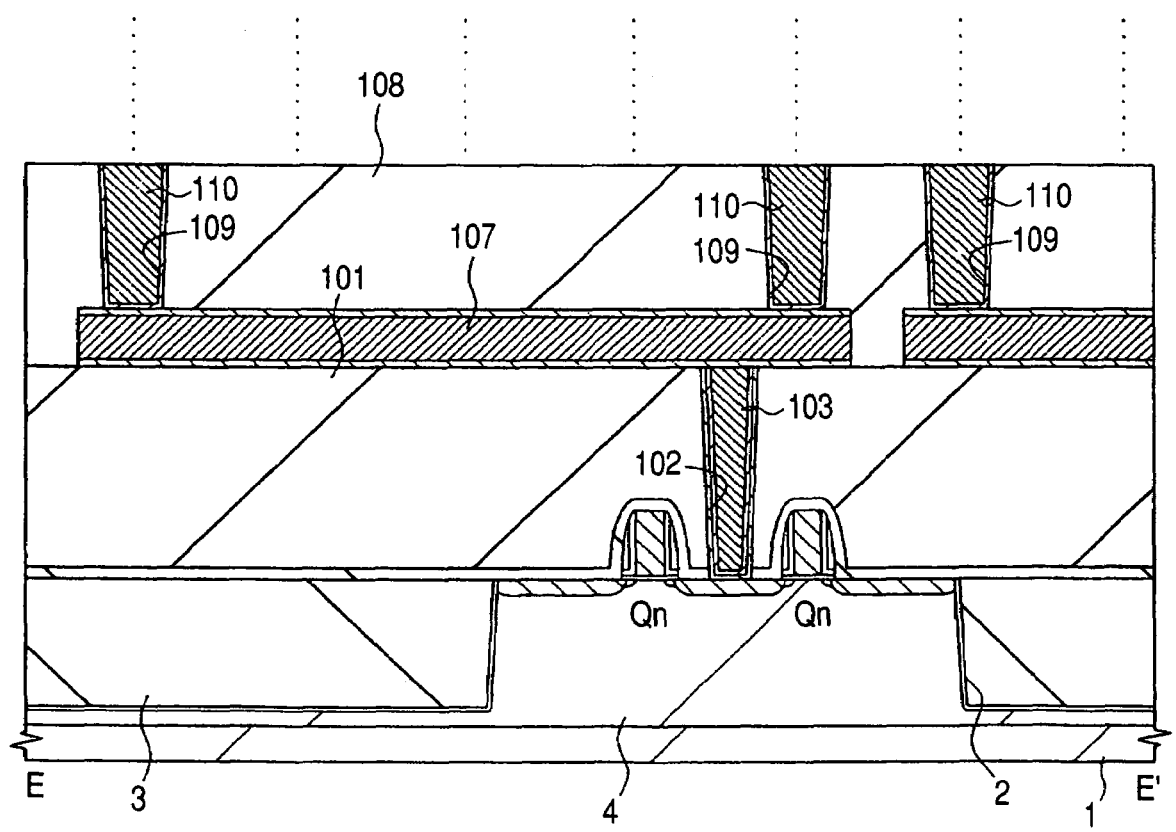
FIG. 50 is a cross sectional view of a main portion showing a method of forming interconnections representing the fourth embodiment of the invention.

As shown in FIG. 49 and FIG. 50, after depositing, for example, a silicon oxide film 108 as an intermediate insulating film over the first layer interconnection 107, the surface of the interlayer insulating film is planarized by polishing such as by a CMP (Chemical Mechanical Polishing) method and then a contact hole 109 is formed in the silicon oxide film 108, and a plug 110 is buried therein. As shown in FIG. 49, the contact hole 109 is disposed at the crossing point between the channel formed with the first layer interconnection 107 and a channel formed with the second layer interconnection.

Figure 51:
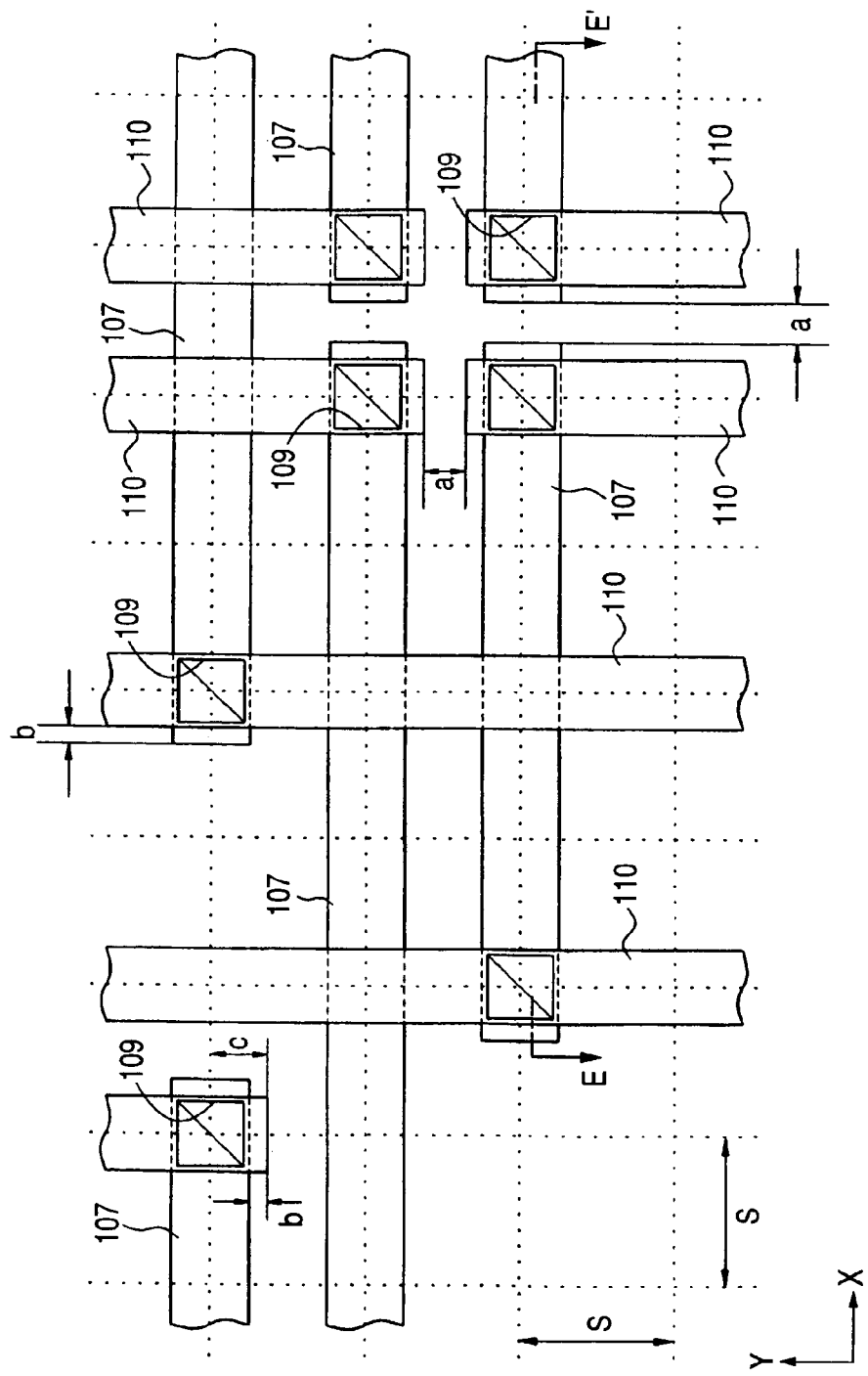
FIG. 51 is a plan view of a main portion showing a method of forming interconnections representing the fourth embodiment of the invention.
Figure 52:
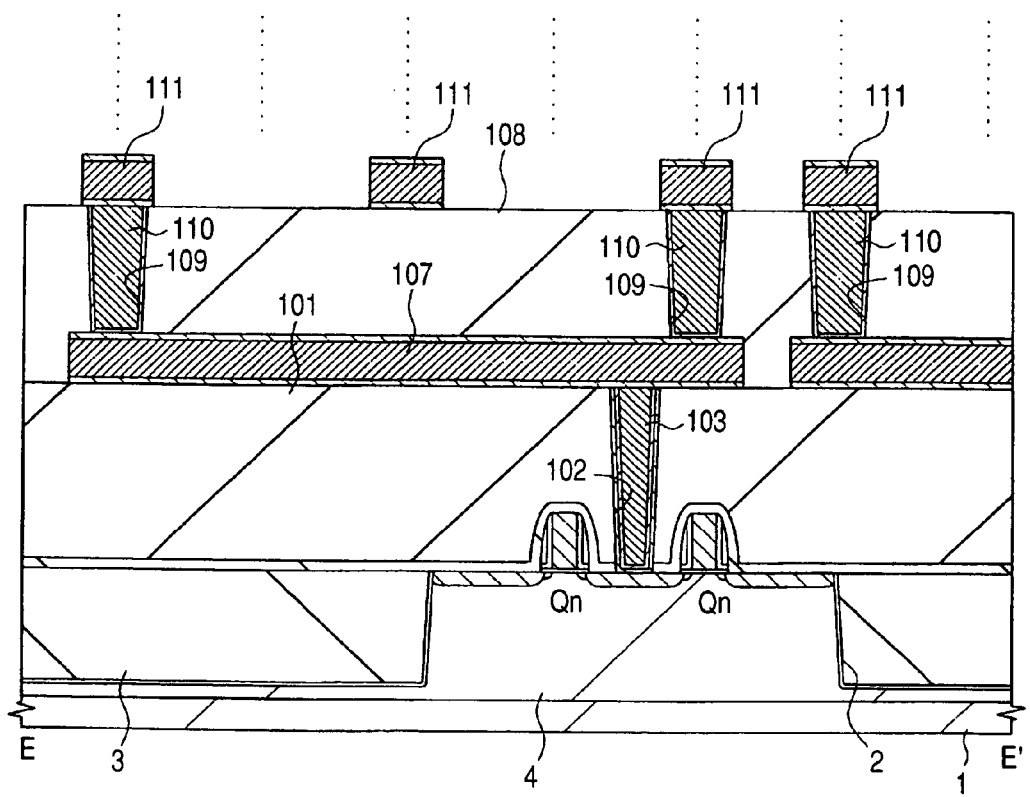
FIG. 52 is a cross sectional view of a main portion showing a method of forming interconnections representing the fourth embodiment of the invention.

Then, as shown in FIG. 51 and FIG. 52, a conductive film for second layer interconnections deposited over the silicon oxide film 108 is patterned by the same method as that used for the conductive film 104, to form second layer interconnections 111, and the second layer interconnections 111 and the first layer interconnections 107 are connected electrically by way of the plugs 110 in the contact holes 109.

In the method of forming the second layer interconnections 111 described above, since the conductive film is patterned by twice etching using the two sheets of photomasks by the same method as that used for the conductive layer 104, the effect caused by the interference between the exposure lights is eliminated. That is, plural conductive films are formed by photolithographic steps plural times by using plural sheets of photoresist masks. As a result, since the roundness on both ends of the second layer interconnections 111 is decreased, the amount of inward retraction for both ends of the second layer interconnections 111 can be decreased. This can reduce the width between the end of the second layer interconnections 111 and the channel (space=c, shown in FIG. 51) with respect to the channel direction of the second layer interconnections (direction Y).

As has been described above, according to the method of forming interconnections in this embodiment, the amount of inward retraction for both ends of the first layer interconnections can be decreased by patterning the conductive film 104 for use in interconnections by twice etching using two sheets of photomasks.

This can reduce the width between the end of the first layer interconnection 107 and the channel (space=c, shown in FIG. 47) in the channel direction of the first layer interconnections (direction X). Accordingly, even in a case where the first layer interconnections are disposed at the crossing point between the adjacent channels, since the width between the end of the first layer interconnection 107 and the channel (space=c, shown in FIG. 47) and the space between the first layer interconnections 107 (space=a, shown in FIG. 47) can be narrowed, it is possible to reduce the distance S between the channels in the channel direction of the first layer interconnections (direction X), to improve the density of interconnections.

Further, the displacement amount between the end of the first layer interconnections 107 and the contact hole 109 formed thereover (displacement amount=b, shown in FIG. 51) can be decreased. That is, the amount of inward retraction, and the amount of displacement considering the alignment margin and reservoir (displacement amount=b, shown in FIG. 51) can be reduced. Accordingly, even in a case where the contact holes 109 and 109 are arranged at the crossing points of the channels adjacent with each other, since the space between the first layer interconnections 107 (space=a shown in FIG. 51) can be narrowed, it is possible to reduce the distance S between the channels and improve the density of interconnections.

On the other hand, in a case of patterning the conductive film 104 for use in interconnections by etching for once using a single sheet of photomask, the amount of inward retraction for the both ends of the first layer interconnections 107 is increased. Accordingly, for reliable connection between the first layer interconnection 107 and the plug 110 in the contact hole 109, since it is necessary to ensure a large displacement amount (b) between the end of the first layer interconnection 107 and the contact hole 109 formed thereover, it is difficult to reduce the distance S between the channels and improve the density of interconnections. That is, the distance S in the channel has to be made larger and improvement is difficult for the density of interconnections.

Further, the amount of inward retraction for both ends of the second layer interconnection 111 can be decreased by patterning the conduct film for use in interconnections by twice etching using two sheets of photomasks. This can reduce the width (space=c, in shown in FIG. 51) between the end of the second layer interconnection 111 and the channel in the channel direction (direction Y) of the second layer interconnections 107. Further, like the first layer interconnections, since the space (space=a, shown in FIG. 51) between the second layer interconnections 111 can be narrowed, it is possible to reduce the gap S between the channels and improve the density of interconnections.

Further, the amount of inward retraction for both ends of the first layer interconnection 107 and the second layer interconnection 111 can be decreased by patterning the conductive film for use in interconnections by twice etching using two sheets of photomasks. Thus, since this can narrow the width between the end of the interconnection 107 or 111, and the channel (space=c, shown in FIG. 47 and FIG. 51), the space between the first layer interconnections 107, and the space between the second layer interconnections 111 (space=a, shown in FIG. 51), it is possible to decrease the distance S between the channels to improve the density of interconnections.

Although not illustrated, it will be apparent that the third or successive layer interconnections can also be formed in the same manner as that for the first layer interconnections 107 and the second layer interconnections 111.

Figure 53:
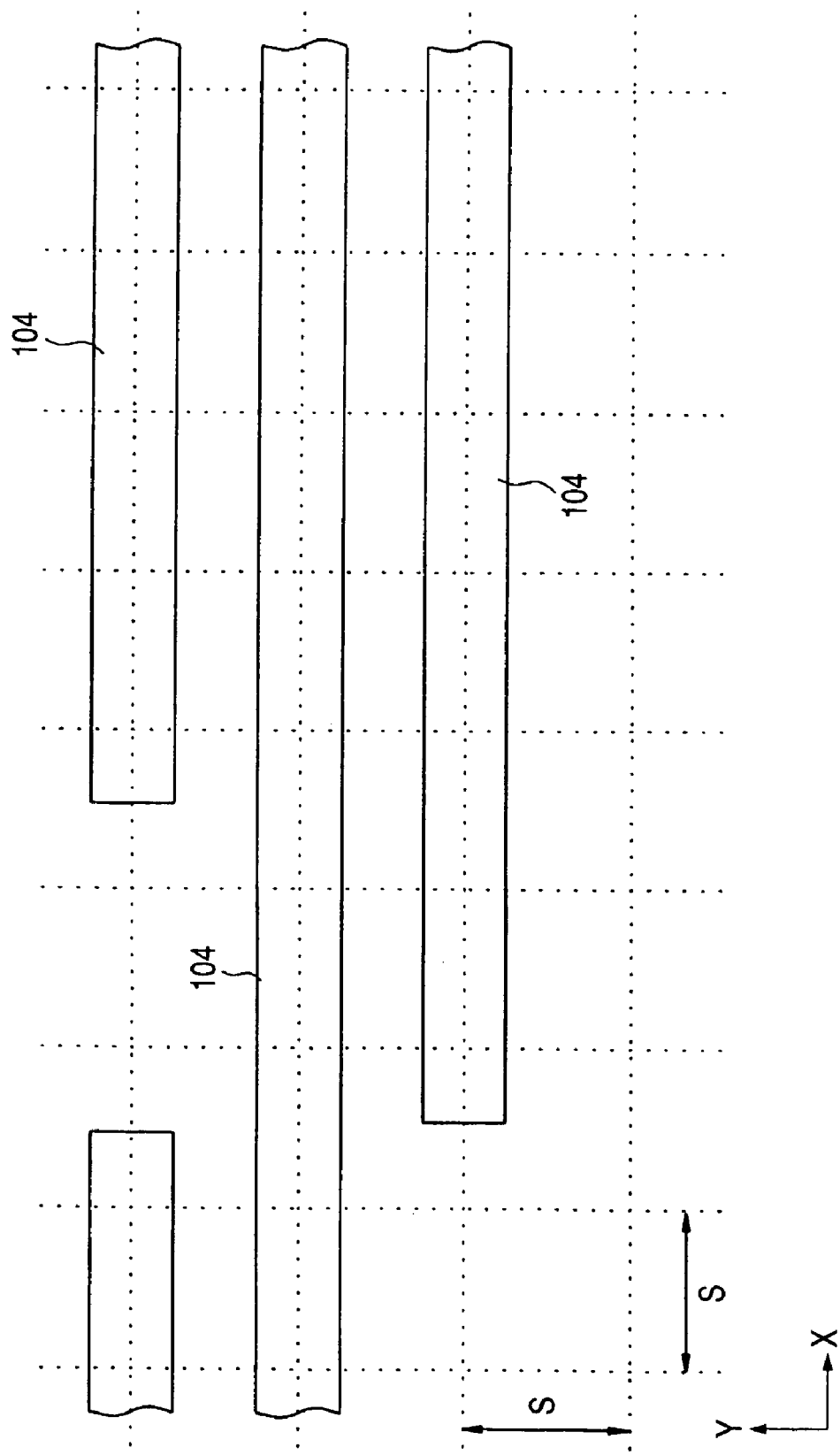
FIG. 53 is a plan view of a main portion showing a method of forming interconnections representing the fourth embodiment of the invention.

Further, the first layer interconnections 107 (or second layer interconnections 111) may also be formed by the following method. At first, as shown in FIG. 53, a conductive film 104 is patterned by dry etching using a first photoresist film (not illustrated) as a mask. In this case, the conductive film 104 is patterned such that the planar pattern extends in a stripe-like manner along the right-to-left direction as seen in the drawings and, for the first layer interconnections 107 disposed on one identical channel, those portions with a large space between each other are separated in this step.

Figure 54:
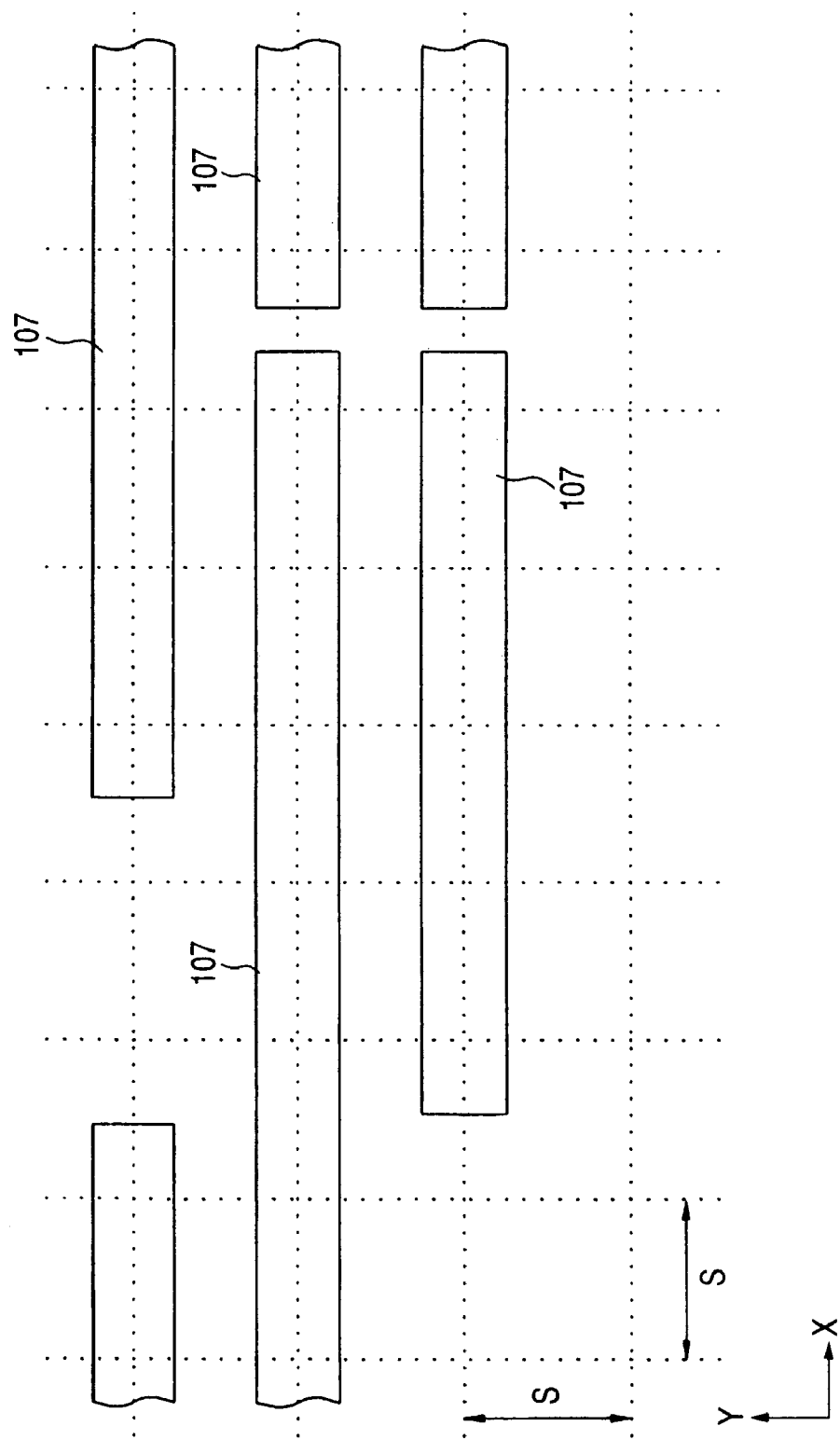
FIG. 54 is a plan view of a main portion showing a method of forming interconnections representing the fourth embodiment of the invention.
Figure 55:
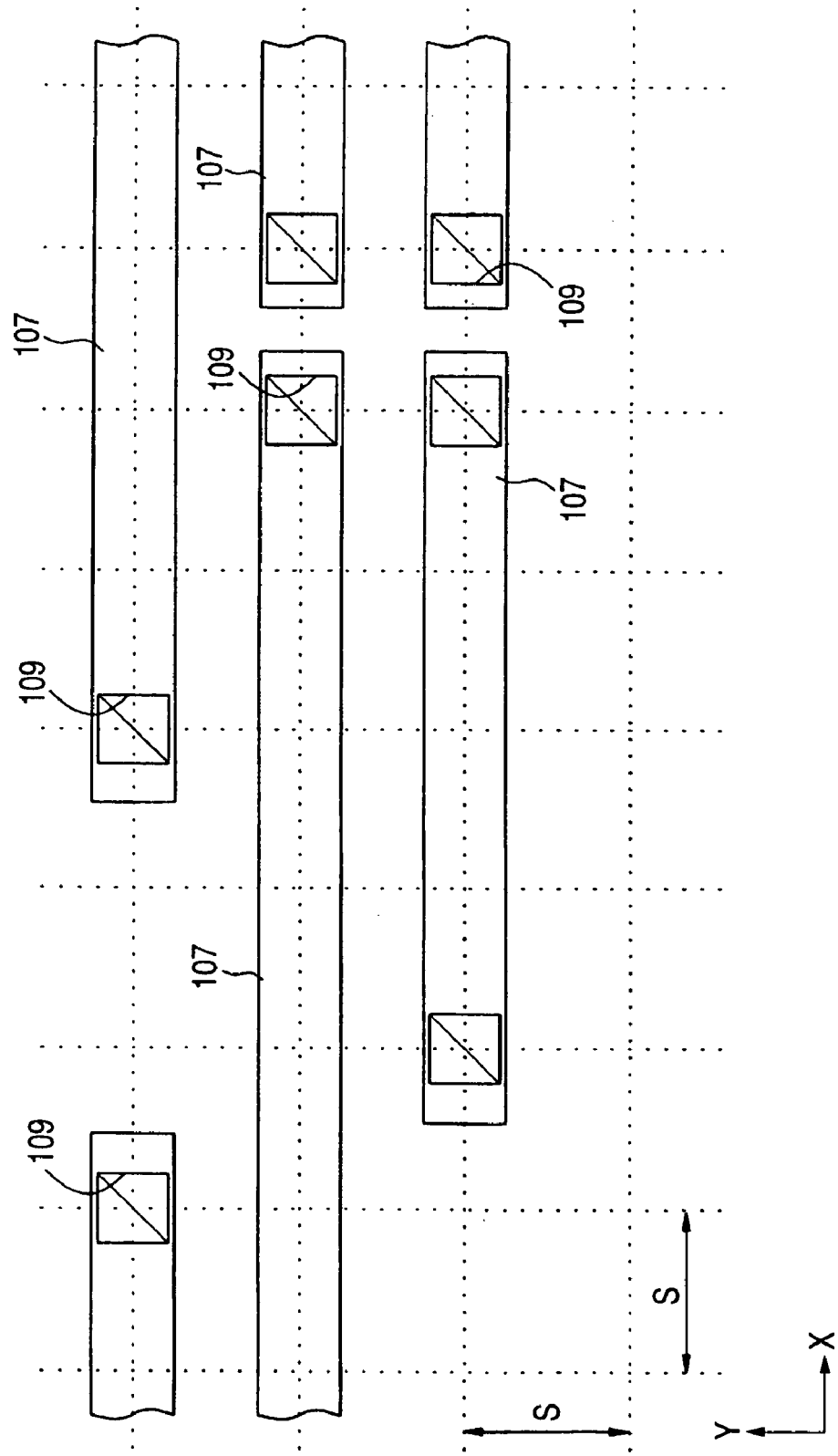
FIG. 55 is a plan view of a main portion showing a method of forming interconnections representing the fourth embodiment of the invention.

Then, as shown in FIG. 54, the conductive film 104 is patterned by dry etching using the second photoresist film (not illustrated) as a mask, and among the first layer interconnections 107 disposed on one identical channel, only the portions with a narrow space for each other are separated to complete first layer interconnections 107. Then, as shown in FIG. 55, contact holes 109 are formed each at the crossing point between the channel formed with the first layer interconnection 107 and the channel to be formed with the second layer interconnections.

According to the method of forming the interconnections described above, among a plural first layer interconnections 107 arranged on one identical channel, the displacement amount of inward retraction for the ends thereof can be decreased in the portions where the space between each other is narrow. This can reduce the width between the end of the first layer interconnection 107 and the channel (space=c, shown in FIG. 47) in the direction of the channel of the first layer interconnections (direction X). Further, since the space (a) between the first layer interconnections 107 can be narrowed, it is possible to reduce the distance S between the channels to improve the density of interconnections.

Further, since the provability that the contact holes 109 are arranged on the cross points of the channels adjacent with each other is generally low, the amount of data for the pattern formed to the second sheet of photomask is decreased by the method of forming the interconnections described above. This can shorten the time required for the manufacture of the second sheet of photomask.

In a case of patterning the conductive film 104 for use in interconnections by twice etching using two sheets of photomasks, KrF and ArF (argon fluoride) at a shorter wavelength than that can be used in combination as an exposure light source. That is, the first layer interconnections 107 or the second layer interconnections 111 may also be formed by patterning only the portions with a large space between each other by a lithographic step using KrF as an exposure light source and patterning portions with a narrow space between each other by a lithographic step using an ArF as an exposure light source. In this case, since it is possible to decrease the amount of use for the photoresist film for use in ArF of requiring higher cost compared with a case of forming the first layer interconnections 107 or the second layer interconnections 111 by twice lithographic steps using ArF as the exposure light source, the cost for manufacturing memory hybridized logic devices can be reduced.

Figure 56:
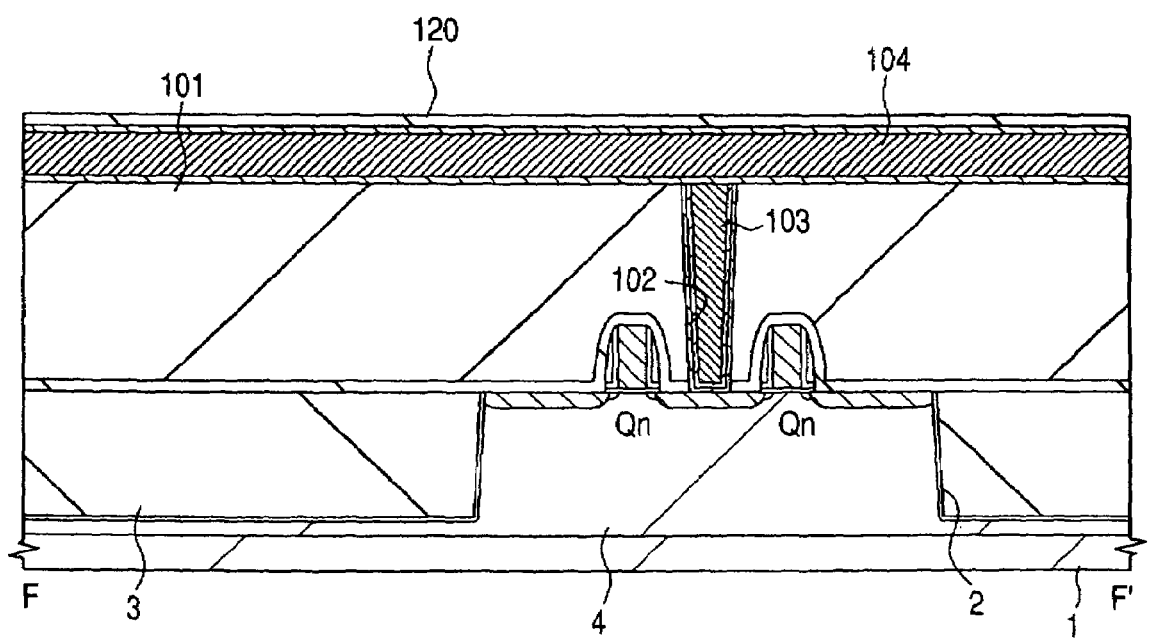
FIG. 56 is a cross sectional view of a main portion showing a method of forming interconnections representing the fourth embodiment of the invention.

The first layer interconnections 107 or the second layer interconnections 111 can also be formed by a method of using a hard mask like that shown in FIG. 20 to FIG. 24. That is, as shown in FIG. 56, like in FIG. 20 to FIG. 24, after at first patterning a hard mask (silicon nitride film 120) by twice etching using two sheets of photoresist masks, the photoresist mask is removed and the first layer interconnections 107 or the second layer interconnections 111 are formed by etching using the hard mask (silicon nitride film 120) as a mask. As described above, plural hard masks (silicon nitride film 120) are formed by using photolithographic steps for several times using plural sheets of photoresist masks, and the plural first layer interconnections 107 or second layer interconnections 111 are formed by etching using plural hard masks. As a result, since a thin hard mask is patterned by using a photoresist mask, the thickness of the photoresist mask film can be decreased, the fabrication accuracy can be improved, and finer fabrication is possible. More specifically, as shown in FIG. 56, after depositing at first a conductive film 104 for use in the first interconnections over the silicon oxide film 101 covering MISFET as shown in FIG. 56, a silicon nitride film 120 covering the MISFET is deposited over the silicon oxide film 101 by a CVD method on the conductive film 104. The silicon nitride film 120 is used as a hard mask for patterning the conductive film 104. In this case, it will be apparent that the hard mask (silicon nitride film 120) is not restricted to the silicon nitride film but may be constituted also with an SION film.

Figure 57A:
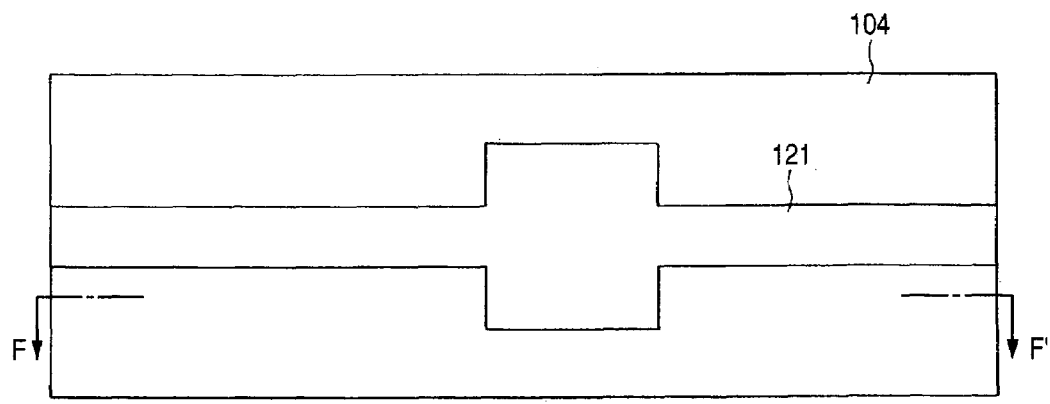
FIG. 57(a) is a plan view of a main portion showing a method of forming interconnections representing the fourth embodiment of the invention.
Figure 57B:
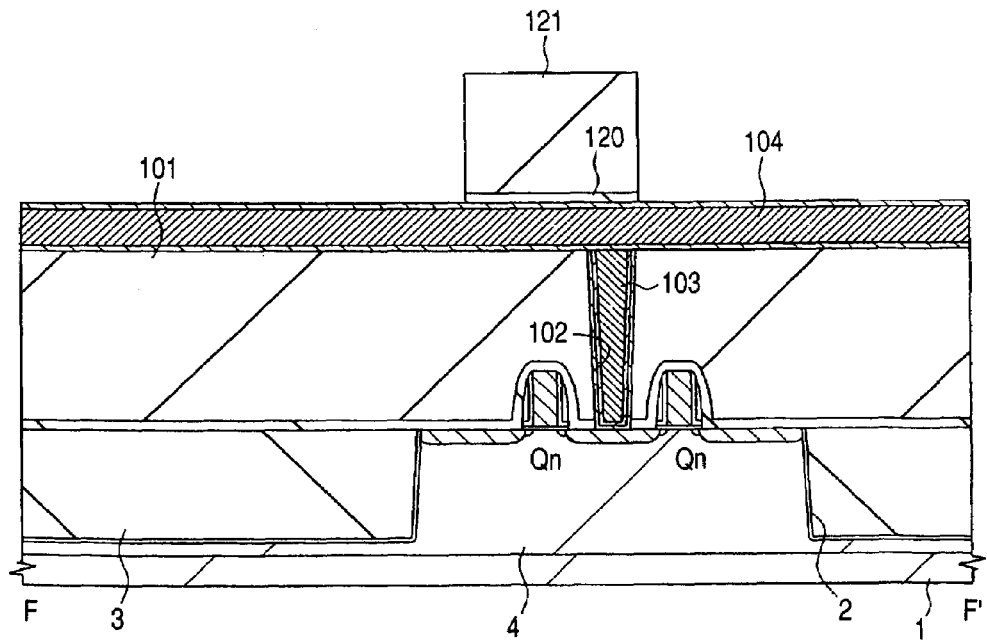
FIG. 57(b) is a cross sectional view taken along line F-F' in FIG. 57(a) showing a method of forming interconnections representing the fourth embodiment of the invention.

Then, as shown in FIG. 57($a$) and FIG. 57($b$) (cross sectional view along line F-F' in FIG. 57($a$)), the silicon nitride film 120 is patterned by dry etching using a first photoresist film 121 formed over the silicon nitride film 120 as a mask. In this case, the silicon nitride film 120 is patterned only for the portions with a large space between each other.

Figure 58A:
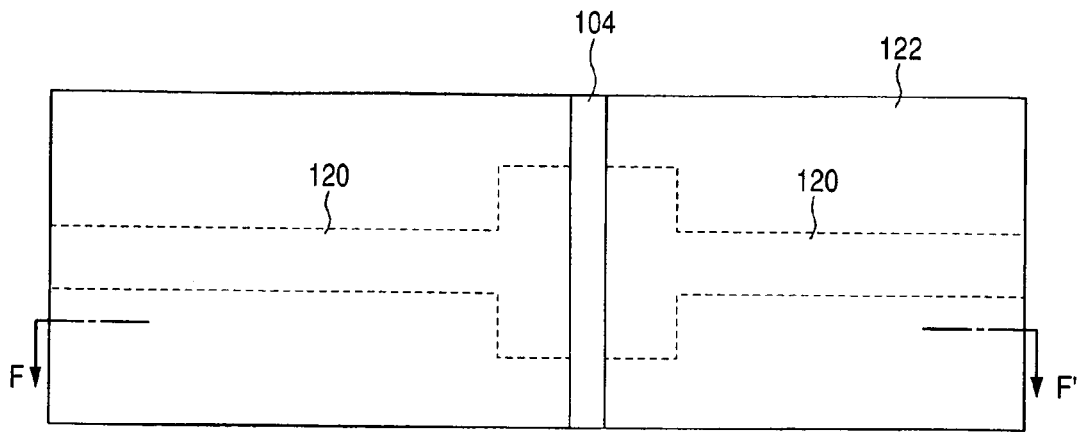
FIG. 58(a) is a plan view of a main portion showing a method of forming interconnections representing the fourth embodiment of the invention.
Figure 58B:
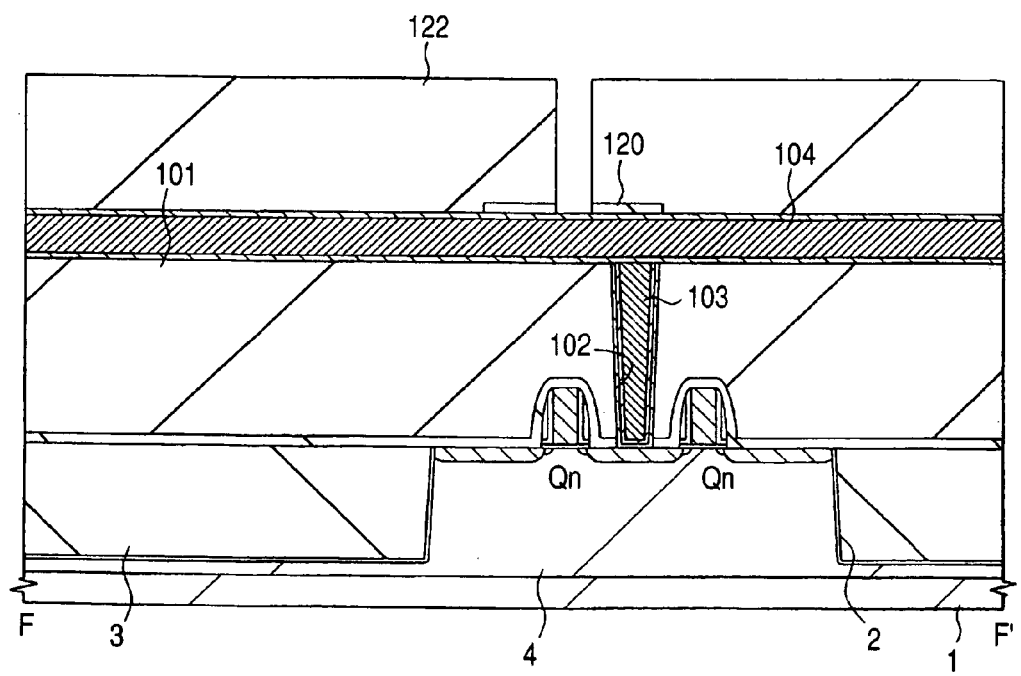
FIG. 58(b) is a cross sectional view of a main portion showing a method of forming interconnections representing the fourth embodiment of the invention.

Then, after removing the photoresist film 121, as shown in FIG. 58($a$) and FIG. 58($b$), the silicon nitride film 120 is patterned by dry etching using a second photoresist film 122 as a mask. In this case, the silicon nitride film 120 is patterned for the portions with a narrow space between each other.

As described above, by patterning the silicon nitride film 120 by twice etching using the two sheets of photomasks, the portions with a narrow space between each other can be isolated at a good accuracy.

Figure 59A:
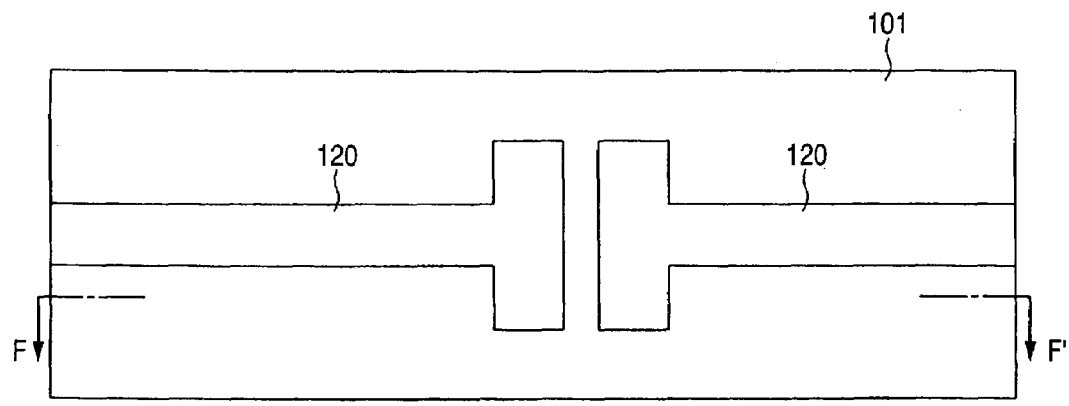
FIG. 59(a) is a plan view of a main portion showing a method of forming interconnections representing the fourth embodiment of the invention.
Figure 59B:
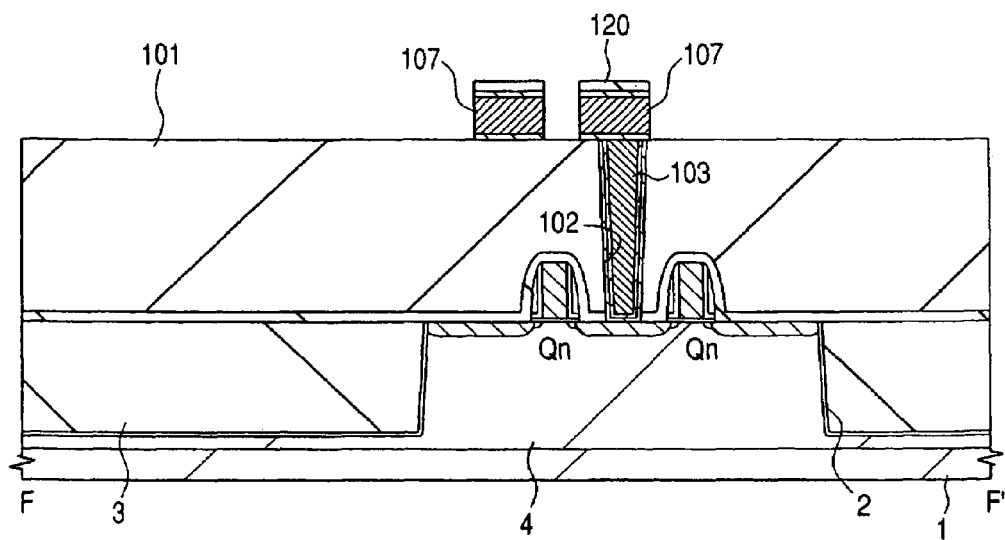
FIG. 59(b) is a cross sectional view of a main portion showing a method of forming interconnections representing the fourth embodiment of the invention.
Figure 60:
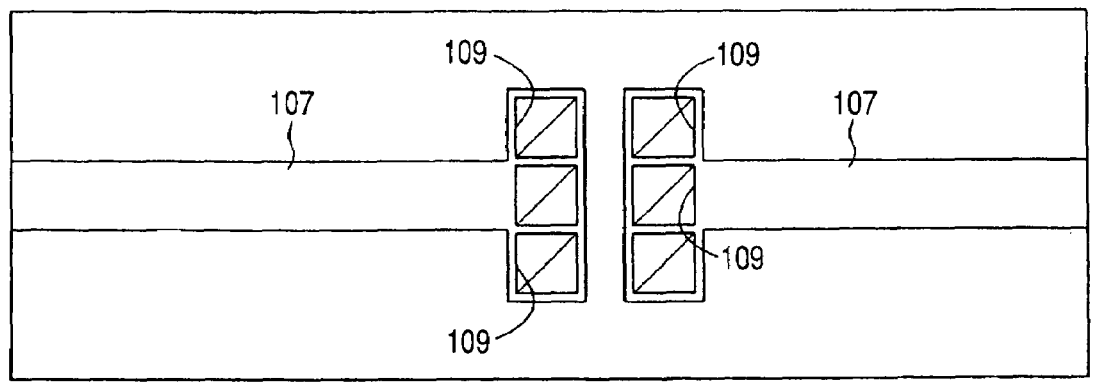
FIG. 60 is a plan view of a main portion showing a method of forming interconnections representing the fourth embodiment of the invention.

Then, after removing the photoresist film 122, as shown in FIG. 59($a$) and FIG. 59($b$), the conductive film 105 is patterned by dry etching using the silicon nitride film 120 as a mask to complete first layer interconnections 107. Then, as shown in FIG. 60, plural contact holes 109 are formed at the ends of the first layer interconnections 107.

According to the method of forming the interconnections described above, since the silicon nitride film 120 having a higher etching selectivity to the conductive film 104 compared with the photoresist film is used for the mask, the first layer interconnections 107 can be patterned at a higher accuracy. This can reduce the space between the ends of the first layer interconnections 107 adjacent to each other and dispose the plural contact holes 109 to the ends of the first layer interconnections 107 at a high density.

Figure 61:
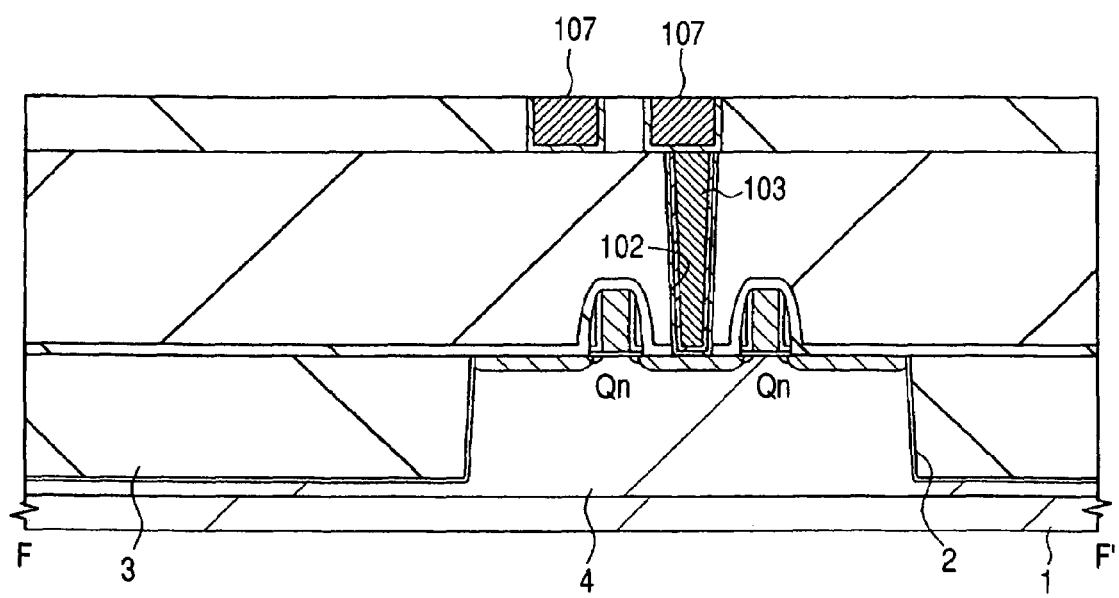
FIG. 61 is a cross sectional view of a main portion showing a method of forming interconnections representing the fourth as other embodiment of the invention.

The method of forming the interconnections in this embodiment, as described above, is also applicable, for example, as shown in FIG. 61, to a case of forming the first layer interconnections 107 by a damascene method. Also in this case, since the space between the first layer interconnections 107 to each other can be narrowed by forming the first layer interconnections 107 by twice etching using the two sheets of photomasks, it is possible to reduce the distance between the channels and improve the density of interconnections.

According to the method of forming the interconnections in this embodiment, as described above, plural conductive films are formed by using photolithographic steps several times using plural sheets of photoresist masks.

Further, plural hard masks (silicon nitride film 120) are formed by using photolithographic steps plural times by using plural sheets of photoresist masks, and the plural first layer interconnections 107 or second layer interconnections 111 are formed by etching using the plural hard masks.

Further, plural interconnection patterns each in the shape of a straight pattern are formed from the conductive film by using the photolithographic step using the photoresist mask film for use in KrF, and plural interconnection patterns adjacent with each other are formed by using a photolithographic step using the photoresist mask film for use in ArF from the plural interconnection patterns each in the straight pattern. It will be apparent that the order may be replaced between the step of forming the interconnection pattern using the photolithographic steps by using the photoresist film for use in KrF and the step of forming the interconnection pattern using the photolithographic step by using the photoresist film for use in ArF.

The present invention has been described specifically with reference to the preferred embodiments but it will be apparent that the invention is not restricted to the embodiments described above but can be modified variously within a scope not departing the gist thereof.

For example, the memory cell of the SRAM shown in the Preferred Embodiments 1 to 3 may be used as a memory for the memory hybridized logic device shown in the Preferred Embodiment 4. Further, logic circuits such as a CPU may also be constituted with the peripheral circuit of the SRAM shown in the Preferred Embodiments 1 to 3. Further, the memory hybridized logic device shown in the Preferred Embodiment 4 may be constituted with a single logic device or a single memory. Further, the method of forming the interconnections shown in the Preferred Embodiment 4 is applicable also to the memory cell of the SRAM and the peripheral circuit thereof shown in the Preferred Embodiments 1 to 3.

Advantageous effects obtained by typical embodiments among those preferred embodiments disclosed in the present application are simply described below.

Since the distance between each of plurality intermediate conductive layers formed in one identical interconnection layer within an identical memory cell can be reduced to be smaller than the resolution limit for exposure light, interconnection or memory cell size can be decreased.

Further, the memory cell size for the SRAM can be decreased to promote increase in integration degree.

Further, refinement and higher degree integration for LSI can be promoted by reducing the distance between plurality interconnections formed in one identical interconnection layer or the distance between each of plural through holes formed in one identical insulating film over a semiconductor substrate.

Advantageous effects obtained by typical aspects of the invention among those disclosed in the present application are simply described below.

Increase in the integration degree for the semiconductor circuit device can be promoted.

The invention claimed is:

1. A method of manufacturing a semiconductor integrated circuit device, comprising steps of:
    (a) forming a conductive film over a substrate;
    (b) forming a mask layer over the conductive film;
    (c) removing portions of the mask layer by using a first mask film formed over the mask layer as a mask so as to form a first mask pattern having a predetermined shape over said conductive film;
    (d) after step (c), removing a part of said first mask pattern by using a second mask film formed over the first mask pattern as a mask so as to form a second mask pattern having a predetermined shape; and
    (e) after step (d), removing portions of said conductive film by using said second mask pattern as a mask so as to form a conductive pattern.

2. A method according to claim 1, wherein the first mask pattern is divided into at least two parts so that the second mask pattern includes the at least two parts.

3. A method according to claim 1, wherein the mask layer is comprised of a hard mask.

4. A method of manufacturing a semiconductor integrated circuit device, comprising steps of:
    (a) forming a mask layer over a conductive film formed over a substrate;
    (b) removing portions of the mask layer by using a first mask film formed over the mask layer as a mask so as to form a first mask pattern having a predetermined shape over said conductive film;
    (c) after step (b), forming a second mask film over the first mask pattern; and
    (d) after step (c), removing a part of the first mask pattern by using the second mask film as a mask so as to form a second mask pattern having a predetermined shape;
    (e) after step (d), removing the second mask film;
    (f) after step (e), removing the conductive film by using the second mask pattern as a mask to form a conductive pattern.

5. A method according to claim 4, wherein the first mask pattern is comprised of a hard mask, and wherein the second mask film is comprised of a photo-resist mask.

6. A method of manufacturing a semiconductor integrated circuit device, comprising steps of:
    (a) forming a mask layer over a conductive film formed over a substrate;
    (b) forming a first mask film over the mask layer;
    (c) removing portions of the mask layer by using the first mask film as a mask so as to form a first mask pattern having a predetermined shape;
    (d) after removing the first mask film, forming a second mask film over the first mask pattern;
    (e) after step (d), removing a part of the first mask pattern by using the second mask film as a mask so as to form a second mask pattern;
    (f) after step (e), etching the conductive film by using the second mask pattern as a mask to form a conductive pattern.

7. A method according to claim 6, wherein, in step (e), the first mask pattern is divided into at least two parts so that the second mask pattern includes the at least two parts.

8. A method according to claim 6, wherein the first mask pattern is comprised of a hard mask, and wherein the second mask film is comprised of a photo-resist mask.

9. A method according to claim 4, wherein the first mask pattern is divided into at least two parts so that the second mask pattern includes the at least two parts.

10. A method according to claim 1, wherein the first mask pattern is comprised of a hard mask, and wherein the second mask film is comprised of a photo-resist mask.

11. A method according to claim 1, wherein the mask layer comprises a plurality of films.

12. A method according to claim 11, wherein the mask layer comprises a silicon nitride film formed over the conductive layer and a silicon oxide film formed over the silicon nitride film.

13. A method according to claim 1, wherein the mask layer comprises a silicon nitride film.

14. A method according to claim 4, wherein the mask layer comprises a plurality of films.

15. A method according to claim 14, wherein the mask layer comprises a silicon nitride film formed over the conductive layer and a silicon oxide film formed over the silicon nitride film.

16. A method according to claim 4, wherein the mask layer comprises a silicon nitride film.

17. A method according to claim 6, wherein the mask layer comprises a plurality of films.

18. A method according to claim 17, wherein the mask layer comprises a silicon nitride film formed over the conductive layer and a silicon oxide film formed over the silicon nitride film.

19. A method according to claim 6, wherein the mask layer comprises a silicon nitride film.

* * * * *